(12) United States Patent
Su et al.

(10) Patent No.: US 9,196,597 B2
(45) Date of Patent: *Nov. 24, 2015

(54) SEMICONDUCTOR PACKAGE WITH SINGLE SIDED SUBSTRATE DESIGN AND MANUFACTURING METHODS THEREOF

(71) Applicant: ADVANCED SEMICONDUCTOR ENGINEERING, INC., Kaosiung (TW)

(72) Inventors: Yuan-Chang Su, Luzhu Township (TW); Shih-Fu Huang, Zhudong Township (TW); Chia-Cheng Chen, Madou Township (TW); Tzu-Hui Chen, Taitung (TW); Kuang-Hsiung Chen, Taoyuan (TW); Pao-Ming Hsieh, Zhubei (TW); Ming Chiang Lee, Kaohsiung (TW); Bernd Karl Appelt, Gulf Breeze, FL (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/453,139

(22) Filed: Aug. 6, 2014

(65) Prior Publication Data

US 2014/0346670 A1    Nov. 27, 2014

Related U.S. Application Data

(63) Continuation of application No. 14/033,673, filed on Sep. 23, 2013, now Pat. No. 8,884,424, which is a continuation of application No. 13/006,340, filed on Jan. 13, 2011, now Pat. No. 8,569,894.

(60) Provisional application No. 61/294,519, filed on Jan. 13, 2010, provisional application No. 61/310,290, filed on Mar. 4, 2010.

(30) Foreign Application Priority Data

Apr. 20, 2010   (TW) ................. 99112317 A

(51) Int. Cl.
*H01L 23/48* (2006.01)
*H01L 23/52* (2006.01)
(Continued)

(52) U.S. Cl.
CPC ............ *H01L 24/14* (2013.01); *H01L 21/4857* (2013.01); *H01L 21/563* (2013.01);
(Continued)

(58) Field of Classification Search
USPC .................................. 257/700, 701, 778, 698
See application file for complete search history.

(56) References Cited

U.S. PATENT DOCUMENTS

| 3,390,226 A | 6/1968 | Beyerlein |
| 3,903,590 A | 9/1975 | Yokogawa |

(Continued)

FOREIGN PATENT DOCUMENTS

| CN | 1524293 A | 10/2001 |
| CN | 1442033 A | 9/2003 |

(Continued)

OTHER PUBLICATIONS

Appelt et al., "Coreless substrates status." Proc. EPTC 2010 (12th Electronics Packaging Tech. Conf, Singapore (2010).

(Continued)

*Primary Examiner* — S. V. Clark
(74) *Attorney, Agent, or Firm* — Foley & Lardner LLP; Cliff Z. Liu; Angela D. Murch

(57) ABSTRACT

A multilayer substrate includes a first outer conductive patterned layer, a first insulating layer exposing a portion of the first outer conductive patterned layer to define a first set of pads, a second outer conductive patterned layer, and a second insulating layer exposing a portion of the second outer conductive patterned layer to define a second set of pads. The multilayer substrate further includes inner layers each with an inner conductive patterned layer, multiple inner conductive posts formed adjacent to the inner conductive patterned layer, and an inner dielectric layer, where the inner conductive patterned layer and the inner conductive posts are embedded in the inner dielectric layer, and a top surface of each of the inner conductive posts is exposed from the inner dielectric layer.

18 Claims, 31 Drawing Sheets

(51) Int. Cl.
   *H01L 29/40* (2006.01)
   *H01L 23/00* (2006.01)
   *H01L 21/48* (2006.01)
   *H01L 21/56* (2006.01)
   *H01L 21/683* (2006.01)
   *H01L 23/29* (2006.01)
   *H01L 23/31* (2006.01)
   *H01L 23/498* (2006.01)
   *H01L 23/522* (2006.01)
   *H01L 23/28* (2006.01)

(52) U.S. Cl.
   CPC ............ *H01L21/6835* (2013.01); *H01L 23/28* (2013.01); *H01L 23/296* (2013.01); *H01L 23/3128* (2013.01); *H01L 23/49816* (2013.01); *H01L 23/49822* (2013.01); *H01L 23/5226* (2013.01); *H01L 24/16* (2013.01); *H01L 24/32* (2013.01); *H01L 24/97* (2013.01); *H01L 23/49838* (2013.01); *H01L 24/29* (2013.01); *H01L 24/48* (2013.01); *H01L 2224/02371* (2013.01); *H01L 2224/0401* (2013.01); *H01L 2224/13099* (2013.01); *H01L 2224/1403* (2013.01); *H01L 2224/16225* (2013.01); *H01L 2224/16235* (2013.01); *H01L 2224/16237* (2013.01); *H01L 2224/2919* (2013.01); *H01L 2224/32057* (2013.01); *H01L 2224/32225* (2013.01); *H01L 2224/48091* (2013.01); *H01L 2224/48227* (2013.01); *H01L 2224/48228* (2013.01); *H01L 2224/48237* (2013.01); *H01L 2224/73203* (2013.01); *H01L 2224/73204* (2013.01); *H01L 2224/73265* (2013.01); *H01L 2224/83101* (2013.01); *H01L 2224/83385* (2013.01); *H01L 2224/97* (2013.01); *H01L 2924/014* (2013.01); *H01L 2924/01005* (2013.01); *H01L 2924/0105* (2013.01); *H01L 2924/01006* (2013.01); *H01L 2924/01024* (2013.01); *H01L 2924/01027* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/078* (2013.01); *H01L 2924/14* (2013.01); *H01L 2924/15184* (2013.01); *H01L 2924/15311* (2013.01); *Y10T 29/49155* (2015.01)

(56) References Cited

U.S. PATENT DOCUMENTS

| | | |
|---|---|---|
| 3,959,874 A | 6/1976 | Coucoulas |
| 4,246,595 A | 1/1981 | Noyori et al. |
| 4,569,786 A | 2/1986 | Deguchi |
| 4,630,096 A | 12/1986 | Drye et al. |
| 4,717,948 A | 1/1988 | Sakai et al. |
| 4,783,695 A | 11/1988 | Eichelberger et al. |
| 4,814,205 A | 3/1989 | Arcilesi et al. |
| 4,821,007 A | 4/1989 | Fields et al. |
| 4,827,328 A | 5/1989 | Ozawa et al. |
| 4,860,166 A | 8/1989 | Nicholls |
| 4,866,501 A | 9/1989 | Shanefield |
| 4,907,062 A | 3/1990 | Fukushima |
| 5,019,535 A | 5/1991 | Wojnarowski et al. |
| 5,049,980 A | 9/1991 | Saito et al. |
| 5,072,289 A | 12/1991 | Sugimoto et al. |
| 5,091,769 A | 2/1992 | Eichelberger |
| 5,111,278 A | 5/1992 | Eichelberger |
| 5,120,678 A | 6/1992 | Moore et al. |
| 5,128,831 A | 7/1992 | Fox, III et al. |
| 5,139,610 A | 8/1992 | Dunaway et al. |
| 5,140,745 A | 8/1992 | McKenzie |
| 5,149,662 A | 9/1992 | Eichelberger |
| 5,151,770 A | 9/1992 | Inoue |
| 5,151,776 A | 9/1992 | Wojnarowski et al. |
| 5,157,589 A | 10/1992 | Cole, Jr. et al. |
| 5,166,772 A | 11/1992 | Soldner et al. |
| 5,172,077 A | 12/1992 | Funada |
| 5,207,585 A | 5/1993 | Byrnes et al. |
| 5,222,014 A | 6/1993 | Lin |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,355,016 A | 10/1994 | Swirbel et al. |
| 5,355,580 A | 10/1994 | Tsukada |
| 5,397,997 A | 3/1995 | Tuckerman et al. |
| 5,400,948 A | 3/1995 | Sajja et al. |
| 5,422,513 A | 6/1995 | Marcinkiewicz et al. |
| 5,432,677 A | 7/1995 | Mowatt et al. |
| 5,468,681 A | 11/1995 | Pasch |
| 5,497,033 A | 3/1996 | Fillion et al. |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,557,142 A | 9/1996 | Gilmore et al. |
| 5,565,706 A | 10/1996 | Miura et al. |
| 5,567,656 A | 10/1996 | Chun |
| 5,579,207 A | 11/1996 | Hayden et al. |
| 5,583,376 A | 12/1996 | Sickler et al. |
| 5,592,025 A | 1/1997 | Clark et al. |
| 5,594,275 A | 1/1997 | Kwon et al. |
| 5,600,181 A | 2/1997 | Scott et al. |
| 5,608,265 A | 3/1997 | Kitano et al. |
| 5,639,989 A | 6/1997 | Higgins, III |
| 5,677,511 A | 10/1997 | Taylor et al. |
| 5,694,300 A | 12/1997 | Mattei et al. |
| 5,703,400 A | 12/1997 | Wojnarowski et al. |
| 5,703,761 A | 12/1997 | Heiss |
| 5,710,062 A | 1/1998 | Sawai et al. |
| 5,714,800 A | 2/1998 | Thompson |
| 5,726,493 A | 3/1998 | Yamashita et al. |
| 5,726,612 A | 3/1998 | Mandai |
| 5,729,437 A | 3/1998 | Hashimoto |
| 5,745,984 A | 5/1998 | Cole, Jr. et al. |
| 5,748,452 A | 5/1998 | Londa |
| 5,763,939 A | 6/1998 | Yamashita |
| 5,776,798 A | 7/1998 | Quan et al. |
| 5,834,340 A | 11/1998 | Sawai et al. |
| 5,841,190 A | 11/1998 | Noda et al. |
| 5,841,193 A | 11/1998 | Eichelberger |
| 5,844,315 A | 12/1998 | Melton et al. |
| 5,847,930 A | 12/1998 | Kazle |
| 5,856,705 A | 1/1999 | Ting |
| 5,861,666 A | 1/1999 | Bellaar |
| 5,864,088 A | 1/1999 | Sato et al. |
| 5,866,952 A | 2/1999 | Wojnarowski et al. |
| 5,874,784 A | 2/1999 | Aoki et al. |
| 5,883,426 A | 3/1999 | Tokuno et al. |
| 5,886,876 A | 3/1999 | Yamaguchi |
| 5,889,327 A | 3/1999 | Washida |
| 5,889,655 A | 3/1999 | Barrow |
| 5,892,290 A | 4/1999 | Chakravorty et al. |
| 5,895,229 A | 4/1999 | Carney et al. |
| 5,898,344 A | 4/1999 | Hayashi |
| 5,929,521 A | 7/1999 | Wark et al. |
| 5,945,741 A | 8/1999 | Ohsawa et al. |
| 5,966,052 A | 10/1999 | Sakai |
| 5,973,393 A | 10/1999 | Chia et al. |
| 5,977,626 A | 11/1999 | Wang et al. |
| 5,985,695 A | 11/1999 | Freyman et al. |
| 5,990,546 A | 11/1999 | Igarashi et al. |
| 5,994,773 A | 11/1999 | Hirakawa |
| 5,998,867 A | 12/1999 | Jensen et al. |

(56) References Cited

U.S. PATENT DOCUMENTS

| | | |
|---|---|---|
| 6,013,953 A | 1/2000 | Nishihara |
| 6,025,995 A | 2/2000 | Marcinkiewicz |
| 6,046,071 A | 4/2000 | Sawai et al. |
| 6,060,775 A | 5/2000 | Ano et al. |
| 6,072,236 A | 6/2000 | Akram et al. |
| 6,079,099 A | 6/2000 | Uchida et al. |
| 6,080,932 A | 6/2000 | Smith et al. |
| 6,087,717 A | 7/2000 | Ano et al. |
| 6,093,972 A | 7/2000 | Camey et al. |
| 6,110,608 A | 8/2000 | Tanimoto et al. |
| 6,150,193 A | 11/2000 | Glenn |
| 6,154,366 A | 11/2000 | Ma et al. |
| 6,159,767 A | 12/2000 | Eichelberger et al. |
| 6,177,636 B1 | 1/2001 | Fjelstad |
| 6,177,724 B1 | 1/2001 | Sawai |
| 6,194,250 B1 | 2/2001 | Melton et al. |
| 6,195,268 B1 | 2/2001 | Eide |
| 6,198,165 B1 | 3/2001 | Yamaji et al. |
| 6,225,694 B1 | 5/2001 | Terui |
| 6,232,151 B1 | 5/2001 | Ozmat et al. |
| 6,232,650 B1 | 5/2001 | Fujisawa et al. |
| 6,232,661 B1 | 5/2001 | Amagai et al. |
| 6,239,482 B1 | 5/2001 | Fillion et al. |
| 6,242,815 B1 | 6/2001 | Hsu et al. |
| 6,255,143 B1 | 7/2001 | Briar |
| 6,261,680 B1 | 7/2001 | Denman |
| 6,265,765 B1 | 7/2001 | DiStefano et al. |
| 6,265,783 B1 | 7/2001 | Juso et al. |
| 6,271,057 B1 | 8/2001 | Lee et al. |
| 6,271,469 B1 | 8/2001 | Ma et al. |
| 6,278,181 B1 | 8/2001 | Maley |
| 6,294,406 B1 | 9/2001 | Bertin et al. |
| 6,294,741 B1 | 9/2001 | Cole, Jr. et al. |
| 6,303,997 B1 | 10/2001 | Lee |
| 6,306,680 B1 | 10/2001 | Fillion et al. |
| 6,323,045 B1 | 11/2001 | Cline et al. |
| 6,331,451 B1 | 12/2001 | Fusaro et al. |
| 6,358,780 B1 | 3/2002 | Smith et al. |
| 6,369,335 B1 | 4/2002 | Wajima |
| 6,376,769 B1 | 4/2002 | Chung |
| 6,377,461 B1 | 4/2002 | Ozmat et al. |
| 6,396,148 B1 | 5/2002 | Eichelberger et al. |
| 6,400,573 B1 | 6/2002 | Mowatt et al. |
| 6,423,566 B1 | 7/2002 | Feger et al. |
| 6,423,570 B1 | 7/2002 | Ma et al. |
| 6,426,545 B1 | 7/2002 | Eichelberger et al. |
| 6,428,942 B1 | 8/2002 | Jiang et al. |
| 6,448,632 B1 | 9/2002 | Takiar et al. |
| 6,448,665 B1 | 9/2002 | Nakazawa et al. |
| 6,451,624 B1 | 9/2002 | Farnworth et al. |
| 6,452,258 B1 | 9/2002 | Abys et al. |
| 6,455,864 B1 | 9/2002 | Featherby et al. |
| 6,461,881 B1 | 10/2002 | Farnworth et al. |
| 6,472,598 B1 | 10/2002 | Glenn |
| 6,472,743 B2 | 10/2002 | Huang et al. |
| 6,479,903 B2 | 11/2002 | Briar |
| 6,485,595 B1 | 11/2002 | Yenni et al. |
| 6,486,005 B1 | 11/2002 | Kim |
| 6,486,006 B2 | 11/2002 | Hirano et al. |
| 6,486,545 B1 | 11/2002 | Glenn et al. |
| 6,489,676 B2 | 12/2002 | Taniguchi et al. |
| 6,492,194 B1 | 12/2002 | Bereau et al. |
| 6,501,165 B1 | 12/2002 | Farnworth et al. |
| 6,513,236 B2 | 2/2003 | Tsukamoto |
| 6,521,978 B2 | 2/2003 | Fenk et al. |
| 6,521,995 B1 | 2/2003 | Akram et al. |
| 6,525,413 B1 | 2/2003 | Cloud et al. |
| 6,552,430 B1 | 4/2003 | Perez et al. |
| 6,555,906 B2 | 4/2003 | Towle et al. |
| 6,555,908 B1 | 4/2003 | Eichelberger |
| 6,560,109 B2 | 5/2003 | Yamaguchi et al. |
| 6,566,596 B1 | 5/2003 | Askew |
| 6,580,159 B1 | 6/2003 | Fusaro et al. |
| 6,586,276 B2 | 7/2003 | Towle et al. |
| 6,586,822 B1 | 7/2003 | Vu et al. |
| 6,590,291 B2 | 7/2003 | Akagawa |
| 6,590,295 B1 | 7/2003 | Liao et al. |
| 6,602,737 B2 | 8/2003 | Wu |
| 6,614,102 B1 | 9/2003 | Hoffman et al. |
| 6,614,104 B2 | 9/2003 | Farnworth et al. |
| 6,617,687 B2 | 9/2003 | Akram et al. |
| 6,630,630 B1 | 10/2003 | Maezawa et al. |
| 6,635,953 B2 | 10/2003 | Wu |
| 6,639,324 B1 | 10/2003 | Chien |
| 6,646,354 B2 | 11/2003 | Cobbley et al. |
| 6,656,827 B1 | 12/2003 | Tsao et al. |
| 6,663,943 B2 | 12/2003 | Kadota |
| 6,663,946 B2 | 12/2003 | Seri et al. |
| 6,680,529 B2 | 1/2004 | Chen et al. |
| 6,686,649 B1 | 2/2004 | Mathews et al. |
| 6,695,985 B2 | 2/2004 | Igarashi et al. |
| 6,701,614 B2 | 3/2004 | Ding et al. |
| 6,706,554 B2 | 3/2004 | Ogura |
| 6,707,137 B2 | 3/2004 | Kim |
| 6,709,896 B1 | 3/2004 | Cobbley et al. |
| 6,709,898 B1 | 3/2004 | Ma et al. |
| 6,713,859 B1 | 3/2004 | Ma |
| 6,717,061 B2 | 4/2004 | Yamaguchi et al. |
| 6,724,061 B2 | 4/2004 | Murata |
| 6,724,638 B1 | 4/2004 | Inagaki et al. |
| 6,734,370 B2 | 5/2004 | Yamaguchi et al. |
| 6,734,534 B1 | 5/2004 | Vu et al. |
| 6,734,542 B2 | 5/2004 | Nakatani et al. |
| 6,734,696 B2 | 5/2004 | Horner et al. |
| 6,740,546 B2 | 5/2004 | Corisis et al. |
| 6,740,959 B2 | 5/2004 | Alcoe et al. |
| 6,740,964 B2 | 5/2004 | Sasaki |
| 6,747,348 B2 | 6/2004 | Jeung et al. |
| 6,750,547 B2 | 6/2004 | Jeung et al. |
| 6,756,671 B2 | 6/2004 | Lee et al. |
| 6,757,181 B1 | 6/2004 | Villanueva et al. |
| 6,759,268 B2 | 7/2004 | Akagawa |
| 6,762,503 B2 | 7/2004 | Lee |
| 6,768,061 B2 | 7/2004 | Kondo |
| 6,774,317 B2 | 8/2004 | Fjelstad |
| 6,780,746 B2 | 8/2004 | Kinsman et al. |
| 6,781,231 B2 | 8/2004 | Minervini |
| 6,787,392 B2 | 9/2004 | Quah |
| 6,787,894 B2 | 9/2004 | Jeung et al. |
| 6,790,706 B2 | 9/2004 | Jeung et al. |
| 6,798,057 B2 | 9/2004 | Bolkin et al. |
| 6,800,804 B2 | 10/2004 | Igarashi et al. |
| 6,812,066 B2 | 11/2004 | Taniguchi et al. |
| 6,815,254 B2 | 11/2004 | Mistry et al. |
| 6,818,544 B2 | 11/2004 | Eichelberger et al. |
| 6,828,665 B2 | 12/2004 | Pu et al. |
| 6,838,776 B2 | 1/2005 | Leal et al. |
| 6,845,554 B2 | 1/2005 | Frankowsky et al. |
| 6,847,109 B2 | 1/2005 | Shim |
| 6,849,945 B2 | 2/2005 | Horiuchi et al. |
| 6,856,007 B2 | 2/2005 | Warner |
| 6,861,288 B2 | 3/2005 | Shim et al. |
| 6,861,757 B2 | 3/2005 | Shimoto et al. |
| 6,865,084 B2 | 3/2005 | Lin et al. |
| 6,865,089 B2 | 3/2005 | Ho et al. |
| 6,867,480 B2 | 3/2005 | Legaspi, Jr. et al. |
| 6,872,893 B2 | 3/2005 | Fukuoka et al. |
| 6,876,544 B2 | 4/2005 | Hsin |
| 6,881,896 B2 | 4/2005 | Ebihara |
| 6,888,255 B2 | 5/2005 | Murtuza et al. |
| 6,894,399 B2 | 5/2005 | Vu et al. |
| 6,900,383 B2 | 5/2005 | Babb et al. |
| 6,902,950 B2 | 6/2005 | Ma et al. |
| 6,905,914 B1 | 6/2005 | Huemoeller et al. |
| 6,921,683 B2 | 7/2005 | Nakayama |
| 6,921,975 B2 | 7/2005 | Leal et al. |
| 6,924,550 B2 | 8/2005 | Corisis et al. |
| 6,928,719 B2 | 8/2005 | Kim et al. |
| 6,930,256 B1 | 8/2005 | Huemoeller et al. |
| 6,936,930 B2 | 8/2005 | Wang |
| 6,939,738 B2 | 9/2005 | Nakatani et al. |
| 6,948,944 B2 | 9/2005 | Ueno |
| 6,953,708 B2 | 10/2005 | Hedler et al. |
| 6,962,869 B1 | 11/2005 | Bao et al. |

(56) References Cited

U.S. PATENT DOCUMENTS

| | | |
|---|---|---|
| 6,964,887 B2 | 11/2005 | Akagawa |
| 6,964,889 B2 | 11/2005 | Ma et al. |
| 6,967,403 B2 | 11/2005 | Chuang et al. |
| 6,969,916 B2 | 11/2005 | Shizuno |
| 6,974,334 B2 | 12/2005 | Hung |
| 6,975,516 B2 | 12/2005 | Asahi et al. |
| 6,977,348 B2 | 12/2005 | Ho et al. |
| 6,991,966 B2 | 1/2006 | Tuominen |
| 6,992,400 B2 | 1/2006 | Tikka et al. |
| 6,998,532 B2 | 2/2006 | Kawamoto et al. |
| 7,002,245 B2 | 2/2006 | Huang et al. |
| 7,002,805 B2 | 2/2006 | Lee |
| 7,012,323 B2 | 3/2006 | Warner et al. |
| 7,015,075 B2 | 3/2006 | Fay et al. |
| 7,015,571 B2 | 3/2006 | Chang et al. |
| 7,019,406 B2 | 3/2006 | Huang et al. |
| 7,026,709 B2 | 4/2006 | Tsai et al. |
| 7,029,953 B2 | 4/2006 | Sasaki |
| 7,030,469 B2 | 4/2006 | Mahadevan et al. |
| 7,034,386 B2 | 4/2006 | Kurita |
| 7,045,385 B2 | 5/2006 | Kim et al. |
| 7,045,908 B2 | 5/2006 | Ohsumi |
| 7,048,450 B2 | 5/2006 | Beer et al. |
| 7,049,682 B1 | 5/2006 | Mathews et al. |
| 7,049,692 B2 | 5/2006 | Nishimura et al. |
| 7,053,475 B2 | 5/2006 | Akagawa |
| 7,061,079 B2 | 6/2006 | Weng et al. |
| 7,067,356 B2 | 6/2006 | Towle et al. |
| 7,071,024 B2 | 7/2006 | Towle et al. |
| 7,071,028 B2 | 7/2006 | Koike et al. |
| 7,078,788 B2 | 7/2006 | Vu et al. |
| 7,081,661 B2 | 7/2006 | Takehara et al. |
| 7,087,991 B2 | 8/2006 | Chen et al. |
| 7,091,595 B2 | 8/2006 | Fuergut et al. |
| 7,102,807 B2 | 9/2006 | Shi et al. |
| 7,112,467 B2 | 9/2006 | Eichelberger et al. |
| 7,122,901 B2 | 10/2006 | Sunohara et al. |
| 7,125,744 B2 | 10/2006 | Takehara et al. |
| 7,126,218 B1 | 10/2006 | Darveaux et al. |
| 7,129,576 B2 | 10/2006 | Humpston |
| 7,132,312 B2 | 11/2006 | Huang et al. |
| 7,141,884 B2 | 11/2006 | Kojima et al. |
| 7,145,228 B2 | 12/2006 | Yean et al. |
| 7,161,252 B2 | 1/2007 | Tsuneoka et al. |
| 7,163,843 B2 | 1/2007 | Kiendl et al. |
| 7,170,152 B2 | 1/2007 | Huang et al. |
| 7,173,330 B2 | 2/2007 | Eng et al. |
| 7,176,567 B2 | 2/2007 | Yang et al. |
| 7,180,012 B2 | 2/2007 | Tsuneoka et al. |
| 7,183,498 B2 | 2/2007 | Ogura et al. |
| 7,185,426 B1 | 3/2007 | Hiner et al. |
| 7,186,928 B2 | 3/2007 | Kikuchi et al. |
| 7,187,060 B2 | 3/2007 | Usui |
| 7,187,068 B2 | 3/2007 | Suh et al. |
| 7,187,070 B2 | 3/2007 | Chu et al. |
| 7,192,807 B1 | 3/2007 | Huemoeller et al. |
| 7,196,408 B2 | 3/2007 | Yang et al. |
| 7,205,674 B2 | 4/2007 | Huang et al. |
| 7,221,045 B2 | 5/2007 | Park et al. |
| 7,224,061 B2 | 5/2007 | Yang et al. |
| 7,238,602 B2 | 7/2007 | Yang et al. |
| 7,242,081 B1 | 7/2007 | Lee |
| 7,247,523 B1 | 7/2007 | Huemoeller et al. |
| 7,262,080 B2 | 8/2007 | Go et al. |
| 7,262,081 B2 | 8/2007 | Yang et al. |
| 7,262,497 B2 | 8/2007 | Fang et al. |
| 7,276,783 B2 | 10/2007 | Goller et al. |
| 7,279,784 B2 | 10/2007 | Liu |
| 7,279,789 B2 | 10/2007 | Cheng |
| 7,288,835 B2 | 10/2007 | Yim et al. |
| 7,294,529 B2 | 11/2007 | Tuominen et al. |
| 7,294,587 B2 | 11/2007 | Asahi et al. |
| 7,294,791 B2 | 11/2007 | Danoski et al. |
| 7,294,920 B2 | 11/2007 | Chen et al. |
| 7,294,922 B2 | 11/2007 | Jobetto et al. |
| 7,299,546 B2 | 11/2007 | Tuominen et al. |
| 7,309,913 B2 | 12/2007 | Shim et al. |
| 7,312,103 B1 | 12/2007 | Huemoeller et al. |
| 7,319,049 B2 | 1/2008 | Oi et al. |
| 7,327,015 B2 | 2/2008 | Yang et al. |
| 7,338,884 B2 | 3/2008 | Shimoto et al. |
| 7,338,892 B2 | 3/2008 | Wang et al. |
| 7,339,279 B2 | 3/2008 | Yang |
| 7,342,296 B2 | 3/2008 | Yang et al. |
| 7,342,303 B1 | 3/2008 | Berry et al. |
| 7,342,803 B2 | 3/2008 | Inagaki et al. |
| 7,344,917 B2 | 3/2008 | Gautham |
| 7,345,361 B2 | 3/2008 | Mallik et al. |
| 7,352,054 B2 | 4/2008 | Jobetto |
| 7,354,800 B2 | 4/2008 | Carson |
| 7,361,533 B1 | 4/2008 | Huemoeller et al. |
| 7,361,987 B2 | 4/2008 | Leal et al. |
| 7,364,944 B2 | 4/2008 | Huang et al. |
| 7,364,945 B2 | 4/2008 | Shim et al. |
| 7,364,948 B2 | 4/2008 | Lai et al. |
| 7,365,427 B2 | 4/2008 | Lu et al. |
| 7,371,617 B2 | 5/2008 | Tsai et al. |
| 7,372,141 B2 | 5/2008 | Karnezos et al. |
| 7,372,151 B1 | 5/2008 | Fan et al. |
| 7,394,663 B2 | 7/2008 | Yamashita et al. |
| 7,405,486 B2 | 7/2008 | Kato |
| 7,408,244 B2 | 8/2008 | Lee et al. |
| 7,411,306 B2 | 8/2008 | Leu et al. |
| 7,416,918 B2 | 8/2008 | Ma |
| 7,416,920 B2 | 8/2008 | Yang et al. |
| 7,417,329 B2 | 8/2008 | Chuang et al. |
| 7,420,272 B1 | 9/2008 | Huemoeller et al. |
| 7,420,273 B2 | 9/2008 | Liu et al. |
| 7,423,340 B2 | 9/2008 | Huang et al. |
| 7,425,464 B2 | 9/2008 | Fay et al. |
| 7,429,786 B2 | 9/2008 | Karnezos et al. |
| 7,429,787 B2 | 9/2008 | Karnezos et al. |
| 7,436,055 B2 | 10/2008 | Hu |
| 7,436,074 B2 | 10/2008 | Pan et al. |
| 7,445,957 B2 | 11/2008 | Huang et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,453,148 B2 | 11/2008 | Yang et al. |
| 7,459,781 B2 | 12/2008 | Yang et al. |
| 7,473,629 B2 | 1/2009 | Tai et al. |
| 7,476,563 B2 | 1/2009 | Mangrum et al. |
| 7,478,474 B2 | 1/2009 | Koga |
| 7,482,198 B2 | 1/2009 | Bauer et al. |
| 7,485,970 B2 | 2/2009 | Hsu et al. |
| 7,488,903 B2 | 2/2009 | Kawagishi et al. |
| 7,501,310 B2 | 3/2009 | Yang et al. |
| 7,501,696 B2 | 3/2009 | Koyama et al. |
| 7,511,356 B2 | 3/2009 | Subramanian |
| 7,511,365 B2 | 3/2009 | Wu et al. |
| 7,514,767 B2 | 4/2009 | Yang |
| 7,523,551 B2 | 4/2009 | Horng et al. |
| 7,525,185 B2 | 4/2009 | Yang et al. |
| 7,528,009 B2 | 5/2009 | Chen et al. |
| 7,547,967 B2 | 6/2009 | Jobetto et al. |
| 7,550,320 B2 | 6/2009 | Wang et al. |
| 7,550,832 B2 | 6/2009 | Weng et al. |
| 7,550,836 B2 | 6/2009 | Chou et al. |
| 7,550,843 B2 | 6/2009 | Mihara |
| 7,557,307 B2 | 7/2009 | Nishizawa et al. |
| 7,557,437 B2 | 7/2009 | Yang et al. |
| 7,560,818 B2 | 7/2009 | Tsai |
| 7,564,121 B2 | 7/2009 | Sugimoto |
| 7,566,955 B2 | 7/2009 | Warner |
| 7,566,969 B2 | 7/2009 | Shimanuki |
| 7,572,676 B2 | 8/2009 | Leu et al. |
| 7,572,681 B1 | 8/2009 | Huemoeller et al. |
| 7,575,173 B2 | 8/2009 | Fuergut et al. |
| 7,576,415 B2 | 8/2009 | Cha et al. |
| 7,576,425 B2 | 8/2009 | Liu |
| 7,586,184 B2 | 9/2009 | Hung et al. |
| 7,588,951 B2 | 9/2009 | Mangrum et al. |
| 7,589,408 B2 | 9/2009 | Weng et al. |
| 7,591,067 B2 | 9/2009 | Wang |

(56) References Cited

U.S. PATENT DOCUMENTS

| | | |
|---|---|---|
| 7,595,226 B2 | 9/2009 | Lytle et al. |
| 7,595,553 B2 | 9/2009 | Nagamatsu et al. |
| 7,598,607 B2 | 10/2009 | Chung et al. |
| 7,598,616 B2 | 10/2009 | Yang et al. |
| 7,609,527 B2 | 10/2009 | Tuominen et al. |
| 7,612,295 B2 | 11/2009 | Takada et al. |
| 7,618,846 B1 | 11/2009 | Pagaila et al. |
| 7,619,304 B2 | 11/2009 | Bauer et al. |
| 7,619,901 B2 | 11/2009 | Eichelberger et al. |
| 7,622,733 B2 | 11/2009 | Fuergut et al. |
| 7,629,186 B2 | 12/2009 | Siaudeau |
| 7,629,199 B2 | 12/2009 | Huang et al. |
| 7,629,674 B1 | 12/2009 | Foster |
| 7,633,170 B2 | 12/2009 | Yang et al. |
| 7,633,765 B1 | 12/2009 | Scanlon et al. |
| 7,635,641 B2 | 12/2009 | Hurwitz et al. |
| 7,639,473 B2 | 12/2009 | Hsu et al. |
| 7,642,128 B1 | 1/2010 | Lin et al. |
| 7,642,133 B2 | 1/2010 | Wu et al. |
| 7,643,311 B2 | 1/2010 | Coffy |
| 7,655,501 B2 | 2/2010 | Yang et al. |
| 7,656,047 B2 | 2/2010 | Yang et al. |
| 7,662,667 B2 | 2/2010 | Shen |
| 7,667,318 B2 | 2/2010 | Yang et al. |
| 7,669,320 B2 | 3/2010 | Hurwitz et al. |
| 7,671,457 B1 | 3/2010 | Hiner et al. |
| 7,671,466 B2 | 3/2010 | Pu et al. |
| 7,675,157 B2 | 3/2010 | Liu et al. |
| 7,675,170 B2 | 3/2010 | Formosa |
| 7,682,972 B2 | 3/2010 | Hurwitz et al. |
| 7,692,286 B1 | 4/2010 | Huemoeller et al. |
| 7,700,411 B2 | 4/2010 | Yang et al. |
| 7,705,245 B2 | 4/2010 | Miyamoto et al. |
| 7,714,431 B1 | 5/2010 | Huemoeller et al. |
| 7,719,094 B2 | 5/2010 | Wu et al. |
| 7,723,839 B2 | 5/2010 | Yano et al. |
| 7,727,803 B2 | 6/2010 | Yamagata |
| 7,727,818 B2 | 6/2010 | Hsieh et al. |
| 7,728,431 B2 | 6/2010 | Harada et al. |
| 7,732,242 B2 | 6/2010 | Brunnbauer et al. |
| 7,737,539 B2 | 6/2010 | Kwon et al. |
| 7,737,565 B2 | 6/2010 | Coffy |
| 7,741,151 B2 | 6/2010 | Amrine et al. |
| 7,741,156 B2 | 6/2010 | Pagaila et al. |
| 7,745,910 B1 | 6/2010 | Olson et al. |
| 7,750,467 B2 | 7/2010 | Pu et al. |
| 7,759,163 B2 | 7/2010 | Kroeninger et al. |
| 7,763,976 B2 | 7/2010 | Tang et al. |
| 7,767,495 B2 | 8/2010 | Fuergut et al. |
| 7,772,046 B2 | 8/2010 | Pagaila et al. |
| 7,777,351 B1 | 8/2010 | Berry et al. |
| 7,799,602 B2 | 9/2010 | Pagaila et al. |
| 7,807,512 B2 | 10/2010 | Lee et al. |
| 7,812,434 B2 | 10/2010 | Yang |
| 7,829,981 B2 | 11/2010 | Hsu |
| 7,829,987 B2 | 11/2010 | Chia |
| 7,830,004 B2 | 11/2010 | Wu et al. |
| 7,834,464 B2 | 11/2010 | Meyer et al. |
| 7,838,334 B2 | 11/2010 | Yu et al. |
| 7,842,541 B1 | 11/2010 | Rusli et al. |
| 7,880,091 B2 | 2/2011 | Miyamoto et al. |
| 7,902,648 B2 | 3/2011 | Lee |
| 7,932,599 B2 | 4/2011 | Kiendl et al. |
| 7,936,050 B2 | 5/2011 | Shin et al. |
| 7,939,935 B2 | 5/2011 | Chinda et al. |
| 7,948,090 B2 | 5/2011 | Manepalli et al. |
| 7,989,928 B2 | 8/2011 | Liao et al. |
| 8,015,700 B2 | 9/2011 | Nakamura et al. |
| 8,017,515 B2 | 9/2011 | Marimuthu et al. |
| 8,022,511 B2 | 9/2011 | Chiu et al. |
| 8,030,750 B2 | 10/2011 | Kim et al. |
| 8,035,213 B2 | 10/2011 | Lee et al. |
| 8,039,303 B2 | 10/2011 | Shim et al. |
| 8,076,757 B2 | 12/2011 | Pagaila et al. |
| 8,093,690 B2 | 1/2012 | Ko et al. |
| 8,101,864 B2 | 1/2012 | Chinda et al. |
| 8,105,872 B2 | 1/2012 | Pagaila et al. |
| 8,110,902 B2 | 2/2012 | Eun et al. |
| 8,110,916 B2 | 2/2012 | Weng et al. |
| 8,193,647 B2 | 6/2012 | Hsieh et al. |
| 8,212,339 B2 | 7/2012 | Liao et al. |
| 8,212,340 B2 | 7/2012 | Liao et al. |
| 8,220,145 B2 | 7/2012 | Hiner et al. |
| 8,222,976 B2 | 7/2012 | Yasooka |
| 8,230,591 B2 | 7/2012 | Chinda et al. |
| 8,278,746 B2 | 10/2012 | Ding et al. |
| 8,288,869 B2 | 10/2012 | Huang et al. |
| 8,320,134 B2 | 11/2012 | Su et al. |
| 8,330,267 B2 | 12/2012 | Chen et al. |
| 8,334,594 B2 | 12/2012 | Lo et al. |
| 8,358,001 B2 | 1/2013 | Yang et al. |
| 8,362,597 B1 | 1/2013 | Foster |
| 8,367,473 B2 | 2/2013 | Huang et al. |
| 8,368,185 B2 | 2/2013 | Lee et al. |
| 8,372,689 B2 | 2/2013 | Lee et al. |
| 8,378,466 B2 | 2/2013 | Chiu et al. |
| 8,399,776 B2 | 3/2013 | Appelt et al. |
| 8,405,213 B2 | 3/2013 | Chen et al. |
| 8,410,584 B2 | 4/2013 | An et al. |
| 8,432,022 B1 | 4/2013 | Huemoeller et al. |
| 8,450,836 B2 | 5/2013 | Uemura et al. |
| 8,471,215 B1 | 6/2013 | Kurin et al. |
| 8,569,894 B2 * | 10/2013 | Su et al. ................ 257/778 |
| 8,624,374 B2 | 1/2014 | Ding et al. |
| 8,884,424 B2 * | 11/2014 | Su et al. ................ 257/700 |
| 2001/0008301 A1 | 7/2001 | Terui |
| 2002/0030266 A1 | 3/2002 | Murata |
| 2002/0053724 A1 | 5/2002 | Lai et al. |
| 2002/0056192 A1 | 5/2002 | Suwa et al. |
| 2002/0093108 A1 | 7/2002 | Grigorov |
| 2002/0127780 A1 | 9/2002 | Ma et al. |
| 2002/0153618 A1 | 10/2002 | Hirano et al. |
| 2002/0158334 A1 | 10/2002 | Vu et al. |
| 2002/0171145 A1 | 11/2002 | Higuchi et al. |
| 2002/0173069 A1 | 11/2002 | Shibata |
| 2002/0182776 A1 | 12/2002 | Fujisawa et al. |
| 2002/0192872 A1 | 12/2002 | Fujisawa et al. |
| 2003/0030137 A1 | 2/2003 | Hashimoto |
| 2003/0034553 A1 | 2/2003 | Ano |
| 2003/0077871 A1 | 4/2003 | Cheng et al. |
| 2003/0090883 A1 | 5/2003 | Asahi et al. |
| 2003/0098502 A1 | 5/2003 | Sota |
| 2003/0129272 A1 | 7/2003 | Shen et al. |
| 2003/0213990 A1 | 11/2003 | Tsai et al. |
| 2004/0012099 A1 | 1/2004 | Nakayama |
| 2004/0020673 A1 | 2/2004 | Mazurkiewicz |
| 2004/0063242 A1 | 4/2004 | Kamezos |
| 2004/0080054 A1 | 4/2004 | Chinda et al. |
| 2004/0106232 A1 | 6/2004 | Sakuyama et al. |
| 2004/0110319 A1 | 6/2004 | Fukutomi et al. |
| 2004/0124515 A1 | 7/2004 | Tao et al. |
| 2004/0126927 A1 | 7/2004 | Lin et al. |
| 2004/0150097 A1 | 8/2004 | Gaynes et al. |
| 2004/0155352 A1 | 8/2004 | Ma |
| 2004/0155354 A1 | 8/2004 | Hanaoka et al. |
| 2004/0178500 A1 | 9/2004 | Usui |
| 2004/0191955 A1 | 9/2004 | Joshi et al. |
| 2004/0201101 A1 | 10/2004 | Kang et al. |
| 2004/0231872 A1 | 11/2004 | Arnold et al. |
| 2004/0252475 A1 | 12/2004 | Tsuneoka et al. |
| 2005/0006752 A1 | 1/2005 | Ogawa |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0054187 A1 | 3/2005 | Ding et al. |
| 2005/0062173 A1 | 3/2005 | Vu et al. |
| 2005/0112798 A1 | 5/2005 | Bjorbell |
| 2005/0117835 A1 | 6/2005 | Nguyen et al. |
| 2005/0121764 A1 | 6/2005 | Mallik et al. |
| 2005/0186704 A1 | 8/2005 | Yee et al. |
| 2005/0208702 A1 | 9/2005 | Kim |
| 2005/0212110 A1 | 9/2005 | Kato |

(56) References Cited

U.S. PATENT DOCUMENTS

| | | |
|---|---|---|
| 2005/0253223 A1 | 11/2005 | Marques |
| 2005/0253244 A1 | 11/2005 | Chang |
| 2006/0035409 A1 | 2/2006 | Suh et al. |
| 2006/0065387 A1 | 3/2006 | Tonapi et al. |
| 2006/0071315 A1 | 4/2006 | Oh et al. |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0170112 A1 | 8/2006 | Tanaka et al. |
| 2006/0220210 A1 | 10/2006 | Karnezos et al. |
| 2006/0231944 A1 | 10/2006 | Huang et al. |
| 2006/0240595 A1 | 10/2006 | Lee |
| 2006/0244117 A1 | 11/2006 | Karnezos et al. |
| 2006/0266547 A1 | 11/2006 | Koga |
| 2006/0284300 A1 | 12/2006 | Nishizawa et al. |
| 2006/0292753 A1 | 12/2006 | Takahashi |
| 2007/0025092 A1 | 2/2007 | Lee et al. |
| 2007/0029668 A1 | 2/2007 | Lin et al. |
| 2007/0030661 A1 | 2/2007 | Morris |
| 2007/0052076 A1 | 3/2007 | Ramos et al. |
| 2007/0057364 A1 | 3/2007 | Wang et al. |
| 2007/0059866 A1 | 3/2007 | Yang et al. |
| 2007/0069389 A1 | 3/2007 | Wollanke et al. |
| 2007/0090508 A1 | 4/2007 | Lin et al. |
| 2007/0096311 A1 | 5/2007 | Humpston et al. |
| 2007/0108580 A1 | 5/2007 | Goller |
| 2007/0108583 A1 | 5/2007 | Shim et al. |
| 2007/0131349 A1 | 6/2007 | Tuominen et al. |
| 2007/0145539 A1 | 6/2007 | Lam |
| 2007/0145541 A1 | 6/2007 | Lee et al. |
| 2007/0170582 A1 | 7/2007 | Nomura et al. |
| 2007/0170595 A1 | 7/2007 | Sinha |
| 2007/0176281 A1 | 8/2007 | Kim et al. |
| 2007/0190690 A1 | 8/2007 | Chow et al. |
| 2007/0221399 A1 | 9/2007 | Nishizawa et al. |
| 2007/0222054 A1 | 9/2007 | Hembree |
| 2007/0227761 A1 | 10/2007 | Tuominen et al. |
| 2007/0234563 A1 | 10/2007 | Sakaguchi et al. |
| 2007/0241437 A1 | 10/2007 | Kagaya et al. |
| 2007/0241453 A1 | 10/2007 | Ha et al. |
| 2007/0246252 A1 | 10/2007 | Buchwalter et al. |
| 2007/0246806 A1 | 10/2007 | Ong et al. |
| 2007/0252481 A1 | 11/2007 | Iwamoto et al. |
| 2007/0262422 A1 | 11/2007 | Bakalski et al. |
| 2007/0272940 A1 | 11/2007 | Lee et al. |
| 2007/0273008 A1 | 11/2007 | Suzuki |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2007/0296065 A1 | 12/2007 | Yew et al. |
| 2008/0017968 A1 | 1/2008 | Choi et al. |
| 2008/0042301 A1 | 2/2008 | Yang et al. |
| 2008/0061407 A1 | 3/2008 | Yang et al. |
| 2008/0073769 A1 | 3/2008 | Wu et al. |
| 2008/0081161 A1 | 4/2008 | Tomita et al. |
| 2008/0085572 A1 | 4/2008 | Yang |
| 2008/0087988 A1 | 4/2008 | Lee et al. |
| 2008/0089048 A1 | 4/2008 | Yamano et al. |
| 2008/0094805 A1 | 4/2008 | Tuominen et al. |
| 2008/0105967 A1 | 5/2008 | Yang et al. |
| 2008/0116564 A1 | 5/2008 | Yang et al. |
| 2008/0116574 A1 | 5/2008 | Fan |
| 2008/0128890 A1 | 6/2008 | Choi et al. |
| 2008/0136002 A1 | 6/2008 | Yang et al. |
| 2008/0136004 A1 | 6/2008 | Yang et al. |
| 2008/0136033 A1 | 6/2008 | Nagamatsu et al. |
| 2008/0136041 A1 | 6/2008 | Kotake et al. |
| 2008/0137314 A1 | 6/2008 | Salama et al. |
| 2008/0142960 A1 | 6/2008 | Leal et al. |
| 2008/0153209 A1 | 6/2008 | Liu et al. |
| 2008/0153245 A1 | 6/2008 | Lin et al. |
| 2008/0157316 A1 | 7/2008 | Yang et al. |
| 2008/0157327 A1 | 7/2008 | Yang et al. |
| 2008/0157336 A1 | 7/2008 | Yang et al. |
| 2008/0157402 A1 | 7/2008 | Ramakrishna et al. |
| 2008/0174008 A1 | 7/2008 | Yang et al. |
| 2008/0174013 A1 | 7/2008 | Yang et al. |
| 2008/0191343 A1 | 8/2008 | Liu et al. |
| 2008/0197469 A1 | 8/2008 | Yang et al. |
| 2008/0197473 A1 | 8/2008 | Chen et al. |
| 2008/0210462 A1 | 9/2008 | Kawagishi et al. |
| 2008/0230860 A1 | 9/2008 | Yen et al. |
| 2008/0230887 A1 | 9/2008 | Sun et al. |
| 2008/0237879 A1 | 10/2008 | Yang et al. |
| 2008/0246126 A1 | 10/2008 | Bowles et al. |
| 2008/0251908 A1 | 10/2008 | Yang et al. |
| 2008/0258293 A1 | 10/2008 | Yang et al. |
| 2008/0265421 A1 | 10/2008 | Brunnbauer et al. |
| 2008/0274593 A1 | 11/2008 | Yang et al. |
| 2008/0284017 A1 | 11/2008 | Lee et al. |
| 2008/0284035 A1 | 11/2008 | Brunnbauer et al. |
| 2008/0296697 A1 | 12/2008 | Hsu et al. |
| 2008/0303110 A1 | 12/2008 | Lee |
| 2008/0315375 A1 | 12/2008 | Eichelberger et al. |
| 2008/0315377 A1 | 12/2008 | Eichelberger et al. |
| 2008/0315391 A1 | 12/2008 | Kohl et al. |
| 2008/0315404 A1 | 12/2008 | Eichelberger et al. |
| 2008/0316714 A1 | 12/2008 | Eichelberger et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0014826 A1 | 1/2009 | Chien et al. |
| 2009/0014872 A1 | 1/2009 | Tuominen et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0039455 A1 | 2/2009 | Chien et al. |
| 2009/0045512 A1 | 2/2009 | Hedler et al. |
| 2009/0047797 A1 | 2/2009 | Anderson et al. |
| 2009/0050995 A1 | 2/2009 | Liu et al. |
| 2009/0050996 A1 | 2/2009 | Liu et al. |
| 2009/0051025 A1 | 2/2009 | Yang et al. |
| 2009/0075428 A1 | 3/2009 | Tang et al. |
| 2009/0096093 A1 | 4/2009 | Yang et al. |
| 2009/0096098 A1 | 4/2009 | Yang et al. |
| 2009/0101400 A1 | 4/2009 | Yamakoshi |
| 2009/0102003 A1 | 4/2009 | Vogt et al. |
| 2009/0102066 A1 | 4/2009 | Lee et al. |
| 2009/0108460 A1 | 4/2009 | Otremba et al. |
| 2009/0115072 A1 | 5/2009 | Rhyner et al. |
| 2009/0127680 A1 | 5/2009 | Do et al. |
| 2009/0127686 A1 | 5/2009 | Yang et al. |
| 2009/0129037 A1 | 5/2009 | Yoshino |
| 2009/0133251 A1 | 5/2009 | Tuominen et al. |
| 2009/0140394 A1 | 6/2009 | Bathan et al. |
| 2009/0140441 A1 | 6/2009 | Camacho et al. |
| 2009/0140442 A1 | 6/2009 | Lin |
| 2009/0146297 A1 | 6/2009 | Badakere et al. |
| 2009/0152688 A1 | 6/2009 | Do et al. |
| 2009/0155959 A1 | 6/2009 | Lin et al. |
| 2009/0160046 A1 | 6/2009 | Otremba et al. |
| 2009/0160053 A1 | 6/2009 | Meyer et al. |
| 2009/0166785 A1 | 7/2009 | Camacho et al. |
| 2009/0166873 A1 | 7/2009 | Yang et al. |
| 2009/0170242 A1 | 7/2009 | Lin et al. |
| 2009/0176348 A1 | 7/2009 | Griffiths |
| 2009/0194851 A1 | 8/2009 | Chiu et al. |
| 2009/0194852 A1 | 8/2009 | Chiu et al. |
| 2009/0200648 A1 | 8/2009 | Graves |
| 2009/0221114 A1 | 9/2009 | Xu |
| 2009/0224391 A1 | 9/2009 | Lin et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chien et al. |
| 2009/0230526 A1 | 9/2009 | Chen et al. |
| 2009/0230542 A1 | 9/2009 | Lin et al. |
| 2009/0236686 A1 | 9/2009 | Shim et al. |
| 2009/0236700 A1 | 9/2009 | Moriya |
| 2009/0236749 A1 | 9/2009 | Otremba et al. |

(56) References Cited

U.S. PATENT DOCUMENTS

| | | |
|---|---|---|
| 2009/0256244 A1 | 10/2009 | Liao et al. |
| 2009/0256247 A1 | 10/2009 | Landau et al. |
| 2009/0261466 A1 | 10/2009 | Pagaila et al. |
| 2009/0261470 A1 | 10/2009 | Choi et al. |
| 2009/0273075 A1 | 11/2009 | Meyer-Berg |
| 2009/0294160 A1 | 12/2009 | Yoshimura et al. |
| 2009/0294899 A1 | 12/2009 | Pagaila et al. |
| 2009/0294911 A1 | 12/2009 | Pagaila et al. |
| 2009/0294928 A1 | 12/2009 | Kim et al. |
| 2009/0302435 A1 | 12/2009 | Pagaila et al. |
| 2009/0302439 A1 | 12/2009 | Pagaila et al. |
| 2009/0302446 A1 | 12/2009 | Lee et al. |
| 2009/0309212 A1 | 12/2009 | Shim et al. |
| 2009/0315156 A1 | 12/2009 | Harper |
| 2010/0000775 A1 | 1/2010 | Shen et al. |
| 2010/0001396 A1 | 1/2010 | Meyer et al. |
| 2010/0006330 A1 | 1/2010 | Fu et al. |
| 2010/0006987 A1 | 1/2010 | Murugan et al. |
| 2010/0006994 A1 | 1/2010 | Shim et al. |
| 2010/0007029 A1 | 1/2010 | Do et al. |
| 2010/0013064 A1 | 1/2010 | Hsu |
| 2010/0013065 A1 | 1/2010 | Mistry et al. |
| 2010/0013081 A1 | 1/2010 | Toh et al. |
| 2010/0013102 A1 | 1/2010 | Tay et al. |
| 2010/0019359 A1 | 1/2010 | Pagaila et al. |
| 2010/0019370 A1 | 1/2010 | Pressel et al. |
| 2010/0019381 A1 | 1/2010 | Haeberlen et al. |
| 2010/0031500 A1 | 2/2010 | Eichelberger et al. |
| 2010/0032091 A1 | 2/2010 | Eichelberger et al. |
| 2010/0032815 A1 | 2/2010 | An et al. |
| 2010/0032818 A1 | 2/2010 | Pilling et al. |
| 2010/0032821 A1 | 2/2010 | Pagaila et al. |
| 2010/0035384 A1 | 2/2010 | Eichelberger et al. |
| 2010/0044855 A1 | 2/2010 | Eichelberger et al. |
| 2010/0047970 A1 | 2/2010 | Eichelberger et al. |
| 2010/0052135 A1 | 3/2010 | Shim et al. |
| 2010/0059853 A1 | 3/2010 | Lin et al. |
| 2010/0059854 A1 | 3/2010 | Lin et al. |
| 2010/0059898 A1 | 3/2010 | Keeth et al. |
| 2010/0072599 A1 | 3/2010 | Camacho et al. |
| 2010/0072618 A1 | 3/2010 | Camacho et al. |
| 2010/0078776 A1 | 4/2010 | Barth et al. |
| 2010/0078777 A1 | 4/2010 | Barth et al. |
| 2010/0078779 A1 | 4/2010 | Barth et al. |
| 2010/0084759 A1 | 4/2010 | Shen |
| 2010/0096739 A1 | 4/2010 | Kawabata et al. |
| 2010/0109132 A1 | 5/2010 | Ko et al. |
| 2010/0110656 A1 | 5/2010 | Ko et al. |
| 2010/0133704 A1 | 6/2010 | Marimuthu et al. |
| 2010/0140736 A1 | 6/2010 | Lin et al. |
| 2010/0140759 A1 | 6/2010 | Pagaila et al. |
| 2010/0140771 A1 | 6/2010 | Huang et al. |
| 2010/0140779 A1 | 6/2010 | Lin et al. |
| 2010/0171205 A1 | 7/2010 | Chen et al. |
| 2010/0171206 A1 | 7/2010 | Chu et al. |
| 2010/0171207 A1 | 7/2010 | Shen et al. |
| 2010/0200951 A1 | 8/2010 | Lin et al. |
| 2010/0207257 A1 | 8/2010 | Lee et al. |
| 2010/0207258 A1 | 8/2010 | Eun et al. |
| 2010/0207259 A1 | 8/2010 | Liao et al. |
| 2010/0214780 A1 | 8/2010 | Villard |
| 2010/0219514 A1 | 9/2010 | Ohguro |
| 2010/0221873 A1 | 9/2010 | Marimuthu et al. |
| 2010/0224983 A1 | 9/2010 | Huang et al. |
| 2010/0233831 A1 | 9/2010 | Pohl et al. |
| 2010/0237477 A1 | 9/2010 | Pagaila et al. |
| 2010/0244208 A1 | 9/2010 | Pagaila et al. |
| 2010/0270661 A1 | 10/2010 | Pagaila et al. |
| 2010/0276792 A1 | 11/2010 | Chi et al. |
| 2010/0288541 A1 | 11/2010 | Appelt et al. |
| 2010/0289132 A1 | 11/2010 | Huang et al. |
| 2010/0308449 A1 | 12/2010 | Yang et al. |
| 2010/0314726 A1 | 12/2010 | Mueller et al. |
| 2010/0314744 A1 | 12/2010 | Huang et al. |
| 2010/0314746 A1 | 12/2010 | Hsieh et al. |
| 2010/0320585 A1 | 12/2010 | Jiang et al. |
| 2010/0320593 A1 | 12/2010 | Weng et al. |
| 2010/0320610 A1 | 12/2010 | Huang et al. |
| 2010/0326707 A1 | 12/2010 | Kwon et al. |
| 2011/0006408 A1 | 1/2011 | Liao |
| 2011/0018118 A1 | 1/2011 | Hsieh et al. |
| 2011/0018124 A1 | 1/2011 | Yang et al. |
| 2011/0037169 A1 | 2/2011 | Pagaila et al. |
| 2011/0049704 A1 | 3/2011 | Sun et al. |
| 2011/0057301 A1 | 3/2011 | Chen et al. |
| 2011/0068433 A1 | 3/2011 | Kim et al. |
| 2011/0068453 A1 | 3/2011 | Cho et al. |
| 2011/0068459 A1 | 3/2011 | Pagaila et al. |
| 2011/0074008 A1 | 3/2011 | Hsieh |
| 2011/0084370 A1 | 4/2011 | Su et al. |
| 2011/0084372 A1 | 4/2011 | Su et al. |
| 2011/0101509 A1 | 5/2011 | Han et al. |
| 2011/0115059 A1 | 5/2011 | Lee et al. |
| 2011/0115060 A1 | 5/2011 | Chiu et al. |
| 2011/0115066 A1 | 5/2011 | Kim et al. |
| 2011/0115082 A1 | 5/2011 | Gluschenkov et al. |
| 2011/0117700 A1 | 5/2011 | Weng et al. |
| 2011/0127654 A1 | 6/2011 | Weng et al. |
| 2011/0140364 A1 | 6/2011 | Head |
| 2011/0156251 A1 | 6/2011 | Chu et al. |
| 2011/0169150 A1 | 7/2011 | Su et al. |
| 2011/0177654 A1 | 7/2011 | Lee et al. |
| 2011/0194265 A1 | 8/2011 | Su et al. |
| 2011/0227219 A1 | 9/2011 | Alvarado et al. |
| 2011/0227220 A1 | 9/2011 | Chen et al. |
| 2011/0241192 A1 | 10/2011 | Ding et al. |
| 2011/0241193 A1 | 10/2011 | Ding et al. |
| 2011/0241194 A1 | 10/2011 | Chen et al. |
| 2011/0260302 A1 | 10/2011 | Bakalski et al. |
| 2011/0278703 A1 | 11/2011 | Pagaila et al. |
| 2011/0278741 A1 | 11/2011 | Chua et al. |
| 2011/0298109 A1 | 12/2011 | Pagaila et al. |
| 2011/0309488 A1 | 12/2011 | Pagaila |
| 2012/0038053 A1 | 2/2012 | Oh et al. |
| 2012/0056321 A1 | 3/2012 | Pagaila |
| 2012/0074538 A1 | 3/2012 | Tsai et al. |
| 2012/0077311 A1 | 3/2012 | Kim et al. |
| 2012/0098109 A1 | 4/2012 | Ko et al. |
| 2012/0104570 A1 | 5/2012 | Kim |
| 2012/0104571 A1 | 5/2012 | Yoo |
| 2012/0104572 A1 | 5/2012 | Yoo |
| 2012/0104573 A1 | 5/2012 | Pagaila et al. |
| 2012/0112326 A1 | 5/2012 | Pagaila et al. |
| 2012/0119373 A1 | 5/2012 | Hunt |
| 2012/0153472 A1 | 6/2012 | Pagaila et al. |
| 2012/0153493 A1 | 6/2012 | Lee et al. |
| 2012/0175732 A1 | 7/2012 | Lin et al. |
| 2012/0199958 A1 | 8/2012 | Horibe |
| 2012/0199972 A1 | 8/2012 | Pagaila et al. |
| 2012/0235309 A1 | 9/2012 | Essig et al. |
| 2012/0292749 A1 | 11/2012 | Pagaila et al. |
| 2012/0306063 A1 | 12/2012 | Kimura et al. |
| 2013/0228904 A1 | 9/2013 | Brunnbauer et al. |

FOREIGN PATENT DOCUMENTS

| | | |
|---|---|---|
| CN | 1774804 A | 5/2006 |
| CN | 1873935 A | 12/2006 |
| CN | 100536127 C | 9/2009 |
| CN | 201110050611.3 | 10/2012 |
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 02078299 | 3/1990 |
| JP | 03023654 | 1/1991 |
| JP | 03171652 | 7/1991 |
| JP | 04147652 | 5/1992 |
| JP | 04206858 | 7/1992 |
| JP | 05129476 | 5/1993 |
| JP | 2007-335783 | 12/1995 |
| JP | 08288686 | 1/1996 |

(56) References Cited

FOREIGN PATENT DOCUMENTS

| | | |
|---|---|---|
| JP | 10-125819 A | 5/1998 |
| JP | 2000-294720 | 10/2000 |
| JP | 2001-298115 | 10/2001 |
| JP | 2002-158312 | 5/2002 |
| JP | 2002-170906 | 6/2002 |
| JP | 2003273571 | 9/2003 |
| JP | 2004007006 | 1/2004 |
| JP | 2004-327855 | 11/2004 |
| JP | 2009-054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 11/2006 |
| TW | 200739875 | 10/2007 |
| TW | 200924137 | 6/2009 |
| TW | 200941637 A | 10/2009 |
| WO | WO 0233751 | 4/2002 |
| WO | WO 2004/060034 | 7/2004 |
| WO | WO 2006/076613 | 7/2006 |

OTHER PUBLICATIONS

Appelt, et al. "A new, cost effective coreless substrate technology." Proc. ICSJ, The IEEE CPMT Symposium Japan, Univ. Tokyo, Tokyo Japan (2010).
Appelt et al., "Single sided substrates and packages based on laminate materials." APM-Microtech, Cambridge UK (Mar. 2010).
Appelt et al., "Single sided substrates—a new opportunity for miniaturizing packages." ICEP (Int'l Conf. on Electronics Packaging), Hokkaido, Japan (May 2010).
Kikuchi, et al., "High-performance FCBGA based on ultra-thin packaging substrate," NEC J. Adv. Tech. vol. 2:3 pp. 222-228 (2005).
English Translation of Abstract only for TW200924137.
English Translation of Abstract only for TW200739875.
Search Report Taiwan Application No. TW 100106679 dated Mar. 7, 2014, machine translation of cited references page, 1 page.
Notice of Allowance for U.S. Appl. No. 13/006,340 dated Jun. 26, 2013.

* cited by examiner

SEMICONDUCTOR PACKAGE WITH SINGLE SIDED SUBSTRATE DESIGN AND MANUFACTURING METHODS THEREOF

CROSS-REFERENCE TO RELATED APPLICATIONS

The present application is a continuation of U.S. application Ser. No. 14/033,673, filed on Sep. 23, 2013, which is a continuation of U.S. application Ser. No. 13/006,340, filed on Jan. 13, 2011, now issued as U.S. Pat. No. 8,569,894, which claims the benefit of U.S. Provisional Application No. 61/294,519, filed on Jan. 13, 2010, U.S. Provisional Application No. 61/310,290, filed on Mar. 4, 2010, and Taiwan Application No. 99112317, filed on Apr. 20, 2010, the disclosures of which are incorporated herein by reference in their entirety.

BACKGROUND OF THE INVENTION

1. Field of the Invention

The invention relates generally to semiconductor device packages and manufacturing methods thereof More particularly, the invention relates to semiconductor device packages with a single sided substrate design and manufacturing methods thereof 2. Description of Related Art Integrated circuit (IC) package technology plays an important role in the electronics industry. As light weight, compactness, and high efficiency have become typical requirements of consumer electronic and communication products, chip packages should provide superior electrical properties, small overall volume, and a large number of I/O ports. Substrates used in these chip packages often have multiple metal layers that can be electrically connected using traces and/or vias. As the size of chip packages decreases, these traces and vias for connecting the multiple metal layers can become smaller and more closely spaced, which can increase the cost and complexity of integrated circuit packaging processes. It is therefore desirable to develop a substrate that has a thin profile, that is manufactured by a less complex process, that is suitable for mass production, and that can be produced with high production yield. It is also desirable to develop corresponding packages including the substrate, and manufacturing methods of the substrate and of the corresponding packages.

It is against this background that a need arose to develop the semiconductor package and related methods described herein.

SUMMARY OF THE INVENTION

An aspect of the invention relates to a multilayer substrate. In one embodiment, the multilayer substrate includes (1) a first outer conductive patterned layer, (2) a first insulating layer exposing a portion of the first outer conductive patterned layer to define a first set of pads, (3) a second outer conductive patterned layer, (4) a second insulating layer exposing a portion of the second outer conductive patterned layer to define a second set of pads; and (5) multiple inner layers disposed between the first outer conductive patterned layer and the second outer conductive patterned layer. Each of the inner layers is electrically connected with at least one of the first outer conductive patterned layer and the second outer conductive patterned layer. Each of the inner layers includes (a) an inner conductive patterned layer, (b) multiple inner conductive posts formed adjacent to the inner conductive patterned layer, and (c) an inner dielectric layer. In each inner layer, the inner conductive patterned layer and the inner conductive posts are embedded in the inner dielectric layer, and a top surface of each of the inner conductive posts is exposed from the inner dielectric layer. Also in each inner layer, the inner dielectric layer includes a fiber-reinforced resin material, and fibers adjacent to the inner conductive posts are pushed along vertically extending directions of the inner conductive posts and away from the inner conductive patterned layer.

In one embodiment, the multilayer substrate further includes an outer dielectric layer disposed between the first insulating layer and a first one of the inner layers, and multiple outer conductive posts extending through the outer dielectric layer and electrically connecting the first outer conductive patterned layer with the inner conductive patterned layer of the first one of the inner layers. In one embodiment, one of the outer conductive posts of the multilayer substrate is aligned with a corresponding one of the inner conductive posts on each of the inner layers, such that one of the first set of pads is electrically connected to one of the second set of pads. In one embodiment, in each of the inner layers of the multilayer substrate, one surface of the inner conductive patterned layer is aligned with a first surface of the inner dielectric layer. In one embodiment, in each of the inner layers of the multilayer substrate, one surface of each of the inner conductive posts is aligned with a second surface of the inner dielectric layer.

Another aspect of the invention relates to another multilayer substrate. In one embodiment, the multilayer substrate includes (1) multiple inner layers, (2) an intermediary layer adjacent to a lowermost inner layer, (3) a first patterned outer conductive layer, and (4) a second patterned outer conductive layer disposed adjacent to the intermediary layer. Each inner layer includes (a) an inner conductive patterned layer, (2) multiple inner conductive posts formed adjacent to the inner conductive patterned layer, and (3) an inner dielectric layer. In each inner layer, the inner conductive patterned layer and the inner conductive posts are embedded in the inner dielectric layer. An uppermost inner layer defines openings in the inner dielectric layer of the uppermost inner layer, and at least one of the openings exposes a top recessed surface of one of the inner conductive posts of the uppermost inner layer. The intermediary layer includes an intermediary dielectric layer and multiple intermediary conductive posts recessed from a surface of the intermediary dielectric layer. The first patterned outer conductive layer is disposed adjacent to the uppermost inner layer and extends into the at least one of the openings to contact the top recessed surface of the one inner conductive post. The second patterned outer conductive layer contacts the intermediary conductive posts.

In one embodiment, the multilayer substrate further includes a pad disposed over the first patterned outer conductive layer and disposed above the one inner conductive post, and an outer dielectric layer exposing the pad. In one embodiment, the multilayer substrate further includes a pad disposed over the second patterned outer conductive layer and positioned below one of the intermediary conductive posts, and an outer dielectric layer exposing the pad.

Another aspect of the invention relates to another multilayer substrate. In one embodiment, the multilayer substrate includes (1) multiple inner layers, (2) an intermediary layer, and (3) a first patterned outer conductive layer disposed adjacent to the intermediary layer and extending into at least one of the openings to contact the intermediary conductive patterned layer. Each inner layer includes (a) an inner conductive patterned layer, (b) multiple inner conductive posts formed adjacent to the inner conductive patterned layer, and (c) an inner dielectric layer. In each inner layer, the inner conductive patterned layer and the inner conductive posts are embedded in the inner dielectric layer. The intermediary layer includes an intermediary conductive patterned layer; and an intermediary dielectric layer defining multiple openings. Each of the openings exposes a portion of the intermediary conductive patterned layer.

In one embodiment, the multilayer substrate includes a pad disposed over the first patterned outer conductive layer, positioned in alignment with one of the inner conductive posts, and an outer dielectric layer exposing the pad. In one embodiment, the multilayer substrate includes a first lower dielectric layer defining multiple openings exposing the inner conductive patterned layer of one of the inner layers, a conductive material extending into at least one of the openings and contacting the exposed inner conductive patterned layer, a pad disposed over the conductive material, and a second lower dielectric layer exposing the pad.

Another aspect of the invention relates to a substrate. In one embodiment, the substrate includes (1) a first patterned conductive layer having an upper surface, (2) a first dielectric layer disposed adjacent to the upper surface of the first patterned conductive layer, the first dielectric layer exposing a portion of the first patterned conductive layer to form multiple first contact pads, (3) a second patterned conductive layer below the first patterned conductive layer and having a lower surface, (4) a second dielectric layer between the first patterned conductive layer and the second patterned conductive layer, and (5) multiple conductive posts. The second dielectric layer defines multiple openings extending from the first patterned conductive layer to the second patterned conductive layer, and the second patterned conductive layer includes multiple second contact pads exposed by the second dielectric layer. Each of the conductive posts extends from the first patterned conductive layer to a corresponding one of the second contact pads through a corresponding one of the openings in the second dielectric layer, and each of the conductive posts fill the corresponding one of the openings in the second dielectric layer.

In one embodiment, at least one of the conductive posts in the substrate defines a cavity, and the cavity is filled by a part of the first dielectric layer. In one embodiment, the second dielectric layer has a lower surface, and the lower surface of the second patterned conductive layer is recessed from the lower surface of the second dielectric layer. In one embodiment, each of the conductive posts of the substrate has an upper surface having a first area and a lower surface having a second area, and the first area is larger than the second area. In one embodiment, the first patterned conductive layer of the substrate includes a first conductive layer, a second conductive layer, and a seed layer therebetween.

Another aspect of the invention relates to a semiconductor package. The semiconductor package includes a substrate, a die, and a package body. The substrate includes (1) a first patterned conductive layer having an upper surface, (2) a first dielectric layer disposed adjacent to the upper surface of the first patterned conductive layer, the first dielectric layer exposing a part of the first patterned conductive layer to form multiple first contact pads, (3) a second patterned conductive layer below the first patterned conductive layer and having a lower surface, (4) a second dielectric layer between the first patterned conductive layer and the second patterned conductive layer, the second dielectric layer defining multiple openings extending from the first patterned conductive layer to the second patterned conductive layer, the second patterned conductive layer including multiple second contact pads and at least a trace, (5) a third dielectric layer disposed on the second dielectric layer, the third dielectric layer exposing the second contact pads and covering the trace; and (6) multiple conductive posts. Each conductive post extends from the first patterned conductive layer to a corresponding one of the second contact pads through a corresponding one of the openings in the second dielectric layer, the conductive posts filling the corresponding one of the openings in the second dielectric layer. The die is electrically connected to the first contact pads, and the package body covers the first patterned conductive layer and the die.

Other aspects and embodiments of the invention are also contemplated. The foregoing summary and the following detailed description are not meant to restrict the invention to any particular embodiment but are merely meant to describe some embodiments of the invention.

Figure 1:
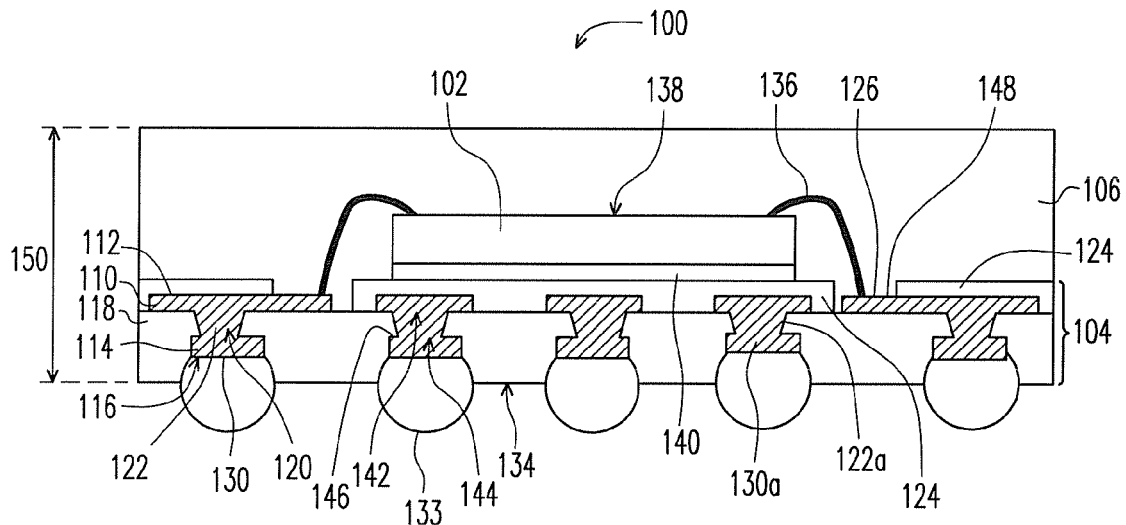
FIG. 1 illustrates a cross section view of a semiconductor package, according to an embodiment of the invention.

The drawings illustrate embodiments of the invention and, together with the description, serve to explain the principles of some embodiments of the invention. Reference will now be made in detail to some embodiments of the invention, examples of which are illustrated in the accompanying drawings. Wherever possible, the same reference numbers are used in the drawings and the descriptions to refer to the same or like features.

DETAILED DESCRIPTION OF THE INVENTION

Attention first turns to FIG. 1, which illustrates a cross-section view of a semiconductor package 100, according to an embodiment of the invention. The semiconductor package 100 includes a die 102, a substrate unit 104, and a package body 106. The substrate unit 104 includes a patterned conductive layer 110 having an upper surface 112, and one or more conductive blocks 114 having a lower surface 116. The patterned conductive layer 110 extends laterally within the substrate unit 104. The substrate unit 104 also includes a dielectric layer 118 between the patterned conductive layer 110 and the conductive blocks 114. The dielectric layer 118 has a lower surface 134. The dielectric layer 118 defines openings 120 that extend from the patterned conductive layer 110 to the conductive blocks 114. Each of a plurality of conductive posts 122 extend from the patterned conductive layer 110 to a corresponding one of the conductive blocks 114 through a corresponding one of the openings 120. The conductive posts 122 may be formed as a conductive layer such as a seed layer (see FIG. 11K). Alternatively, the conductive posts 122 may include a first portion formed as a conductive layer such as a seed layer (see FIG. 11K), and a second portion formed on the seed layer (see FIG. 11M). At least part of the first portion of the conductive posts 122 may be disposed between the second portion of the conductive posts 122 and the conductive blocks 114. In one embodiment, each of the plurality of conductive posts 122 substantially fills the corresponding one of the openings 120. The substrate unit 104 further includes a dielectric layer 124 that is disposed adjacent to the upper surface 112 of the patterned conductive layer 110. The dielectric layer 124 may be solder mask. The dielectric layer 124 exposes a part of the patterned conductive layer 110 to form first contact pads 126. In one embodiment, the first contact pads 126 may be positioned outside the footprint of the die 102, such as in wire bonding applications. Alternatively or in addition, the first contact pads 126 may be positioned under the die 102, such as in flip-chip bonding applications. In one embodiment, the first contact pads 126 may be covered by a surface finish layer (not shown).

In one embodiment, the dielectric layer 118 exposes the lower surface 116 of the conductive blocks 114 to form second contact pads 130. The second contact pads 130 may be for electrical connection externally to the package 100, such as electrical connection to another semiconductor package or to other components on a circuit board. For example, an electrical contact 133, such as a solder ball, may be electrically connected to and disposed adjacent to a corresponding one of the second contact pads 130.

In one embodiment, each of the plurality of conductive posts 122 has a height in the range from about 30 μm to about 150 μm, such as from about 30 μm to about 50 μm, from about 30 μm to about 100 μm, from about 50 μm to about 100 μm, and from about 100 μm to 150 μm. Each conductive post 122 may be in the range from about 150 μm to 250 μm in diameter, such as about 200 μm in diameter. Each conductive post 122 has an upper surface 142 having a first area and a lower surface 144 having a second area. In one embodiment, the first area is larger than the second area. In addition, an upper surface 146 of each of the second contact pads 130 has a third area. The diameter of the second contact pads 130 may range from about 150 μm to upwards of about 300 μm. Therefore, in one embodiment, the third area is larger than the second area. Alternatively, the third area may be smaller than or equal to the second area. In one embodiment, the upper surface 142 and the lower surface 144 of the conductive posts 122 may have a shape including but not limited to a substantially circular shape, a substantially elliptical shape, a substantially square shape, and a substantially rectangular shape.

In embodiments of the invention having a single sided substrate design, the conductive posts 122 electrically connect the patterned conductive layer 110 to the second contact pads 130 without the need for vias, such as plated through holes. This can significantly reduce the cost of the packages 100. In addition, some of the conductive posts 122 (such as conductive posts 122a disposed at least partially under the die, as described below) can facilitate conduction of heat away from the die 102 and out of the package 100. Also, the second contact pads 130 can be buried in the dielectric layer 118, which can increase mounting reliability of the package 100 because stress centralization is reduced.

In one embodiment, the lower surface 116 of the conductive blocks 114 is recessed from the lower surface 134 of the dielectric layer 118, so that the second contact pads 130 are recessed from the lower surface 134. Recessing the second contact pads 130 from the lower surface 134 can facilitate attachment of the electrical contacts 133 to the second contact pads 130. Alternatively, the lower surface 116 of the conductive blocks 114 may be exposed at the lower surface 134 of the dielectric layer 118.

In one embodiment, the package 100 has a thickness 150 in the range of about 200 μm to about 500 μm, such as from about 200 μm to about 350 μm, from about 300 μm to about 350 μm, from about 300 μm to about 400 μm, from about 300 !um to about 450 μm, and from about 300 μm to about 500 μm, although the thickness of the package 100 is not constrained to this range.

In one embodiment, bonding pads on an active surface 138 of the die 102 are electrically connected to the first contact pads 126 via bonding wires 136. The first contact pads 126 are disposed around the die 102, and may completely or partially surround the die 102. The package body 106 substantially covers or encapsulates the die 102, the bonding wires 136, and the first patterned conductive layer 110 to provide mechanical stability as well as protection against oxidation, humidity, and other environmental conditions. The package body 106 may be made of a molding material that can include, for example, a Novolac-based resin, an epoxy-based resin, a silicone-based resin, other another suitable encapsulant. Suitable fillers can also be included, such as powdered SiO2.

In one embodiment, the die 102 is disposed adjacent to the dielectric layer 124, a part of which may serve as a die pad. A die attach layer 140 formed from a die attach material such as adhesive or film may optionally be added between the die 102 and the dielectric layer 124. The die attach layer 140 may include epoxy, resin, or other suitable materials.

Single-sided substrates such as the substrate unit 104 often have a single metal layer (such as the patterned conductive layer 110). Within this single metal layer, routing can take place via traces to attain a fan-in configuration, a fan-out configuration, or a combination of both. In one embodiment, the patterned conductive layer 110 may include traces 148 that electrically connect each first contact pads 126 to a corresponding one of the conductive posts 122, and to a corresponding one of the second contact pads 130. In the embodiment of FIG. 1, the traces 148 electrically connect the first contact pads 126 to second contact pads 130 that extend outside the footprint of the die 102 in a fan-out configuration. In one embodiment, a part of the patterned conductive layer 110 that is at least partially under the die 102 may also be electrically connected to a second contact pad 130a via a conductive post 122a at least partially under the die 102. Although the die 102 is not electrically connected to the conductive post 122a and the second contact pad 130a in the embodiment of FIG. 1, the conductive post 122a and the second contact pad 130a can still help to conduct heat away from the die 102 and out of the package 100.

Figure 2:
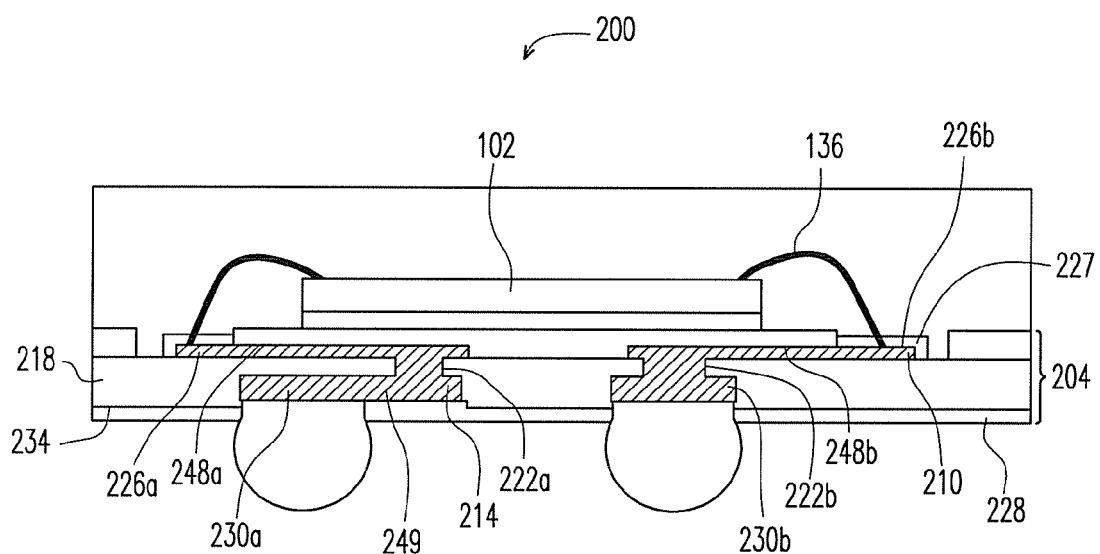
FIG. 2 illustrates a cross section view of a semiconductor package, according to an embodiment of the invention.

FIG. 2 illustrates a cross section view of a semiconductor package 200, according to an embodiment of the invention. The semiconductor package 200 is in many respects similar to the semiconductor package 100 described with reference to FIG. 1, so only aspects of the semiconductor package 200 that are different are discussed here. The semiconductor package 200 includes a substrate unit 204 that includes a patterned conductive layer 210 (similar to the patterned conductive layer 110) including first contact pads 226 (similar to the first contact pads 126), traces 248 (similar to the traces 148), conductive posts 222 (similar to the conductive posts 122), a conductive layer 214, and a dielectric layer 228. The conductive layer 214 includes second contact pads 230 (similar to second contact pads 130) and one or more traces 249 adjacent to a lower surface 234 of a dielectric layer 218 (similar to the dielectric layer 118). The dielectric layer 228 exposes a part of the conductive layer 214 to form the second contact pads 230. In one embodiment, the first contact pads 226 may be covered by a surface finish layer 227.

In one embodiment, the die 102 is electrically connected to a second contact pad 230b under the die 102 via bonding wire 136, a first contact pad 226b outside the footprint of the die 102, a trace 248b, and a conductive post 222b. This support of fan-in by the package 200 is facilitated by the trace 248b, which laterally extends from under the die 102 to the first contact pad 226b located outside the footprint of the die 102. As previously described with reference to FIG. 1, routing can take place via traces included in the single metal layer 210 to attain a fan-in configuration, a fan-out configuration, or a combination of both. The second contact pad 230b may cover the conductive post 222b, so that no additional trace is needed on the lower surface 234 of the dielectric layer 218.

As described previously, an advantage of the single sided substrate design of embodiments of the invention is that conductive posts electrically connect a patterned conductive layer on a first side of a substrate unit to contact pads on a second side of a substrate unit without the need for vias, such as plated through holes. The package 200 leverages this advantage of single sided substrate design. In addition, the additional conductive layer 214 of the package 200 provides additional routing flexibility via the traces 249 on the lower surface 234 of the dielectric layer 218. In one embodiment, a second contact pad 230a is electrically connected to a conductive post 222a via the trace 249, and can be laterally displaced from its corresponding conductive post 222a. The trace 249 may be covered by the dielectric layer 228, and may cover the conductive post 222a. It can be advantageous to laterally displace the conductive posts 222 from their corresponding second contact pads 230 to simplify routing within the package 200, as the positioning of the second contact pads 230 may be fixed based on external interfacing requirements to the package 200.

Figure 3:
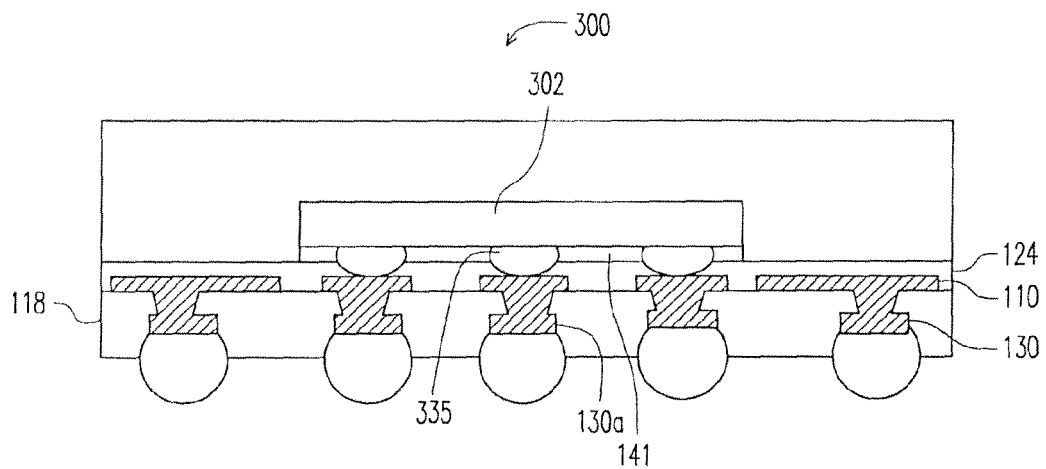
FIG. 3 illustrates a cross section view of a semiconductor package, according to an embodiment of the invention.

FIG. 3 illustrates a cross section view of a semiconductor package 300, according to an embodiment of the invention. The semiconductor package 300 is similar to the semiconductor package 100 described with reference to FIG. 1, except that the die 302 is flip-chip bonded. An underfill layer 141 may optionally be added between the die 302 and the dielectric layer 124. As a result, the second contact pad 130a under the die 302 may be electrically connected to the die 302 via a fused conductive bump 335 extending through the dielectric layer 124, which may be made of a conductive material such as solder. The die 302 may also be electrically connected to one or more second contact pads 130 outside of the perimeter of the die, such as for fan-out applications. The electrical connection of the die 302 to the second contact pads 130 outside of the perimeter of the die may be through one or more fused conductive bumps 335 under the die to the patterned conductive layer 110 to traces (not shown) in the dielectric layer 118. It would be understood by one of ordinary skill in the art that the package 200 of FIG. 2 may also support flip-chip bonding in a similar manner.

Figure 4:
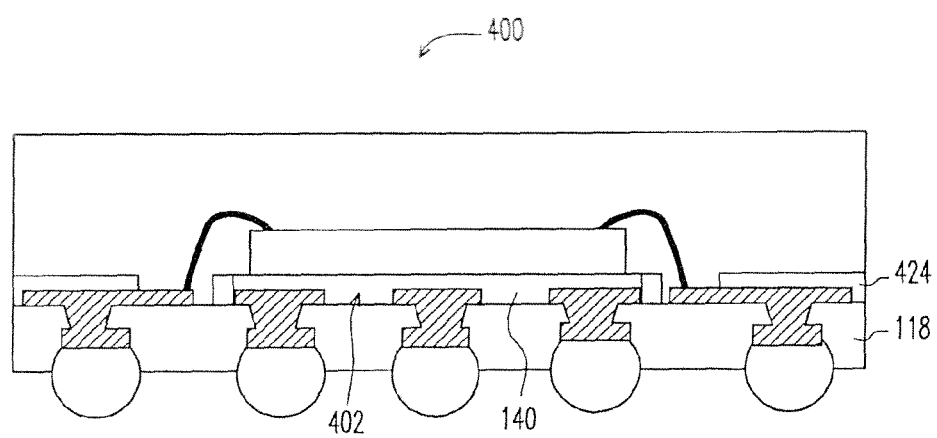
FIG. 4 illustrates a cross section view of a semiconductor package, according to an embodiment of the invention.

FIG. 4 illustrates a cross section view of a semiconductor package 400, according to an embodiment of the invention. The semiconductor package 400 is similar to the semiconductor package 100 described with reference to FIG. 1, except that the die attach layer 140 is adjacent to the dielectric layer 118. The die attach layer 140 may be positioned in an opening 402 defined by a dielectric layer 424 (otherwise similar to the dielectric layer 124 of FIG. 1). It would be understood by one of ordinary skill in the art that the package 200 of FIG. 2 may also support a similar structure.

Figure 5:
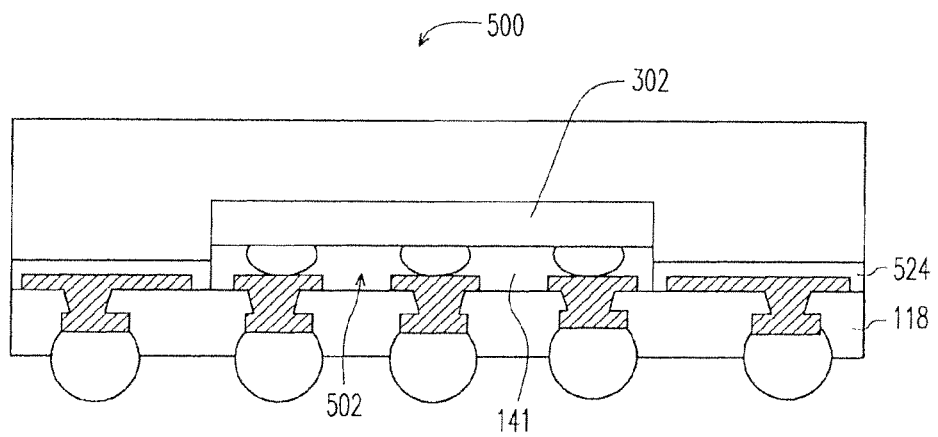
FIG. 5 illustrates a cross section view of a semiconductor package, according to an embodiment of the invention.

FIG. 5 illustrates a cross section view of a semiconductor package 500, according to an embodiment of the invention. The semiconductor package 500 is similar to the semiconductor package 300 described with reference to FIG. 3, except that the underfill layer 141 is adjacent to the dielectric layer 118. The underfill layer 141 may be positioned between the die 302 and the dielectric layer 118 in an opening 502 defined by a dielectric layer 524 (otherwise similar to the dielectric layer 124 of FIG. 1). It would be understood by one of ordinary skill in the art that the package 200 of FIG. 2 may also support flip-chip bonding with a similar structure.

Figure 6:
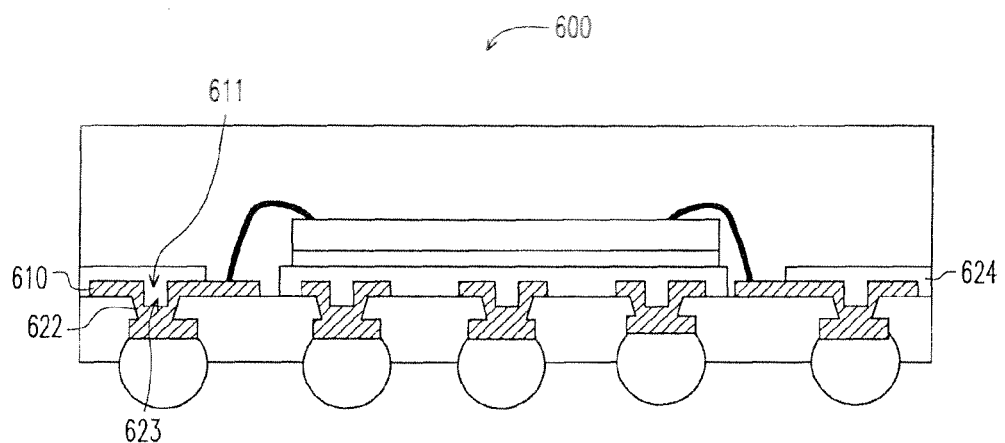
FIG. 6 illustrates a cross section view of a semiconductor package, according to an embodiment of the invention.

FIG. 6 illustrates a cross section view of a semiconductor package 600, according to an embodiment of the invention. The semiconductor package 600 is similar to the semiconductor package 100 described with reference to FIG. 1, except that a patterned conductive layer 610 defines an opening 611 that is substantially filled by a part of a dielectric layer 624, and one or more conductive posts 622 each define a cavity 623 that is substantially filled by a part of the dielectric layer 624. The patterned conductive layer 610, the dielectric layer 624, and the conductive posts 622 are otherwise similar to the patterned conductive layer 110, the dielectric layer 124, and the conductive posts 122 of FIG. 1, respectively.

Figure 7:
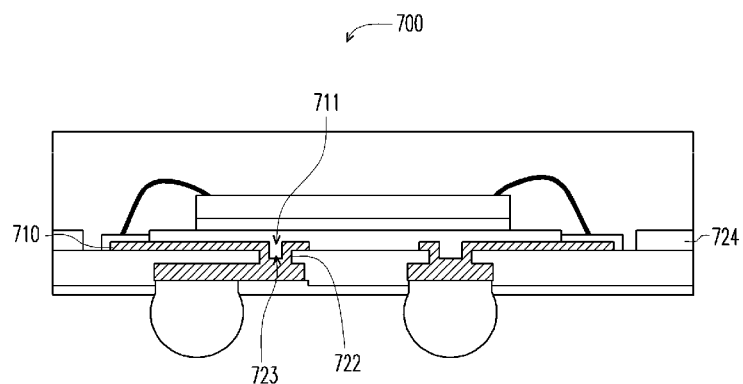
FIG. 7 illustrates a cross section view of a semiconductor package, according to an embodiment of the invention.

FIG. 7 illustrates a cross section view of a semiconductor package 700, according to an embodiment of the invention. The semiconductor package 700 is similar to the semiconductor package 200 described with reference to FIG. 2, except that a patterned conductive layer 710 defines an opening 711 that is substantially filled by a part of a dielectric layer 724, and one or more conductive posts 722 each define a cavity 723 that is substantially filled by a part of the dielectric layer 724. The patterned conductive layer 710, the dielectric layer 724, and the conductive posts 722 are otherwise similar to the patterned conductive layer 210, the dielectric layer 124, and the conductive posts 222 of FIGS. 1 and 2, respectively.

Figure 8:
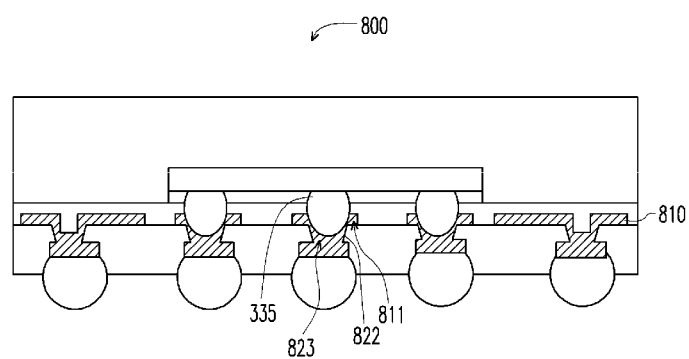
FIG. 8 illustrates a cross section view of a semiconductor package, according to an embodiment of the invention.

FIG. 8 illustrates a cross section view of a semiconductor package 800, according to an embodiment of the invention. The semiconductor package 800 is similar to the semiconductor package 300 described with reference to FIG. 3, except that a patterned conductive layer 810 defines an opening 811 that is substantially filled by the fused conductive bump 335, and one or more conductive posts 822 each define a cavity 823 that is substantially filled by the fused conductive bump 335. The patterned conductive layer 810, and the conductive posts 822 are otherwise similar to the patterned conductive layer 110 and the conductive posts 122 of FIG. 1. It would be understood by one of ordinary skill in the art that the package 200 of FIG. 2 may also support flip-chip bonding with a similar structure.

Figure 9:
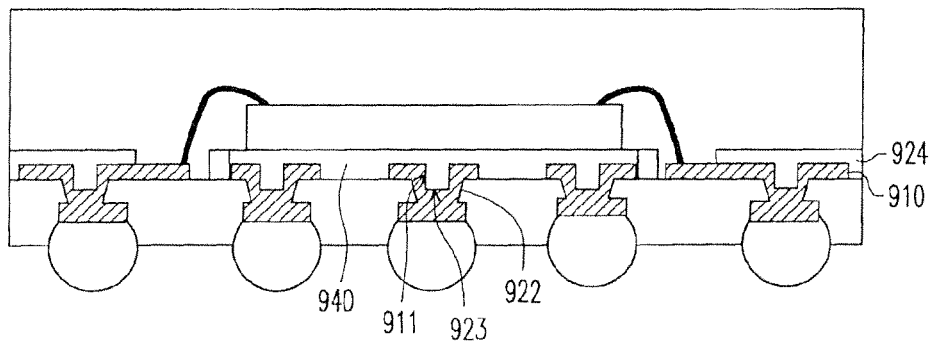
FIG. 9 illustrates a cross section view of a semiconductor package, according to an embodiment of the invention.

FIG. 9 illustrates a cross section view of a semiconductor package 900, according to an embodiment of the invention. The semiconductor package 900 is similar to the semiconductor package 400 described with reference to FIG. 4, except that a patterned conductive layer 910 defines an opening 911 that is substantially filled by an die attach layer 940, and one or more conductive posts 922 each define a cavity 923 that is substantially filled by the die attach layer 940. The patterned conductive layer 910, the conductive posts 922, and the die attach layer 940 are otherwise similar to the patterned conductive layer 110, the conductive posts 122, and the die attach layer 140 of FIG. 1. It would be understood by one of ordinary skill in the art that the package 200 of FIG. 2 may also support a similar structure.

Figure 10:
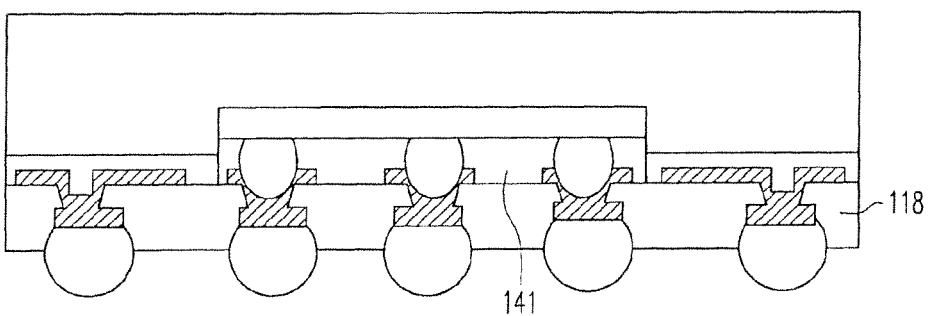
FIG. 10 illustrates a cross section view of a semiconductor package, according to an embodiment of the invention.

FIG. 10 illustrates a cross section view of a semiconductor package 1000, according to an embodiment of the invention. The semiconductor package 1000 is similar to the semiconductor package 800 described with reference to FIG. 8, except that the underfill layer 141 is adjacent to the dielectric layer 118. It would be understood by one of ordinary skill in the art that the package 200 of FIG. 2 may also support flip-chip bonding with a similar structure.

Figure 11A:
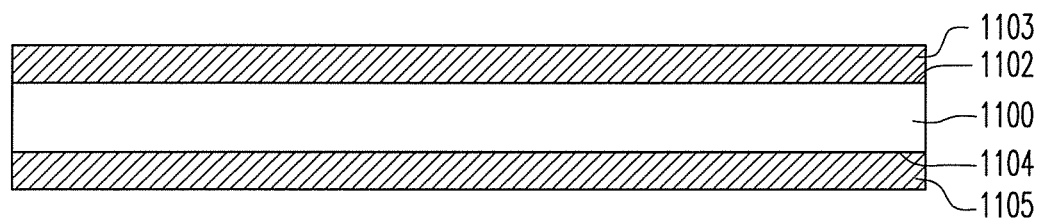
FIG. 11A through FIG. 11Y illustrate a method of manufacturing a semiconductor package, according to an embodiment of the invention.
Figure 11B:
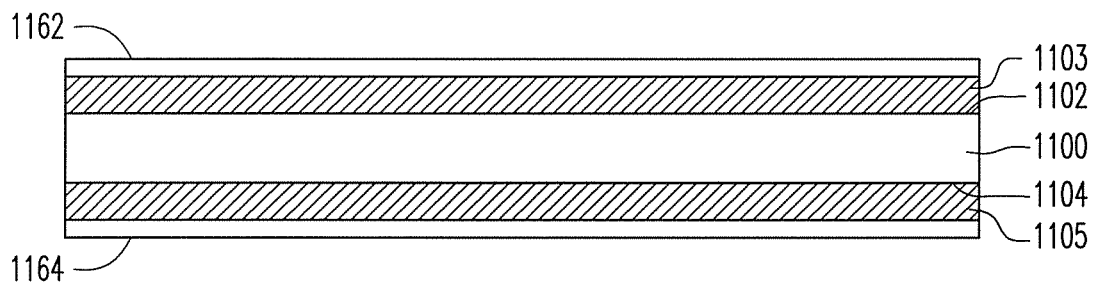
Figure 11C:
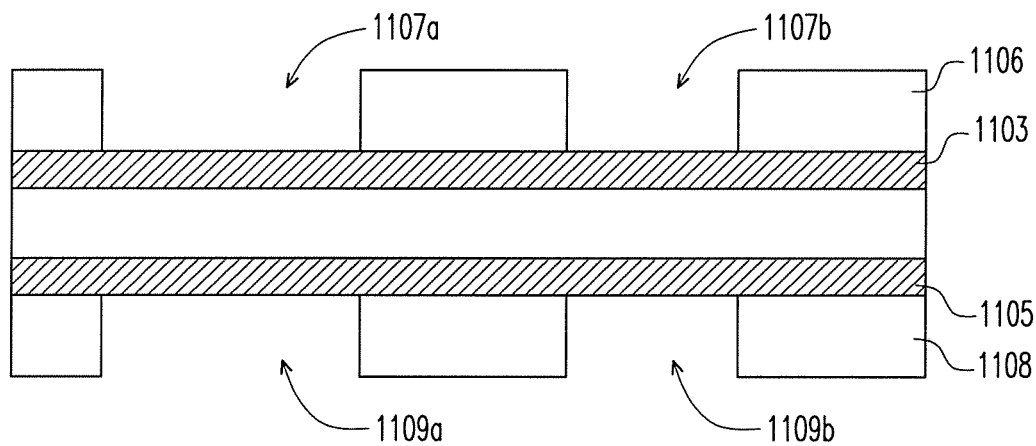
Figure 11D:
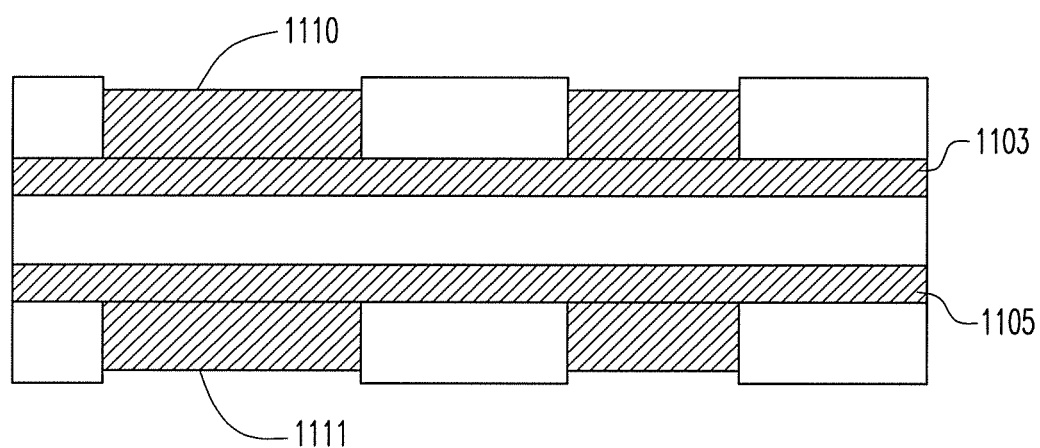
Figure 11E:
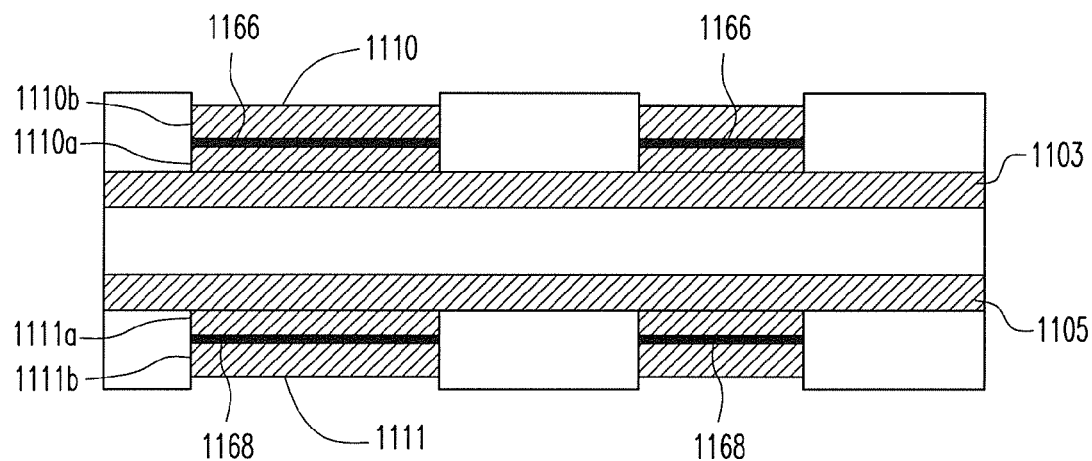
Figure 11F:
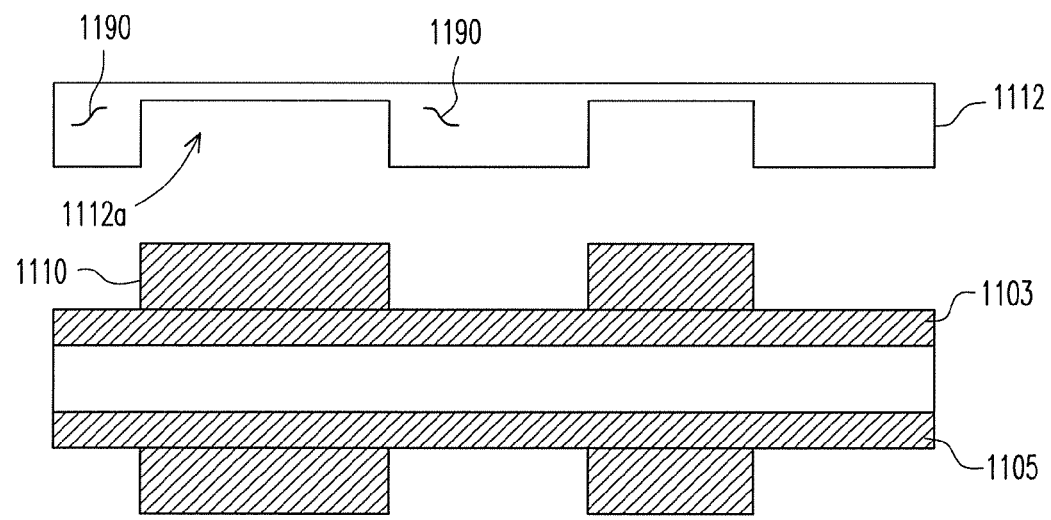
Figure 11G:
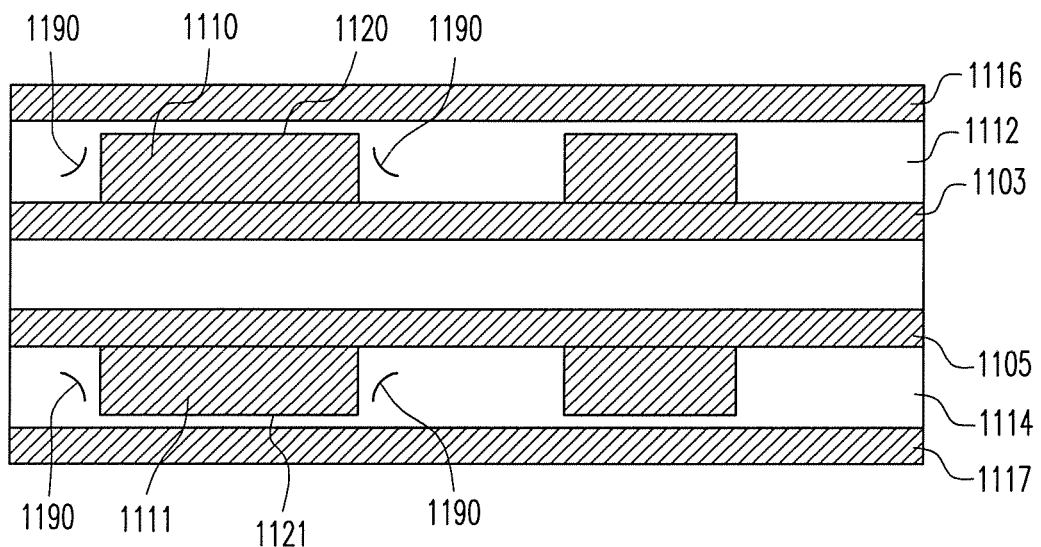
Figure 11H:
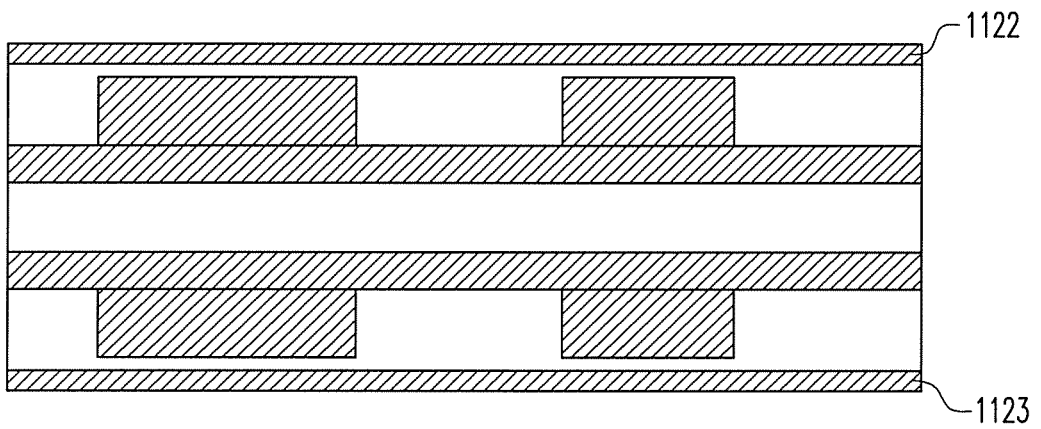
Figure 11I:
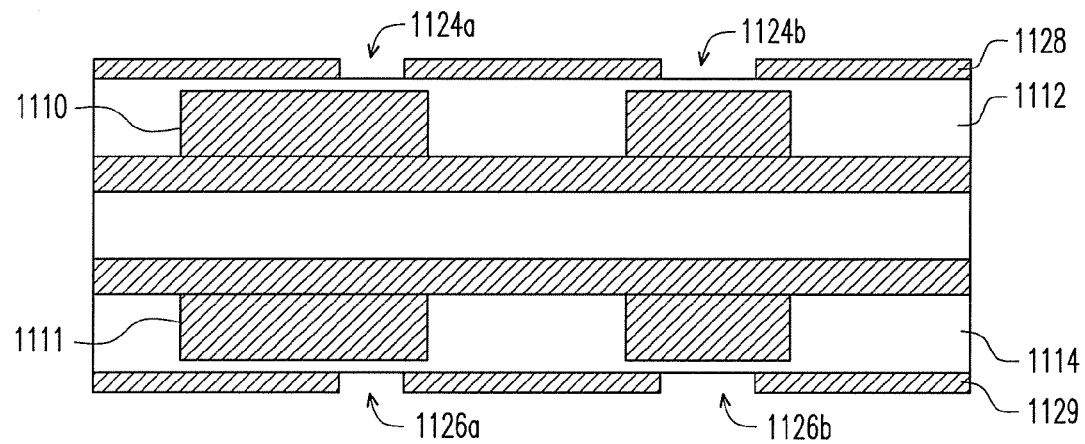
Figure 11J:
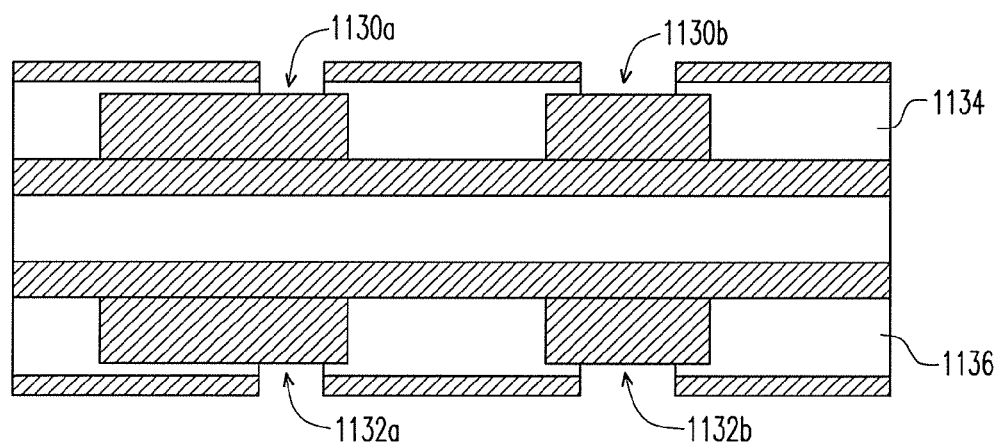
Figure 11K:
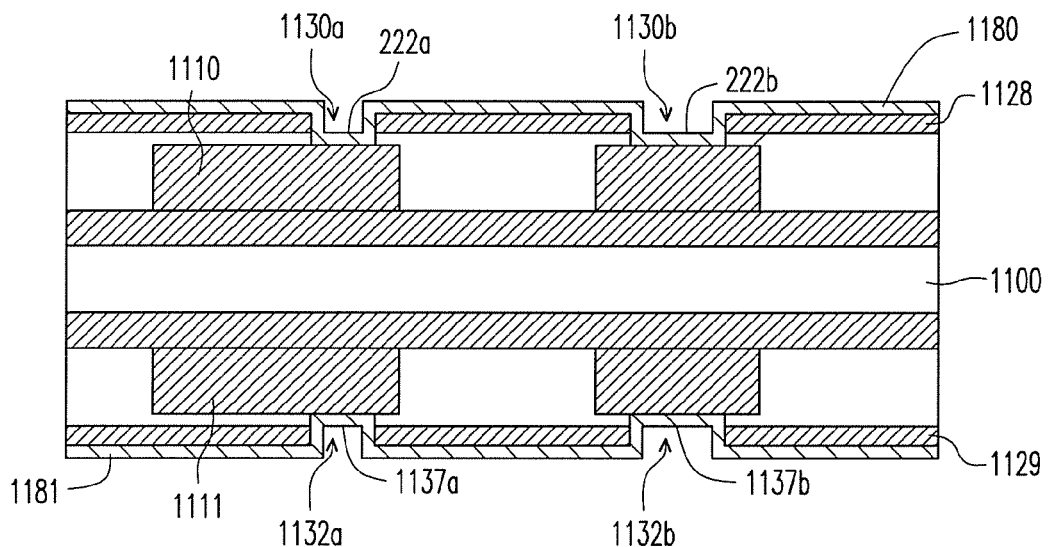
Figure 11L:
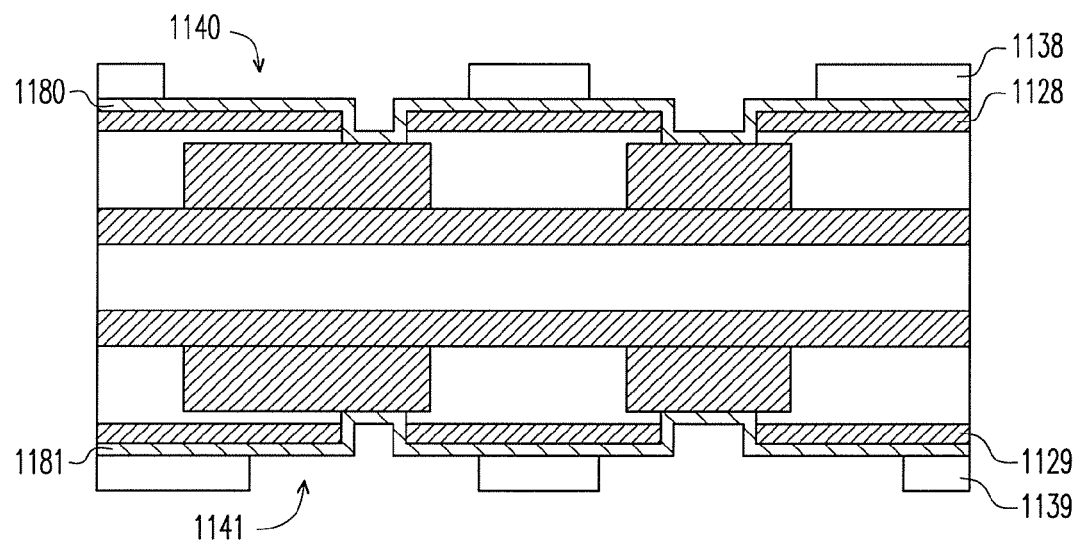
Figure 11M:
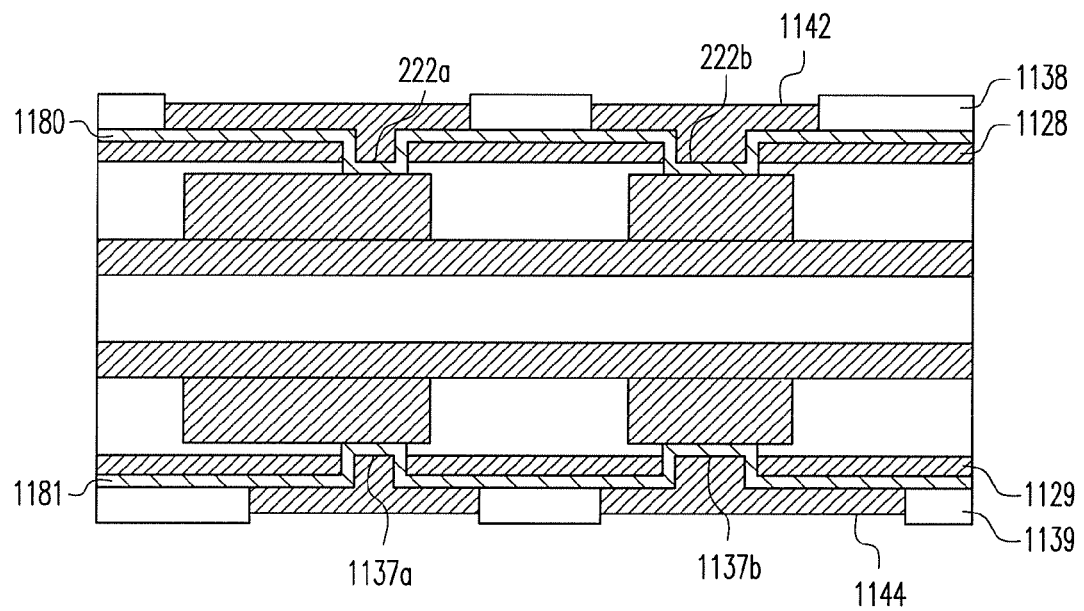
Figure 11N:
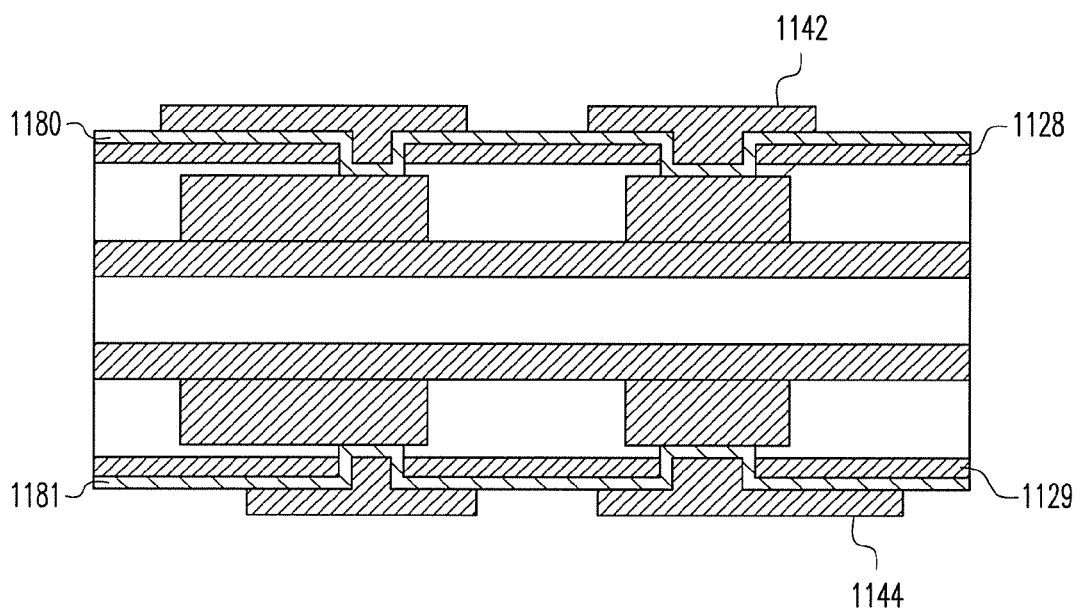
Figure 11O:
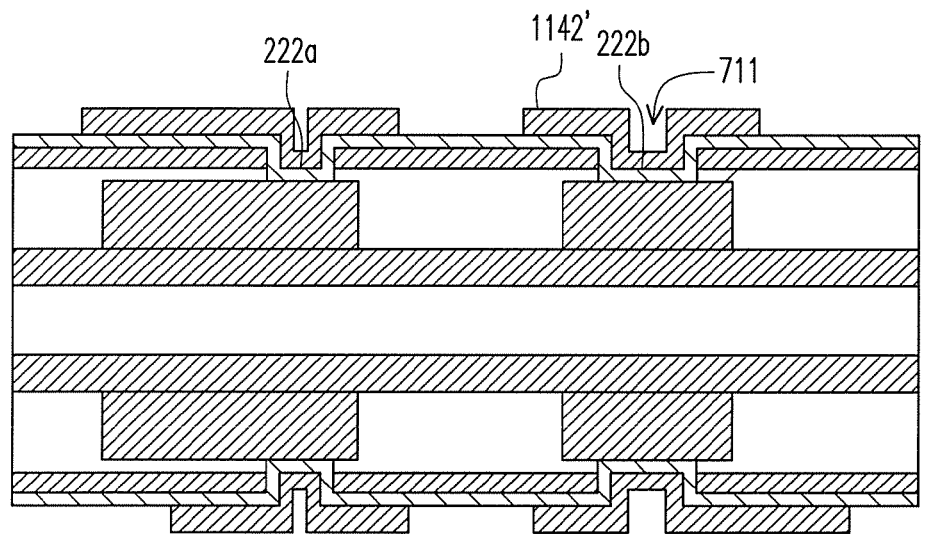
Figure 11P:
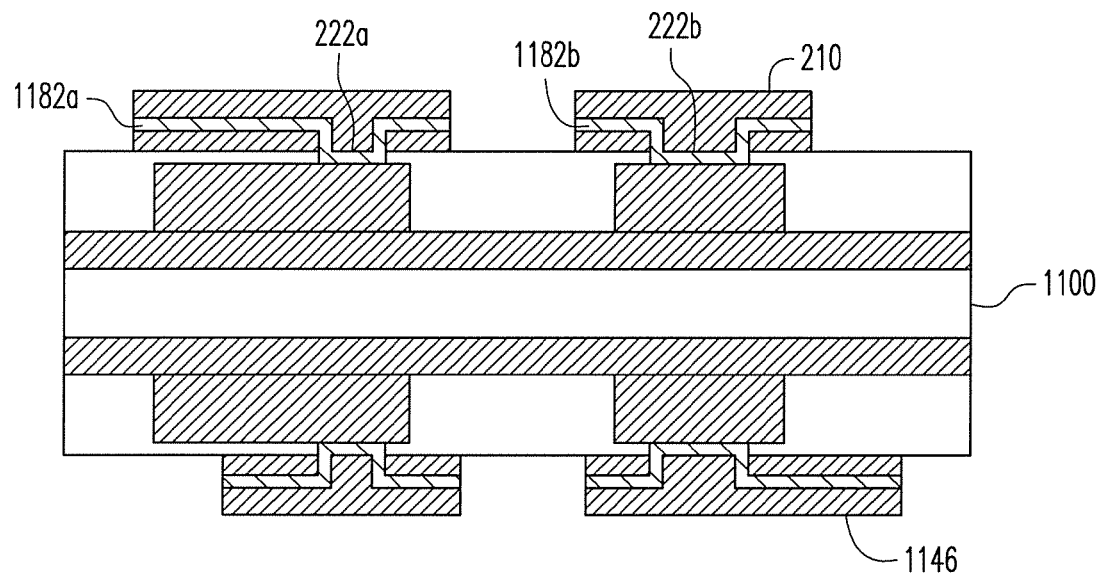
Figure 11Q:
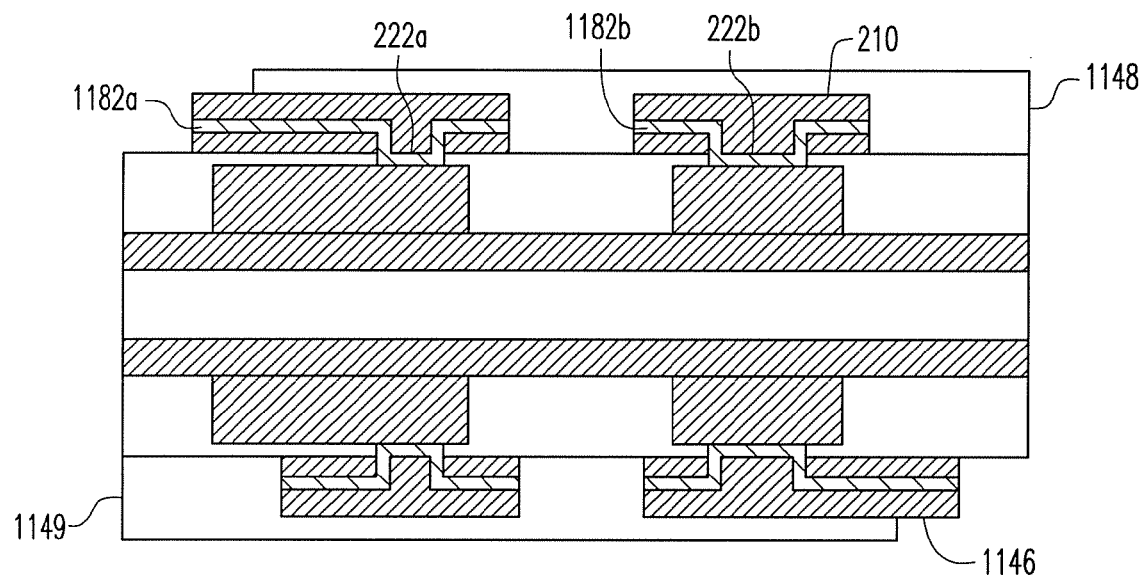
Figure 11R:
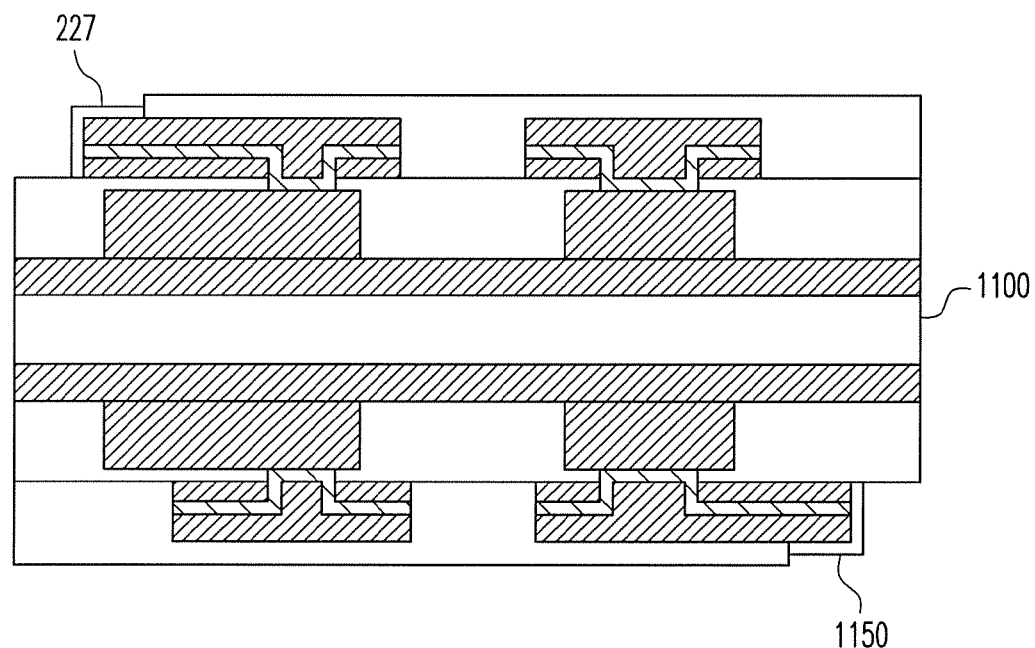
Figure 11S:
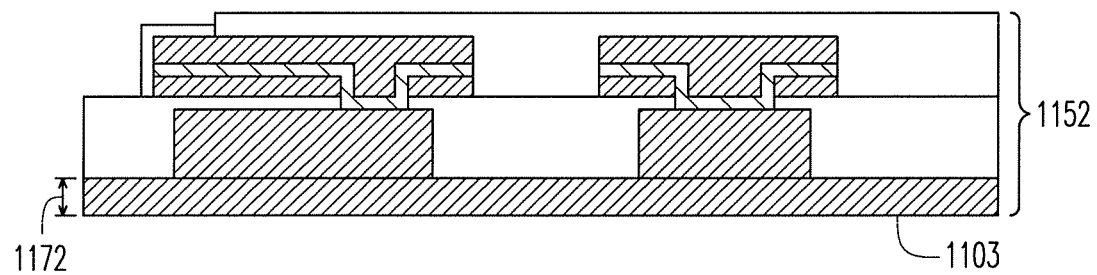
Figure 11T:
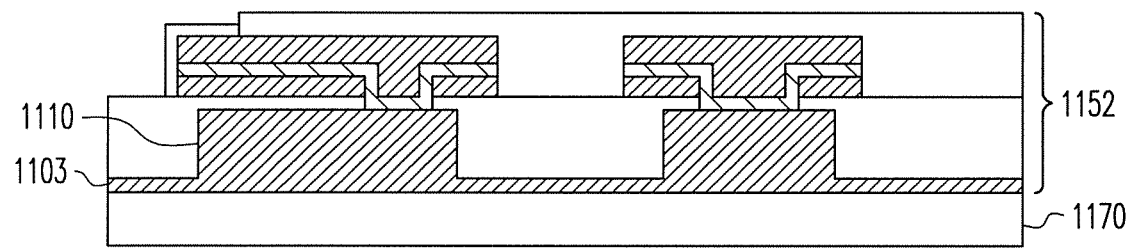
Figure 11U:
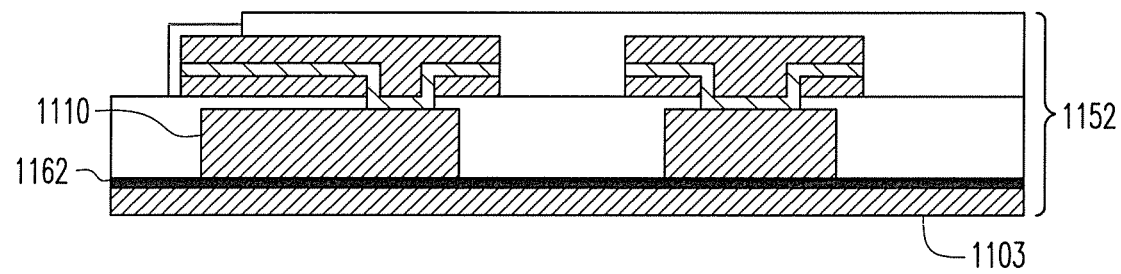
Figure 11V:
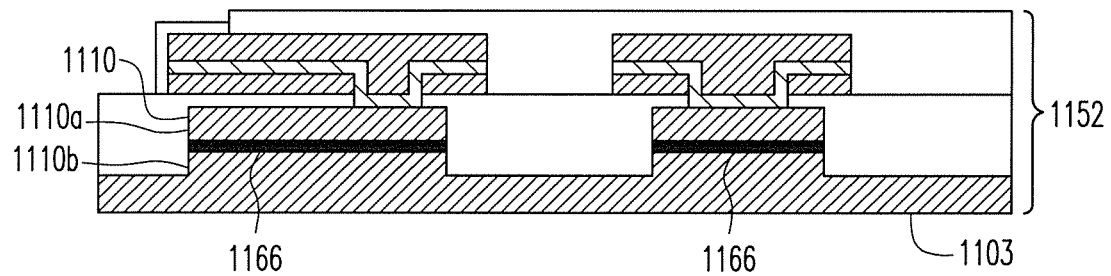
Figure 11W:
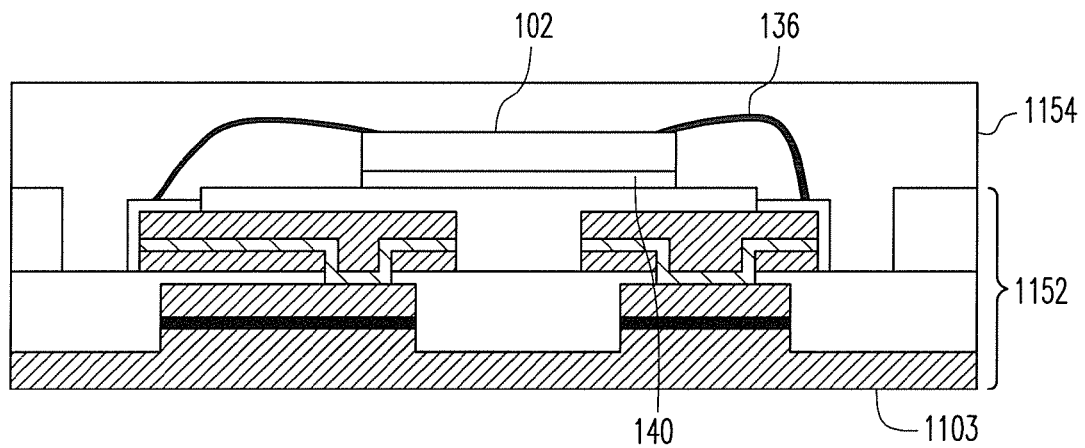
Figure 11X:
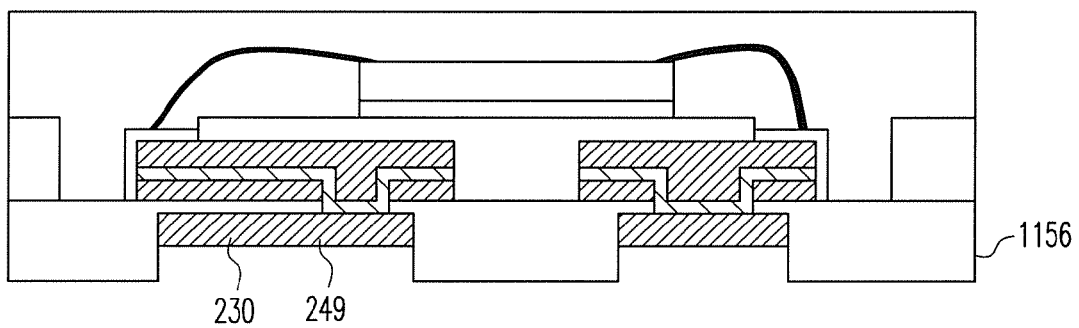
Figure 11Y:
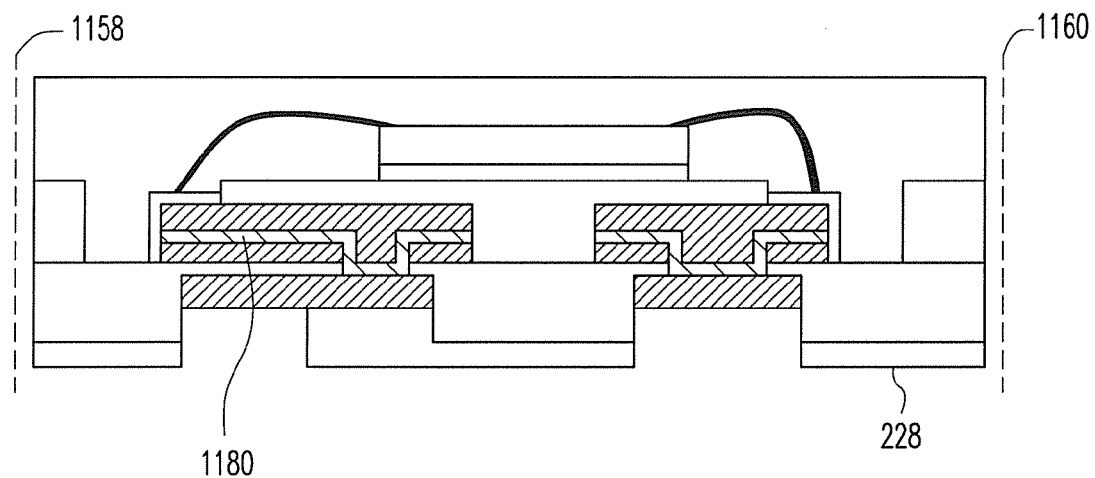

FIGS. 11A through 11Y illustrate a method of manufacturing a semiconductor package, according to an embodiment of the invention. For ease of presentation, the following manufacturing operations are described with reference to the package 200 of FIG. 2. However, it is contemplated that the manufacturing operations can be similarly carried out to form other semiconductor packages that may have different internal structure from the package 200, such as the packages illustrated in FIGS. 1, 3-10, and 12. It is also contemplated that the manufacturing operations can be carried out to form a substrate strip including an array of connected semiconductor packages, each of which may correspond to a package such as those illustrated in FIGS. 1, 3-10, and 12. As described in FIG. 11Y, the array of connected semiconductor packages may be singulated into individual packages such as those illustrated in FIGS. 1-10 and 12.

Referring to FIG. 11A, a carrier 1100 is provided. In one embodiment, the carrier 1100 includes a core layer (not shown) between two carrier conductive layers (not shown) attached to the core layer. Each carrier conductive layer may be formed from a metal, a metal alloy, a matrix with a metal or a metal alloy dispersed therein, or another suitable electrically conductive material. For example, each carrier conductive layer may include a metal foil formed from copper or an alloy including copper. The metal foil may have a thickness in the range from about 10 µm to about 30 µm, such as in the range from about 15 µm to about 25 µm.

The carrier 1100 has an upper surface 1102 and a lower surface 1104. A conductive layer 1103 (conductive sheet 1103) is disposed adjacent to the upper surface 1102, and a conductive layer 1105 (conductive sheet 1105) is disposed adjacent to the lower surface 1104. Each of the conductive layer 1103 and the conductive layer 1105 may be formed from a metal, a metal alloy, a matrix with a metal or a metal alloy dispersed therein, or another suitable electrically conductive material. For example, the conductive layers 1103 and 1105 may include a releasable metal foil formed from copper or an alloy including copper. The conductive layers 1103 and 1105 may be attached to the carrier 1100 by a release layer (not shown). In one embodiment, the release layer is an adhesive layer that may be organic or inorganic, such as tape. The tape, which can be implemented as a single-sided or double-sided adhesive tape, secures components at an appropriate spacing with respect to one another, and allows subsequent manufacturing operations to be carried out with those components disposed adjacent to the carrier 1100. Each of the conductive layer 1103 and the conductive layer 1105 may have a thickness in the range from about 2 µm to about 20 µm, such as in the range from about 3 µm to about 5 µm, from about 3 µm to about 10 µm, from about 10 µm to about 20 µm, and from about 15 µm to about 20 µm.

As illustrated in FIG. 11B, in one embodiment a barrier layer 1162 may optionally be disposed adjacent to the conductive layer 1103 such that the conductive layer 1103 is between the carrier 1100 and the barrier layer 1162. Similarly, a barrier layer 1164 may optionally be disposed adjacent to the conductive layer 1105 such that the conductive layer 1105 is between the carrier 1100 and the barrier layer 1164. The barrier layers 1162 and 1164 may serve as etch stop layers. Each barrier layer may be formed from a metal, a metal alloy, a matrix with a metal or a metal alloy dispersed therein, or another suitable electrically conductive material. For example, each barrier layer may be formed from tantalum, tungsten, chromium, nickel, gold, tin, lead, and/or suitable alloys including at least one of these materials. In one embodiment, the barrier layer may include a nickel sublayer and an adjacent gold sublayer, or a gold sublayer and an adjacent nickel sublayer. In another embodiment, the barrier layer may be formed from a tin-lead alloy and/or a tin-silver alloy. Each barrier layer may be formed by a sputtering process, an immersion process, a plating process, and/or other suitable methods known in the art. In embodiments in which the barrier layers 1162 and 1164 are used, these barrier layers are present until being removed in FIG. 11X, as described below.

As illustrated in FIG. 11C, a photoresist material may be formed adjacent to the conductive layers 1103 and 1105. Alternatively, the photoresist material may be formed adjacent to the barrier layers 1162 and 1164 (see FIG. 11B). The photoresist material may be a dry film photoresist, or another type of patternable layer or dielectric layer. The photoresist layers 1106 and 1108 may be formed by coating, printing, or any other suitable technique. Predetermined or selected portions of the photoresist layers 1106 and 1108 may be photo-imaged and developed so as to create openings, including openings 1107a-1107b exposing the conductive layer 1103, and openings 1109a-1109b exposing the conductive layer 1105. The photoresist layers 1106 and 1108 may be photo-chemically defined using a photomask (not shown). Photo-imaging and developing may have advantages of lower cost and decreased process time as compared to other approaches for creating openings in the photoresist layers 1106 and 1108. The resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

As illustrated in FIG. 11D, an electrically conductive material is applied into the openings, including the openings 1107a-1107b defined by the photoresist layer 1106 and the openings 1109a-1109b defined by the photoresist layer 1108 to form conductive blocks 1110 extending vertically from the conductive layer 1103, and conductive blocks 1111 extending vertically from the conductive layer 1105. Alternatively, the conductive blocks 1110 may extend vertically from the barrier layer 1162 (see FIG. 11B), and the conductive blocks 1111 may extend vertically from the barrier layer 1164 (see FIG. 11B). The conductive blocks 1110 and 1111 may be formed from a metal, a metal alloy, a matrix with a metal or a metal alloy dispersed therein, or another suitable electrically conductive material. For example, the conductive blocks 1110 and 1111 may include one or more layers of copper or an alloy including copper. The conductive blocks 1110 and 1111 may be formed using any of a number of coating techniques, such as chemical vapor deposition, electroless plating, electrolytic plating, printing, spinning, spraying, sputtering, or vacuum deposition.

As illustrated in FIG. 11E, at least one of barrier layers 1166 and 1168 may be formed instead of the barrier layers 1162 and/or 1164 described previously with reference to FIG. 11B. The barrier layers 1166 and 1168 may serve as etch stop layers. A first portion 1110a of the conductive block 1110 may be formed. The barrier layer 1166 may then be disposed adjacent to the first portion 1110a by a sputtering process, an immersion process, a plating process, and/or other suitable methods known in the art. A second portion 1110b of the conductive block 1110 may then be formed adjacent to the barrier layer 1166, such that the barrier layer 1166 is between the first portion 1110a and the second portion 1110b. The barrier layer 1168 may be formed in a similar manner between a first portion 1111a and a second portion 1111b of the conductive block 1111. The barrier layers 1166 and 1168 may be formed from similar materials to those used to form the barrier layers 1162 and 1164, as previously described with reference to FIG. 11B.

As illustrated in FIG. 11F, the photoresist layers 1106 and 1108 are stripped to expose the conductive layers 1103 and 1105. Then, a layer 1112 is provided. In one embodiment, the layer 1112 is pre-formed with a set of first openings 1112a, and positions of the first openings 1112a respectively correspond to positions of the conductive blocks 1110. A similar layer 1114 (see FIG. 11G) may be provided with openings corresponding to positions of the conductive blocks 1111. In one embodiment, the layer 1112 includes a fiber-reinforced resin material, such as a prepreg material, including the fibers 1190 to strengthen the layer 1112. As shown in FIG. 11F, the fibers 1190 are initially oriented along a generally horizontal plane within the layer 1112. While the openings 1112a are shown in FIG. 11F as partially extending through the layer 1112, it is contemplated for some embodiments that the openings 1112a also can fully extend through the layer 1112.

As illustrated in FIG. 11G, the layer 1112 is formed adjacent to the conductive blocks 1110 and the exposed portions of the conductive layer 1103. In one embodiment, the layer 1112 corresponds to and includes the dielectric layer 218 shown in FIG. 2. Similarly, the layer 1114 is formed adjacent to the conductive blocks 1111 and the exposed portions of the conductive layer 1105. The layers 1112 and 114 substantially cover the conductive layers 1103 and 1105, respectively, such that the conductive layers 1103 and 1105 are embedded in the layers 1112 and 1114, respectively. In one embodiment, the layer 1112 may be formed by laminating a dielectric material on an upper surface 1120 of each of the conductive blocks 1110 and the exposed portions of the conductive layer 1103. Similarly, the layer 1114 may be formed by laminating a dielectric material on an upper surface 1121 (inverted for manufacturing operations) of each of the conductive blocks 1111 and the exposed portions of the conductive layer 1105. In one embodiment, the fibers 1190 subsequent to lamination of the layers 1112 and 1114 are re-oriented, with portions adjacent to the conductive blocks 1110 and 1111 being pushed along a vertically extending direction of the conductive blocks 1110 and 1111, and away from the conductive layers 1103 and 1105, respectively.

The laminated dielectric material may be made of a fiber-reinforced resin material and/or prepreg (PP) for increased rigidity. The fibers may be glass fibers or Kevlar fibers (aramid fibers). The laminated dielectric material may be formed from a film reinforced with fibers to strengthen the dielectric material. Examples of resin materials that may be reinforced by fibers for use in the laminated dielectric material include Ajinomoto build-up film (ABF), bismaleimide triazine (BT), prepreg, polyimide (PI), liquid crystal polymer (LCP), epoxy, and other resin materials. The resin material may be partially cured. In one embodiment, the laminated dielectric material is preformed to define openings at locations corresponding to the conductive blocks 1110, or the conductive blocks 1111.

Alternatively, the layers 1112 and 1114 may be formed of an unreinforced, less rigid material, such as solder mask (solder resist), resin materials including but not limited to Ajinomoto build-up film (ABF), bismaleimide triazine (BT), prepreg, polyimide (PI), liquid crystal polymer (LCP), and epoxy, or another type of patternable layer or dielectric layer. This material may be applied using any of a number of coating techniques, such as printing, spinning, or spraying.

The layers 1112 and 1114 are then covered by conductive layers 1116 and 1117, respectively. The conductive layers 1116 and 1117 may be formed from similar materials to those used to form the conductive layers 1103 and 1105. Each of the conductive layers 1116 and 1117 may have a thickness in the range from about 10 μm to about 20 μm, such as in the range from about 10 μm to about 15 μm.

As illustrated in FIG. 11H, a portion of each of the conductive layers 1116 and 1117 is removed, such as by flash etching, to form conductive layers 1122 and 1123. Each of the conductive layers 1122 and 1123 may have a thickness in the range from about 3 μm to about 10 μm, such as in the range from about 3 μm to about 7 μm.

As illustrated in FIG. 11I, openings 1124a and 1124b exposing the layer 1112 are formed in the conductive layer 1122 to form a conductive layer 1128. Similarly, openings 1126a and 1126b exposing the layer 1114 are formed in the conductive layer 1123 to form a conductive layer 1129. It is contemplated that the openings 1124 and 1126 may have smaller widths than those of the conductive blocks 1110 and 1111, respectively. Alternatively, the openings 1124 and 1126 may have widths substantially equal to those of the conductive blocks 1110 and 1111, respectively. In one embodiment, portions (not shown) of the conductive layers 1128 and 1129 may be patterned to form at least a portion of a ground plane 1250 (see FIGS. 12 and 13). Patterning to form the layers 1128 and 1129 can be carried out in any of a number of ways, such as chemical etching, laser drilling, or mechanical drilling, and the resulting openings can have any of a number of shapes, such as a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

As illustrated in FIG. 11J, openings 1130a and 1130b exposing the conductive blocks 1110 are formed in the layer 1112 to form a layer 1134. Similarly, openings 1132a and 1132b exposing the conductive blocks 1111 are formed in the layer 1114 to form a layer 1136. It is contemplated that the openings 1130 and 1132 are of sizes corresponding to those of the openings 1124 and 1126, respectively (see FIG. 11I). In one embodiment, portions (not shown) of the layers 1112 and 1114 may be patterned to expose conductive blocks positioned below the ground plane 1250 (see FIGS. 12 and 13). Patterning to form the layers 1134 and 1136 can be carried out in any of a number of ways, such as laser drilling, plasma etching, or plasma cleaning, and the resulting openings can have any of a number of shapes, such as a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured. In one embodiment, one or more of the openings 1130 and 1132 (such as the openings 1130b and 1132b in FIG. 11J) may be substantially centered relative to corresponding ones of the conductive blocks 1110 and 1111, respectively. Alternatively or in addition, one or more of the openings 1130 and 1132 (such as the openings 1130a and 1130b in FIG. 11J) may be substantially off-center relative to corresponding ones of the conductive blocks 1110 and 1111, respectively.

As illustrated in FIG. 11K, a metallic material is disposed adjacent to the conductive layer 1128 and the conductive blocks 1110 to form a seed layer 1180. A similar seed layer 1181 is disposed adjacent to the conductive layer 1129 and the conductive blocks 1111. In one embodiment, the seed layer 1180 may substantially fill the openings 1130 such that portions of the seed layer 1180 form conductive posts, such as the conductive posts 222a and 222b of FIG. 2. Similarly, the seed layer 1181 may substantially fill the openings 1132 such that portions of the seed layer 1181 form conductive posts, such as conductive posts 1137a and 1137b. (The conductive posts 1137a and 1137b correspond to a separate semiconductor package and are shown on the opposite side of the carrier 1100.) Alternatively, the seed layer 1180 may partially fill the openings 1130 such that portions of the seed layer 1180 form a first portion of the conductive posts 222a and 222b of FIG. 2. The seed layer 1181 may partially fill the openings 1132 such that portions of the seed layer 1181 form a first portion of the conductive posts 1137a and 1137b. In one embodiment, conductive posts (not shown) may be formed between the ground plane 1250 (see FIGS. 12 and 13) and conductive blocks positioned below the ground plane 1250. The metallic material may have similar characteristics to the material used to form the conductive blocks 1110 and 1111, such as copper or an alloy of copper. The seed layers 1180 and 1181 may be formed using any of a number of coating techniques, such as electroless plating.

In one embodiment, the off-center positioning of the conductive post 222a relative to the conductive block 1110 corresponds to the lateral displacement of the second contact pad 230a relative to the conductive post 222a shown in FIG. 2. The centered positioning of the conductive post 222b relative to the conductive block 1111 corresponds to the centered positioning of the conductive post 222b relative to the second contact pad 230b shown in FIG. 2.

As illustrated in FIG. 11L, photoresist layers 1138 and 1139 may be formed adjacent to the seed layers 1180 and 1181, respectively. Predetermined or selected portions of the photoresist layers 1138 and 1139 may be photoimaged and developed so as to create openings 1140 and 1141, respectively. The openings 1140 expose the seed layer 1180, and the openings 1141 expose the seed layer 1181. The photoresist layers 1138 and 1139 (and the openings 1140 and 1141) have similar characteristics and are formed similarly to the photoresist layers 1106 and 1108 (and the openings 1107 and 1109) described with reference to FIG. 11C.

As illustrated in FIG. 11M, a metallic material is disposed adjacent to portions of the seed layers 1180 and 1181 not covered by the photoresist layers 1138 and 1139 to form the conductive layers 1142 and 1144. In one embodiment, the conductive layers 1142 and 1144 are adjacent to the conductive posts 222 and 1137, respectively. Alternatively, portions of the conductive layers 1142 and 1144 may form second portions of the conductive posts 222 and 1137, respectively. These second portions of the conductive posts 222 and 1137 are adjacent to the first portions of the conductive posts 222 and 1137 previously described with reference to FIG. 11K. The metallic material may have similar characteristics to the material used to form the conductive blocks 1110 and 1111, such as copper or an alloy of copper. The conductive posts 222 and 1137, and the conductive layers 1142 and 1144, may be formed using any of a number of coating techniques, such as electrolytic plating.

As illustrated in FIG. 11N, the photoresist layers 1138 and 1139 are stripped to expose additional portions of the seed layers 1180 and 1181.

In one embodiment, additional photoresist may be disposed adjacent to the conductive layer 1142, where the photoresist defines openings corresponding to the locations of the openings 711 in the package 700 of FIG. 7. A portion of the conductive layer 1142 may be removed to form the openings 711. In addition, a portion of each of the conductive posts 222 may be removed to form the cavities 723 (see FIG. 7). The removal of these portions of the conductive layer 1142 may be done through chemical etching, laser drilling, or mechanical drilling. The openings 711 and the cavities 723 (see FIG. 7) have similar characteristics to those previously described for the openings 1124 and 1126 (see FIG. 11I). Then, the additional photoresist may be removed to expose conductive layer 1142', as shown in FIG. 11O.

As illustrated, FIGS. 11P through 11Y follow FIG. 11N, though it would be understood by one of ordinary skill in the art that similar steps can follow FIG. 11O.

As illustrated in FIG. 11P, a portion of each of the conductive layers 1128 and 1129 and a portion each of the seed layers 1180 and 1181 are removed, such as by flash etching, to form a patterned conductive layer similar to the patterned conductive layer 210 of FIG. 2. The patterned conductive layer 210 includes portions 1182a and 1182b of the seed layer 1180, and is disposed adjacent to the conductive posts 222. (A similar patterned conductive layer 1146 corresponding to a separate semiconductor package is shown on the opposite side of the carrier 1100.) In one embodiment, the patterned conductive layer may be similar to the patterned conductive layer 1210 of FIG. 12, which includes the ground plane 1250 (see FIGS. 12 and 13).

As illustrated in FIG. 11Q, dielectric layers 1148 and 1149 are formed to cover portions of the patterned conductive layers 210 and 1146, respectively. The dielectric layer 1148 exposes a portion of the patterned conductive layer 210 including the second contact pad 226. The dielectric layers 1148 and 1149 may be formed from solder resist (solder mask), or another type of dielectric material.

As illustrated in FIG. 11R, remaining portions of the patterned conductive layers 210 and 1146 that are not covered with the dielectric layers 1148 and 1149, respectively, may be covered with a plating layer similar to the plating layer 227 of FIG. 2. (A similar plating layer 1150 corresponding to a separate semiconductor package is shown on the opposite side of the carrier 1100.) The plating layers 227 and 1150 may be formed from at least one of tin, nickel, and gold, or an alloy including tin or including nickel and gold.

As illustrated in FIG. 11S, the carrier 1100 is removed to expose the conductive layer 1103 of a substrate 1152. (The conductive layer 1105 of another substrate is also exposed by removal of the carrier 1100. This is not shown in FIG. 11S.) The substrate 1152 includes multiple adjacent substrate units similar to, for example, but not limited to, the substrate unit 104 of FIG. 1 or the substrate unit 204 of FIG. 2.

As described previously with reference to FIG. 11A, the conductive layer 1103 may have a thickness 1172 in the range from about 15 μm to about 20 μm. The conductive layer 1103 may be chemically etched to reduce the thickness 1172 of the conductive layer 1103 to be in the range from about 3 μm to about 10 μm, such as from about 3 μm to about 8 μm. The reason for etching the conductive layer 1103 is that a thickness in the range from about 3 μm to about 8 μm may be preferable for reducing warpage of the substrate 1152, and enhancing reliability of packages manufactured using the substrate 1152. Thicknesses of the conductive layer 1103 greater or smaller than this range may result in additional warpage of the substrate 1152.

As illustrated in FIG. 11T, in one embodiment a support member 1170 may optionally be disposed adjacent to the conductive layer 1103, such that the conductive layer 1103 is between the conductive blocks 1110 and the support member 1170. The attachment of the support member 1170 to the substrate 1152 may also be desirable to reduce warpage of the substrate 1152 during the time period between manufacturing of the substrate 1152 and assembly of packages including the substrate 1152 (see FIGS. 11W through 11Y), and thereby to enhance reliability of packages manufactured using the substrate 1152. In one embodiment, the support member may be formed from polyethylene terephthalate (PET), metal, epoxy, copper clad laminates (CCL), and/or other suitable materials known in the art.

As illustrated in FIG. 11U, the barrier layer 1162 previously described with reference to FIG. 11B is shown, optionally disposed between the conductive blocks 1110 and the conductive layer 1103.

As illustrated in FIG. 11V, the barrier layer 1166 previously described with reference to FIG. 11E is shown, optionally disposed between the first portion 1110*a* and the second portion 1110*b* of the conductive blocks 1110.

As illustrated in FIG. 11W, one or more dies 102 are electrically connected to the substrate 1152, and are electrically connected to the electrically conductive layer 1103. The die 102 may be electrically connected to the electrically conductive layer 1103 via the bonding wires 136. Alternatively, a die (such as the die 302 shown in FIGS. 3, 5, 8, and 10) may be electrically connected to the electrically conductive layer 1103 via flip chip bonding. The die 102 may be attached to the substrate 1152 by the die attach layer 140. A molded structure 1154 is formed to encapsulate the die 102. In one embodiment, the optional support member 1170 (see FIG. 11T) may be removed to expose the conductive layer 1103.

As illustrated in FIG. 11X, the electrically conductive layer 1103 can be removed, such as through chemical etching and/or flash etching, to expose a dielectric layer 1156. After removal of the electrically conductive layer 1103, a portion of the conductive blocks 1110 (see FIG. 11E) can be removed, such as through chemical etching, to form the second contact pads 230 and the traces 249 of FIG. 2. Advantageously, surfaces of the dielectric layer 1156 and the conductive blocks 1110 can be protected by the electrically conductive layer 1103 from exposure to environmental conditions. It can be desirable to extend the time duration of this protection by removing the electrically conductive layer 1103 after attaching and encapsulating the die 102. In one embodiment, the barrier layer 1162 and described with reference to FIG. 11B and/or the barrier layer 1166 described with reference to FIG. 11E can act as a safeguard to prevent over-etching of the conductive blocks 1110, so that the second contact pads 230 and the traces 249 are of at least a minimum desired thickness. In one embodiment, after the conductive layer 1103 is etched away, the barrier layer 1162 and/or the barrier layer 1166 may be selectively chemically etched using an etching solution that removes the barrier layer 1162 and/or the barrier layer 1166 without damaging the second contact pads 230, the traces 249, and the dielectric layer 1156.

As illustrated in FIG. 11Y, a dielectric layer including the dielectric layer 228 of FIG. 2 may be formed and patterned such that the dielectric layer 228 exposes the second contact pads 230. Singulation may then be performed along the dashed lines 1158 and 1160 to obtain individual semiconductor packages, such as the semiconductor package 200 of FIG. 2. Electrical contacts such as the electrical contacts 133 shown in FIG. 1 can be disposed on the second contact pads 230 either before or after singulation.

It will be understood by one of ordinary skill in the art that the patterned conductive layer 110 and the conductive posts 122 of FIG. 1, the patterned conductive layer 210 and the conductive posts 222 of FIG. 2, and the corresponding structures in the packages of FIGS. 3-10 may include portions of a seed layer, similar to the way that the seed layer 1180 is included in the package structure illustrated in FIG. 11Y.

Figure 12:
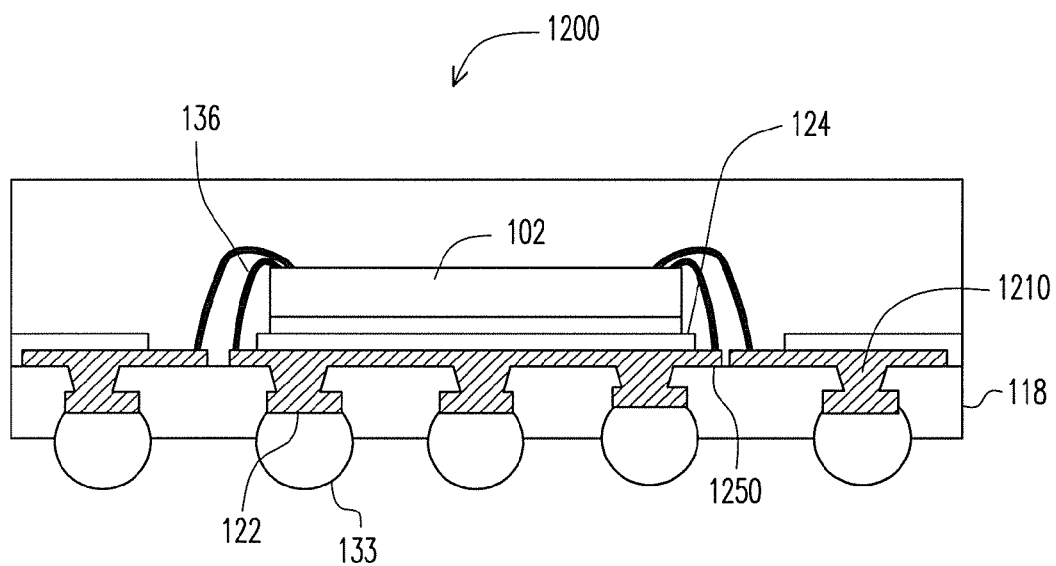
FIG. 12 illustrates a cross section view of a semiconductor package, according to an embodiment of the invention.

FIG. 12 illustrates a cross section view of a semiconductor package 1200, according to an embodiment of the invention. The semiconductor package 1200 is similar to the semiconductor package 100 described with reference to FIG. 1, except that the semiconductor package 1200 includes a ground plane 1250 positioned between the dielectric layer 124 and the dielectric layer 118. The ground plane 1250 is included in and formed from the same material as a patterned conductive layer 1210, which is formed similarly to the patterned conductive layer 110 of FIG. 1. The ground plane 1250 may serve the dual purpose of heat dissipation and providing the die 102 electrical connectivity to ground. The die 102 may be electrically connected to the ground plane 1250 by wires 136. The ground plane 1250 is electrically connected to external electrical contacts 133 through the conductive posts 122. Heat from the package 1200 can dissipate through the external electrical contacts 133 to, for example, an underlying printed circuit board. One or more of the external electrical contacts 133 may provide electrical connectivity to ground. Alternatively, the external contacts 133 may serve only a heat dissipation function. It would be understood by one of ordinary skill in the art that the packages of other wire-bonding embodiments described herein may also support a similar structure.

Figure 13:
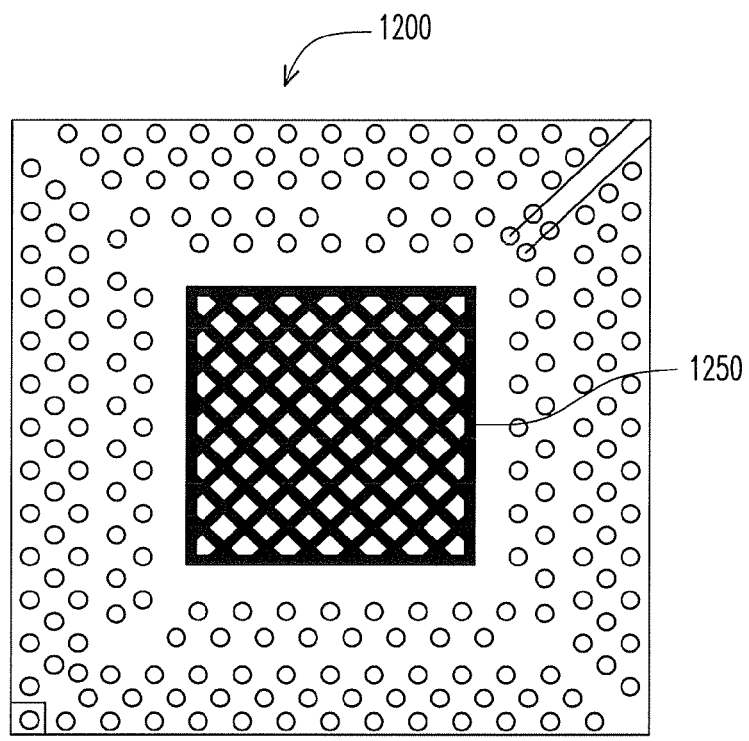
FIG. 13 illustrates a top cross section view of the semiconductor package of FIG. 12, according to an embodiment of the invention.

FIG. 13 illustrates a top cross section view of the semiconductor package 1200 of FIG. 12, according to an embodiment of the invention. This top cross section view shows the structure of the ground plane 1250. In one embodiment, the ground plane 1250 is in the form of a mesh that defines openings in a two-dimensional grid pattern, as shown in FIG. 13. The openings may be of substantially the same size, and may be substantially regularly spaced, as shown in FIG. 13. Alternatively, the openings may be of different sizes, and may be irregularly spaced (for example, in the case that some openings are larger and others are smaller). A mesh pattern for the ground plane 1250 may provide greater reliability than other patterns for the ground plane 1250 at the interface between the dielectric layer 124 (such as a solder mask layer) and the ground plane 1250.

Alternatively, the ground plane 1250 may also be a solid plane, a ring pattern, and/or a bar pattern. The ring pattern may include a single ring, or may include multiple rings with openings between the various rings. The multiple rings may be concentric rings of different sizes, and the rings may be substantially circular. The bar pattern may include multiple bars extending from a first side of the ground plane 1250 to an opposite second side of the ground plane 1250, and having openings between the bars. The bars may be substantially parallel. The bars may be of substantially the same length, or may be of different lengths.

While FIGS. 1 through 13 illustrate packages including a single sided substrate and a set of electrically conductive posts embedded within the single sided substrate, it is contemplated that a substrate in a semiconductor package, in general, can include multiple dielectric layers, each including an embedded set of electrically conductive posts (or, more generally, electrically conductive vias). A substrate including multiple dielectric layers can be desirable, for example, in packages with relatively complex circuitry to allow for flexibility in routing. Electrically conductive posts can be used so as to effectively reduce package size and package area, while controlling the cost and complexity of packaging processes. In some embodiments, multiple dielectric layers embedding respective electrically conductive posts can be included to cope with a variety of contact distributions and to enhance structural rigidity and reliability of the substrate.

Figure 14A:
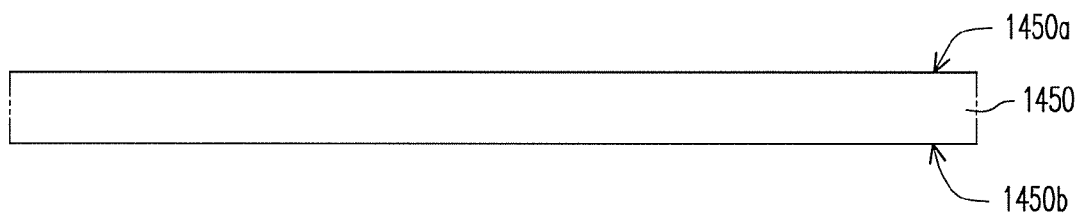
FIG. 14A through FIG. 14U illustrate a method of manufacturing a substrate for a semiconductor package, according to embodiments of the invention.
Figure 14B:
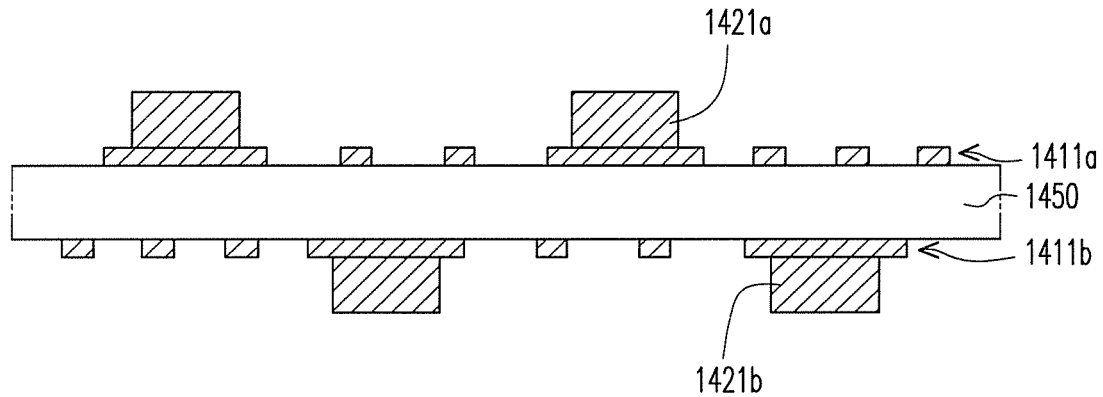
Figure 14C:
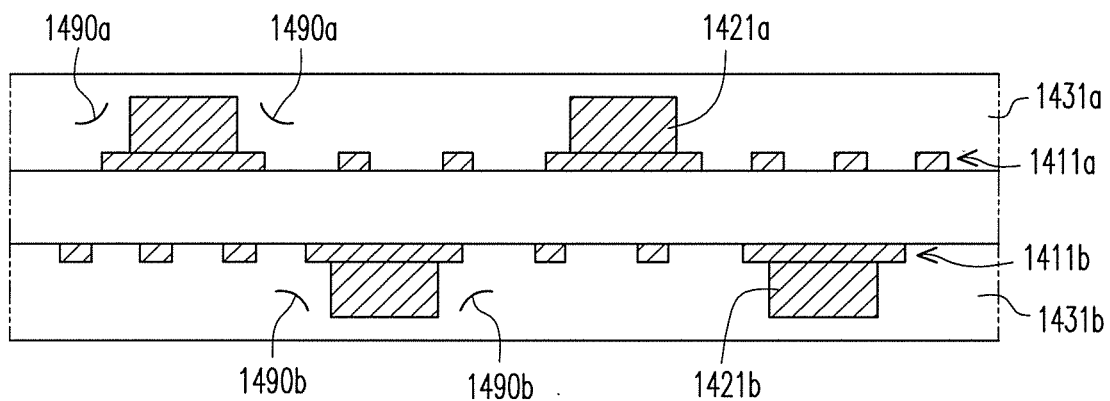
Figure 14D:
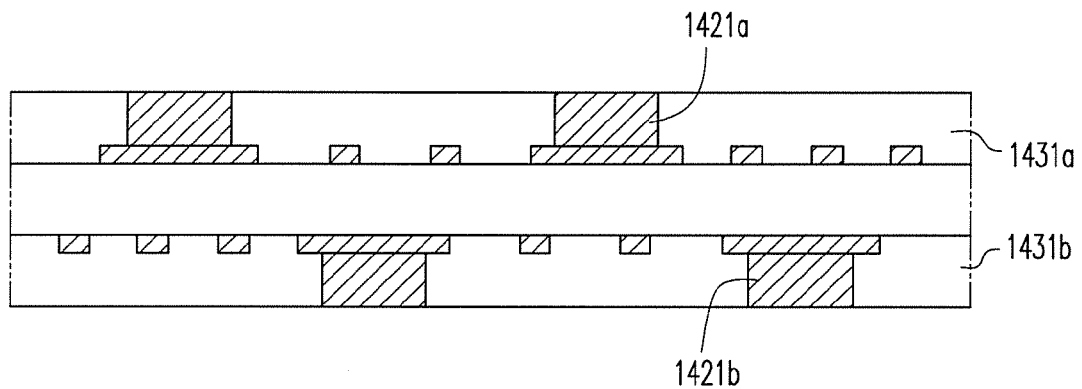
Figure 14E:
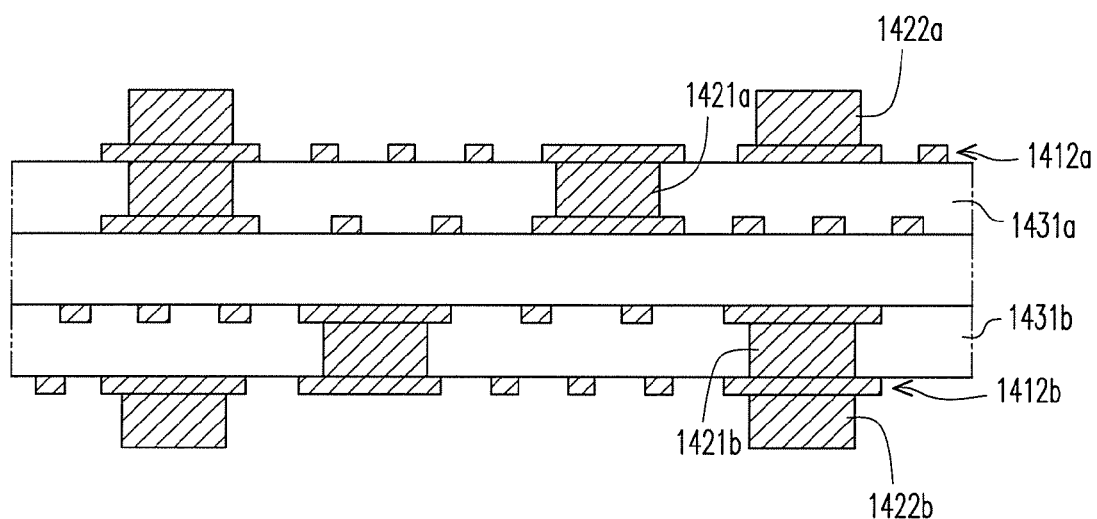
Figure 14F:
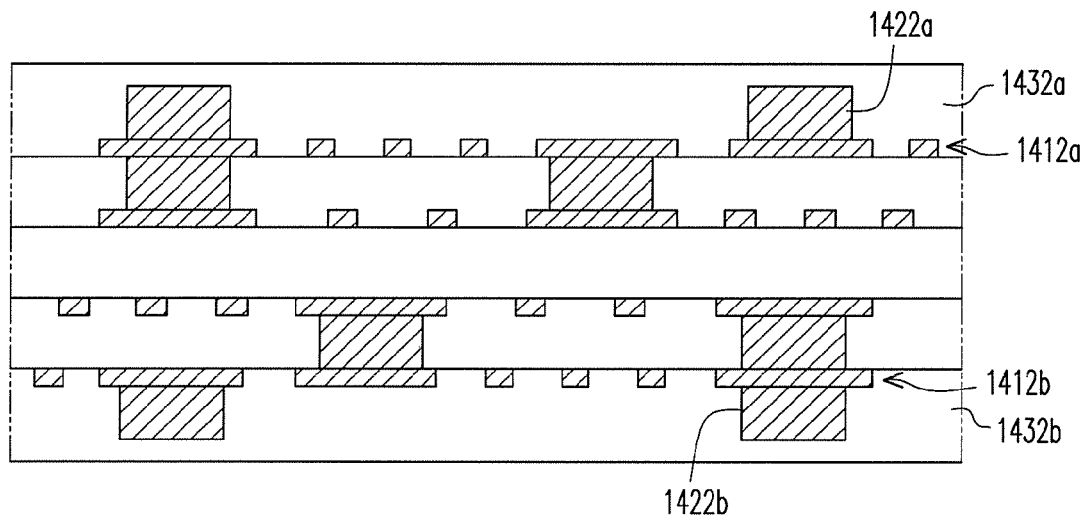
Figure 14G:
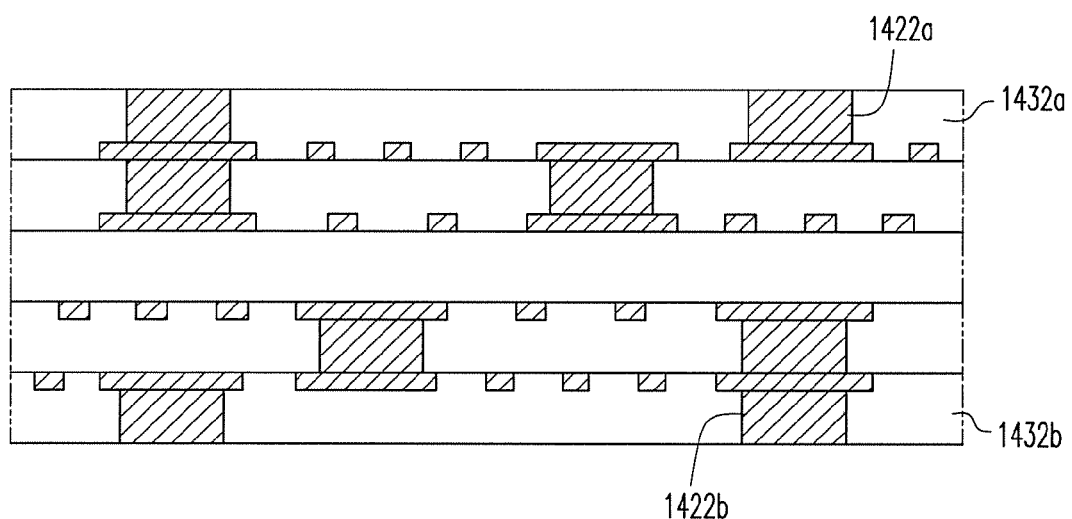
Figure 14H:
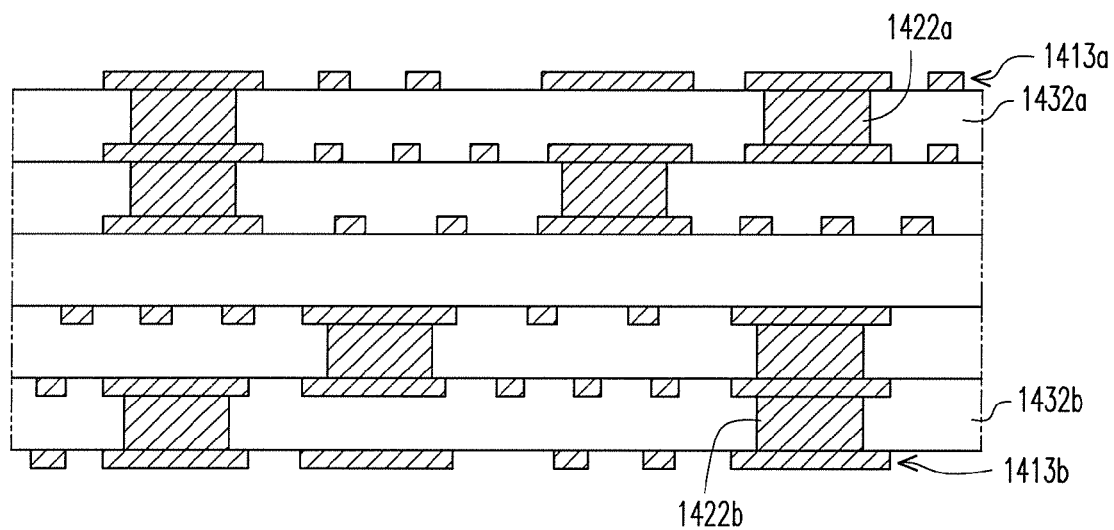
Figure 14I:
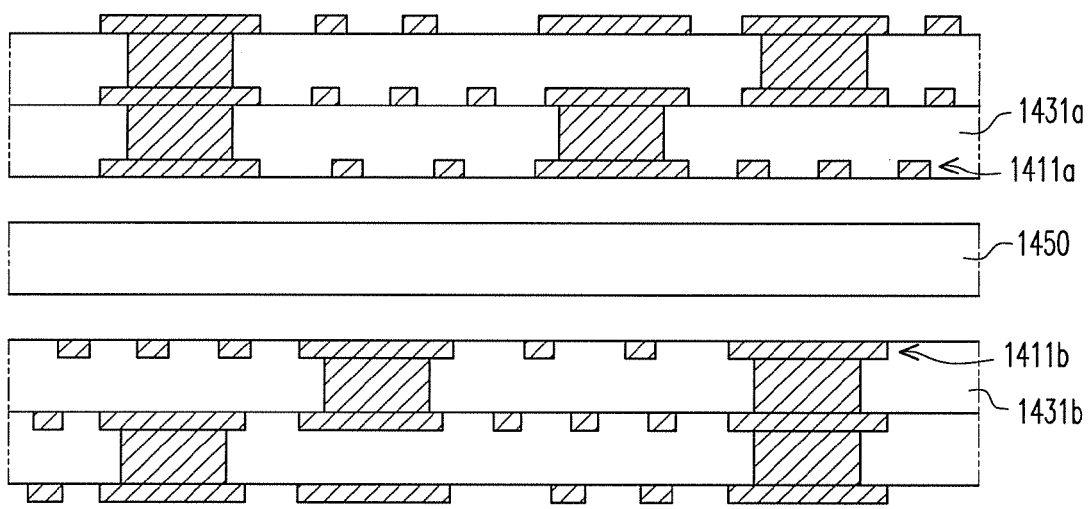
Figure 14J:
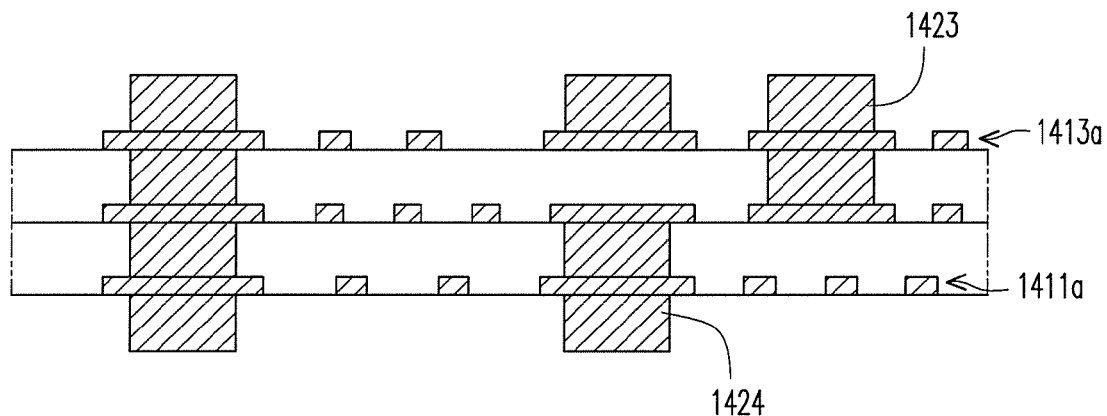
Figure 14K:
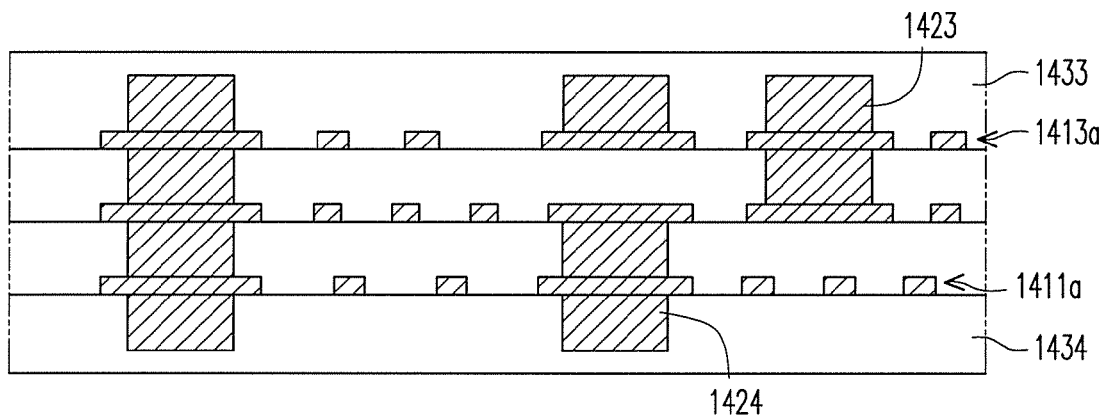
Figure 14L:
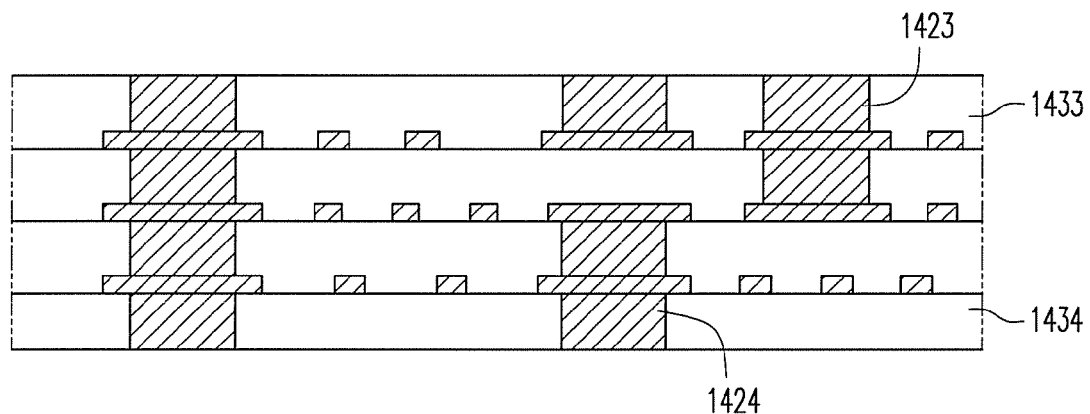
Figure 14M:
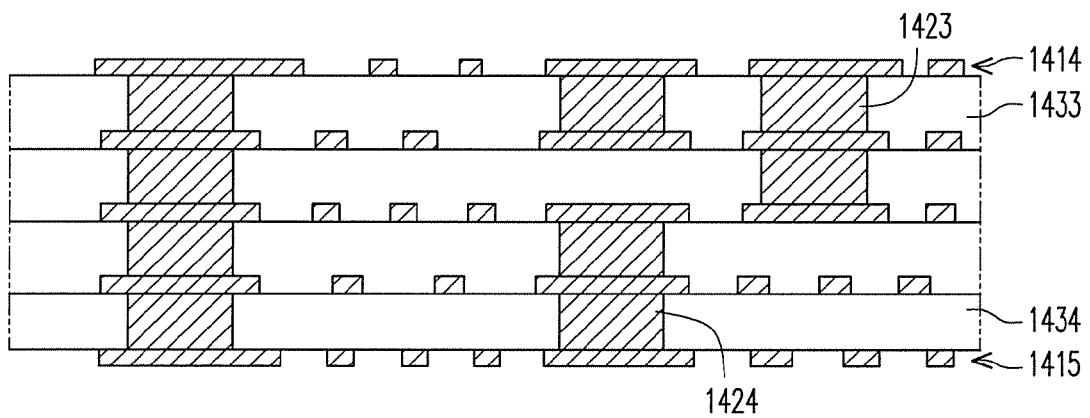
Figure 14N:
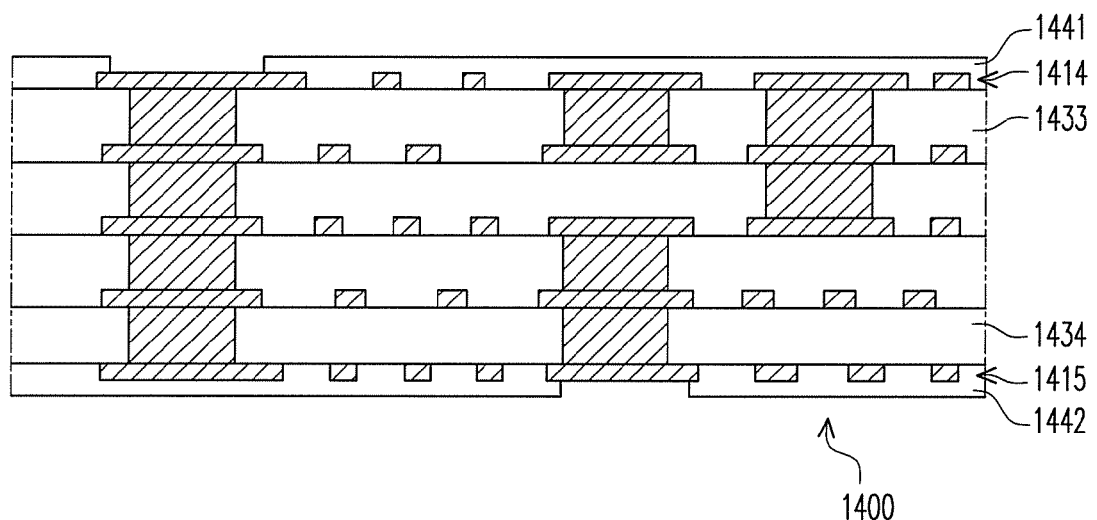
Figure 14O:
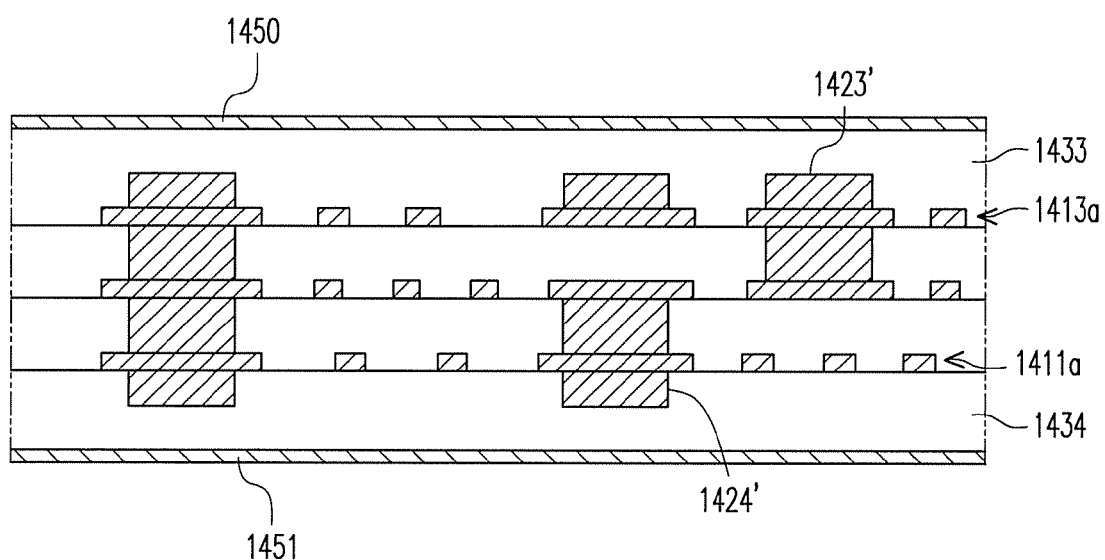
Figure 14P:
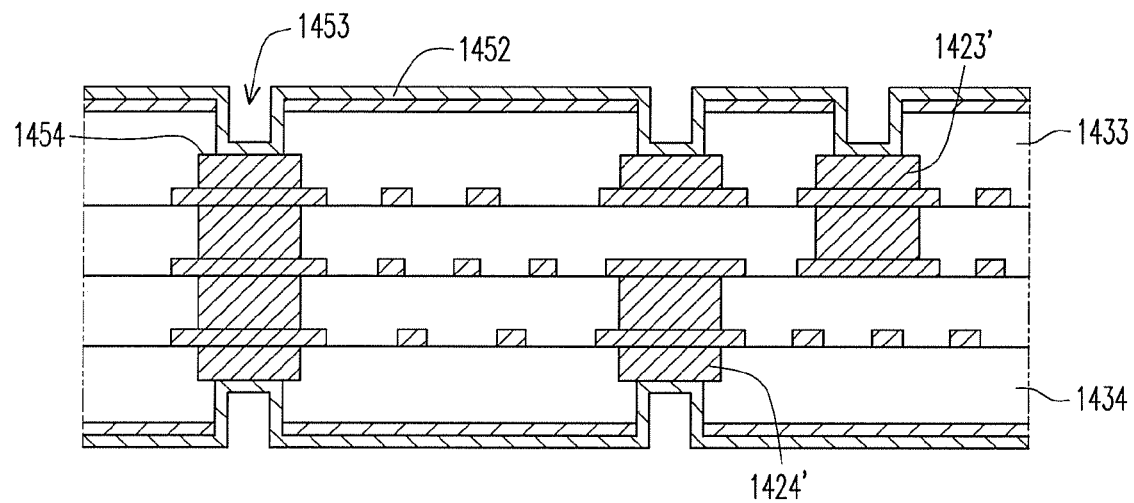
Figure 14Q:
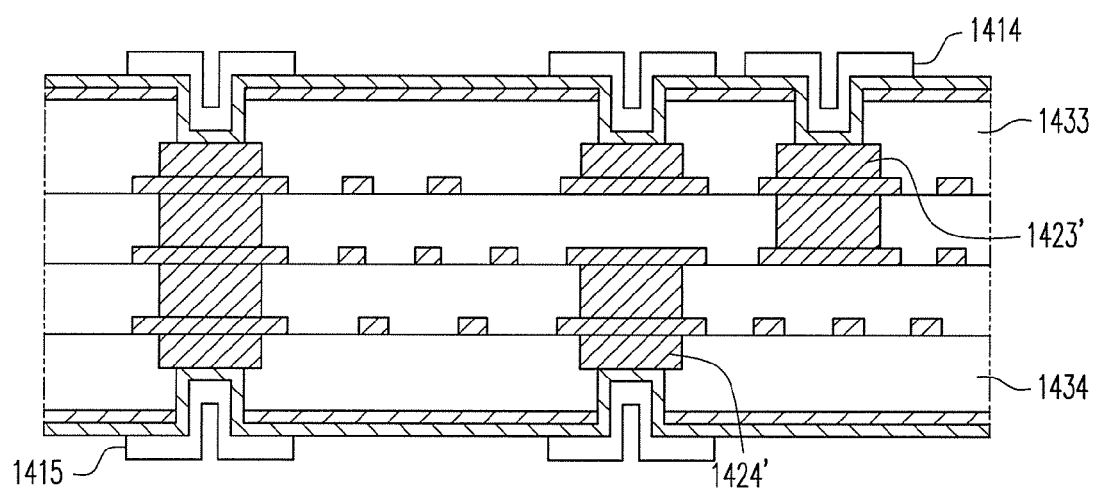
Figure 14R:
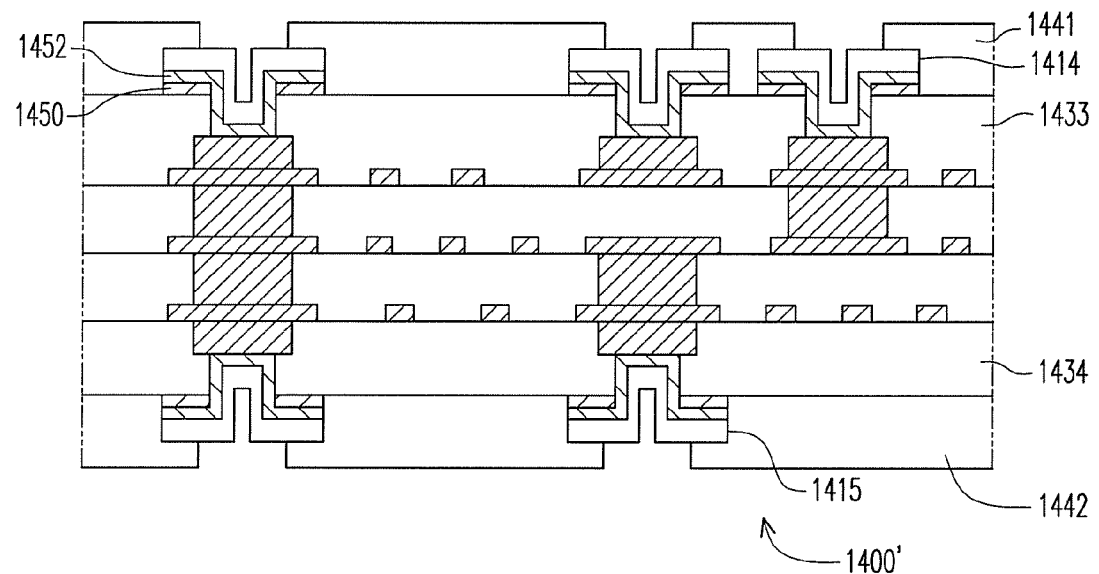
Figure 14S:
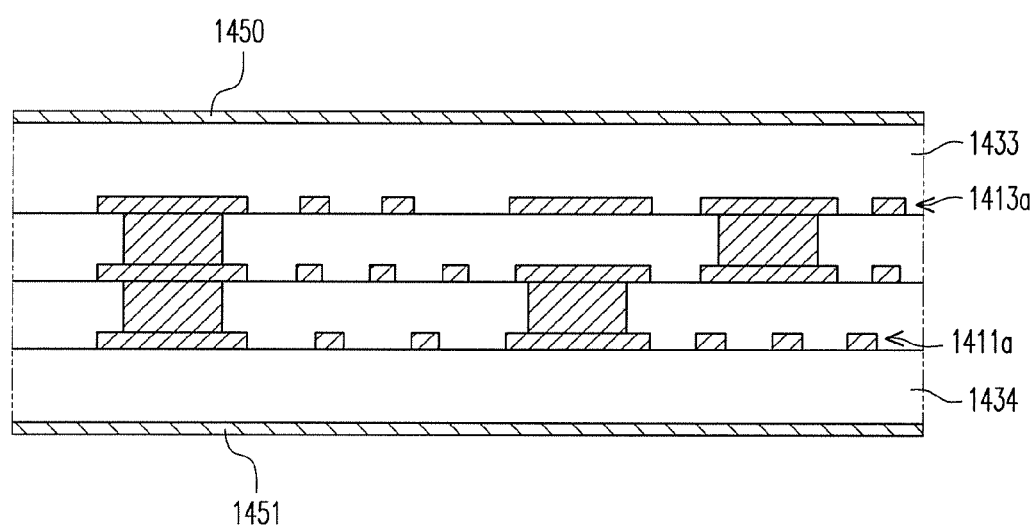
Figure 14T:
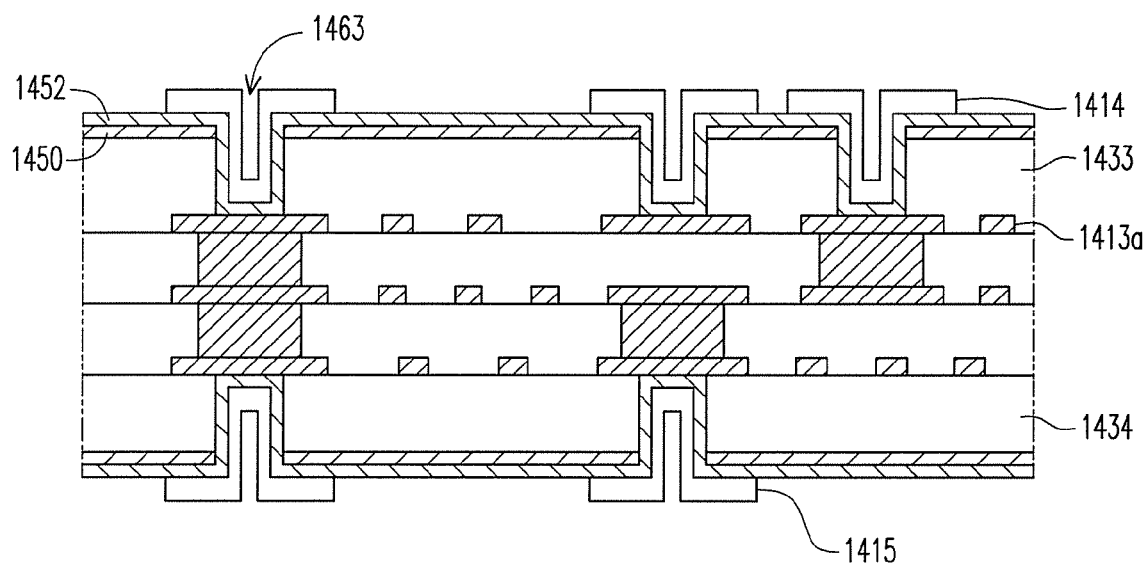
Figure 14U:
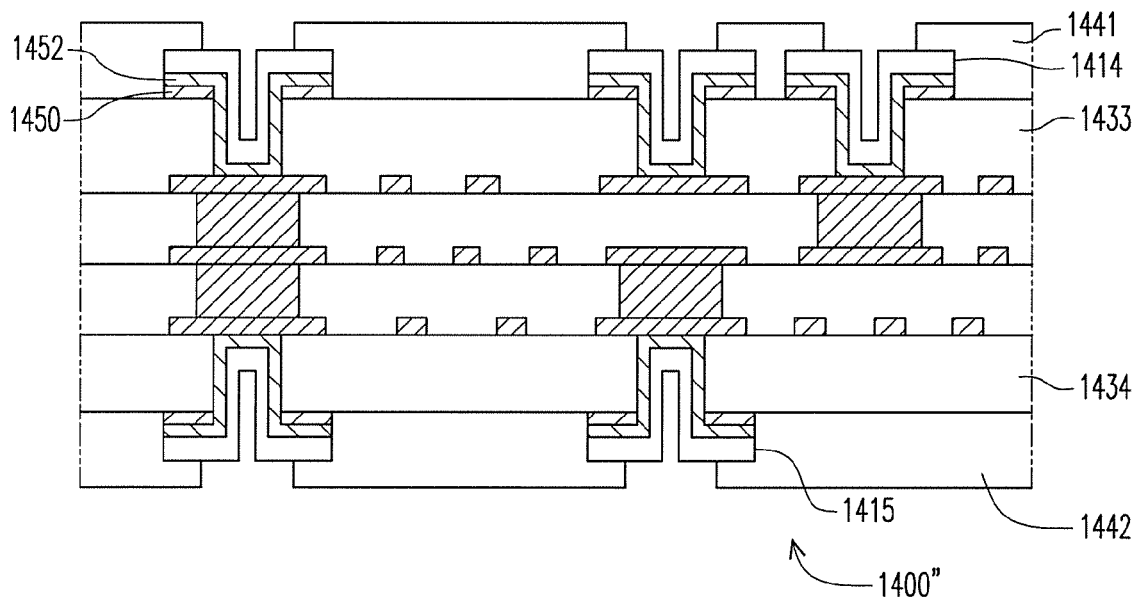

FIG. 14A to FIG. 14U illustrate a process for fabricating a substrate including multiple dielectric layers, according to embodiments of the invention. Certain aspects of the process can be implemented in a similar manner as described above, and are not repeated below.

Referring to FIG. 14A, a carrier 1450 is provided, and the carrier 1450 includes a first surface 1450a and a second surface 1450b opposite to the first surface 1450a. In the following, operations are carried out adjacent to both the first surface 1450a and the second surface 1450b of the carrier 1450, thereby increasing manufacturing throughput.

Next, referring to FIG. 14B, a first inner, electrically conductive pattern 1411a is formed adjacent to the first surface 1450a of the carrier 1450. In the present embodiment, another first inner, electrically conductive pattern 1411b also is formed adjacent to the second surface 1450b of the carrier 1450. The first inner, electrically conductive patterns 1411a and 1411b can be formed by an additive process, a semi-additive process, or a subtractive process. Each of the first inner, electrically conductive patterns 1411a and 1411b includes a set of pads and a set of traces, which can be formed substantially simultaneously in a common process operation.

Still referring to FIG. 14B, a set of first inner, electrically conductive posts 1421a are formed adjacent to the first inner, electrically conductive pattern 1411a. In the present embodiment, another set of first inner, electrically conductive posts 1421b also are formed adjacent to the first inner, electrically conductive pattern 1411b. The first inner, electrically conductive posts 1421a and 1421b can be formed with the first inner, electrically conductive patterns 1411a and 1411b in a common process operation by an additive process, a semi-additive process, or a subtractive process. Alternatively, formation of the first inner, electrically conductive posts 1421a and 1421b can be carried out with a separate process operation.

Referring to FIG. 14C, a first inner, dielectric layer 1431a is laminated to the first inner, electrically conductive pattern 1411a and the first inner, electrically conductive posts 1421a, so that the first inner, electrically conductive pattern 1411a and the first inner, electrically conductive posts 1421a are embedded in the first inner, dielectric layer 1431a. In the present embodiment, another first inner, dielectric layer 1431b also is laminated to the first inner, electrically conductive pattern 1411b and the first inner, electrically conductive posts 1421b. In the present embodiment, each of the first inner, dielectric layers 1431a and 1431b includes a fiber-reinforced resin material, such as a prepreg material, including fibers 1490a and 1490b to strengthen the dielectric layers 1431a and 1431b. As shown in FIG. 14C, the fibers 1490a subsequent to lamination of the dielectric layer 1431a are re-oriented from a generally horizontal plane, with portions adjacent to the first inner, electrically conductive posts 1421a being pushed along a vertically extending direction of the first inner, electrically conductive posts 1421a and away from the first inner, electrically conductive pattern 1411a. Likewise, the fibers 1490b subsequent to lamination of the dielectric layer 1431b are re-oriented from a generally horizontal plane, with portions adjacent to the first inner, electrically conductive posts 1421b being pushed along a vertically extending direction of the first inner, electrically conductive posts 1421b and away from the first inner, electrically conductive pattern 1411b.

Then, referring to FIG. 14D, an upper, exposed portion of the first inner, dielectric layer 1431a is removed to expose the first inner, electrically conductive posts 1421a. In the present embodiment, a lower, exposed portion of the first inner, dielectric layer 1431b also is removed to expose the first inner, electrically conductive posts 1421b. The exposed portions of the first inner, dielectric layers 1431a and 1431b can be removed by routing, grinding, or another material removal technique. As shown in FIG. 14D, exposed surfaces of the first inner, electrically conductive posts 1421a and 1421b are aligned (e.g., substantially aligned or co-planar) with exposed surfaces of the first inner, dielectric layers 1431a and 1431b, respectively.

Then, referring to FIG. 14E, a second inner, electrically conductive pattern 1412a is formed adjacent to the exposed surfaces of the first inner, dielectric layer 1431a and the first inner, electrically conductive posts 1421a, and is connected to the first inner, electrically conductive posts 1421a. In the present embodiment, another second inner, electrically conductive pattern 1412b also is formed substantially simultaneously adjacent to the exposed surfaces of the first inner, dielectric layer 1431b and the first inner, electrically conductive posts 1421b, and is connected to the first inner, electrically conductive posts 1421b. The second inner, electrically conductive patterns 1412a and 1412b can be formed by an additive process, a semi-additive process, or a subtractive process. Each of the second inner, electrically conductive patterns 1412a and 1412b includes a set of pads and a set of traces, which can be formed substantially simultaneously in a common process operation.

Still referring to FIG. 14E, a set of second inner, electrically conductive posts 1422a are formed adjacent to the second inner, electrically conductive pattern 1412a. In the present embodiment, another set of second inner, electrically conductive posts 1422b also are formed adjacent to the second inner, electrically conductive pattern 1412b. The second inner, electrically conductive posts 1422a and 1422b can be formed with the second inner, electrically conductive patterns 1412a and 1412b in a common process operation by an additive process, a semi-additive process, or a subtractive process. Alternatively, formation of the second inner, electrically conductive posts 1422a and 1422b can be carried out with a separate process operation.

Referring to FIG. 14F, a second inner, dielectric layer 1432a is laminated to the second inner, electrically conductive pattern 1412a and the second inner, electrically conductive posts 1422a, so that the second inner, electrically conductive pattern 1412a and the second inner, electrically conductive posts 1422a are embedded in the second inner, dielectric layer 1432a. In the present embodiment, another second inner, dielectric layer 1432b also is laminated to the second inner, electrically conductive pattern 1412b and the second inner, electrically conductive posts 1422b. Each of the second inner, dielectric layers 1432a and 1432b can be a fiber-reinforced resin material, such as a prepreg material. While not shown in FIG. 14F, each of the second inner, dielectric layers 1432a and 1432b can include fibers, and these fibers can be re-oriented subsequent to lamination, with portions adjacent to the second inner, electrically conductive posts 1422a and 1422b being pushed along vertically extending directions of the second inner, electrically conductive posts 1422*a* and 1422*b* and away from the second inner, electrically conductive patterns 1412*a* and 1412*b*.

Next, referring to FIG. 14G, an upper, exposed portion of the second inner, dielectric layer 1432*a* is removed to expose the second inner, electrically conductive posts 1422*a*. In the present embodiment, a lower, exposed portion of the second inner, dielectric layer 1432*b* also is removed to expose the second inner, electrically conductive posts 1422*b*. The exposed portions of the second inner, dielectric layers 1432*a* and 1432*b* can be removed by routing, grinding, or another material removal technique. As shown in FIG. 14G, exposed surfaces of the second inner, electrically conductive posts 1422*a* and 1422*b* are aligned (e.g., substantially aligned or co-planar) with exposed surfaces of the second inner, dielectric layers 1432*a* and 1432*b*, respectively.

Next, referring to FIG. 14H, a third inner, electrically conductive pattern 1413*a* is formed adjacent to the exposed surfaces of the second inner, dielectric layer 1432*a* and the second inner, electrically conductive posts 1422*a*, and is connected to the second inner, electrically conductive posts 1422*a*. In the present embodiment, another third inner, electrically conductive pattern 1413*b* also is formed adjacent to the second inner, dielectric layer 1432*b* and the second inner, electrically conductive posts 1422*b*, and is connected to the second inner, electrically conductive posts 1422*b*. The third inner, electrically conductive patterns 1413*a* and 1413*b* can be formed by an additive process, a semi-additive process, or a subtractive process. Each of the third inner, electrically conductive patterns 1413*a* and 1413*b* includes a set of pads and a set of traces, which can be formed substantially simultaneously in a common process operation.

Then, referring to FIG. 14I, the carrier 1450 is removed or separated from the first inner, electrically conductive pattern 1411*a* and the first inner, dielectric layer 1431*a*, so as to expose the first inner, electrically conductive pattern 1411*a*. In the present embodiment, the carrier 1450 also is removed or separated from the first inner, electrically conductive pattern 1411*b* and the first inner, dielectric layer 1431*b*, so as to expose the first inner, electrically conductive pattern 1411*b*. Therefore, two package carrier structures are formed, wherein the upper structure is described in the following operations of the present embodiment as an example. As shown in FIG. 14I, exposed surfaces of the first inner, electrically conductive patterns 1411*a* and 1411*b* are aligned (e.g., substantially aligned or co-planar) with exposed surfaces of the first inner, dielectric layers 1431*a* and 1431*b*, respectively.

The previously described FIGS. 14A through 14I are common to multiple embodiments of process for fabricating a substrate including multiple dielectric layers. In one embodiment, the process is illustrated by FIG. 14A to FIG. 14N. In another embodiment, the process is illustrated by FIG. 14A to 14I followed by FIG. 14O to FIG. 14R. In a further embodiment, the process is illustrated by FIG. 14A to 14I followed by FIG. 14S to FIG. 14U.

In one embodiment, referring to FIG. 14J, a set of first outer, electrically conductive posts 1423 are formed adjacent to the third inner, electrically conductive pattern 1413*a*. In the present embodiment, a set of second outer, electrically conductive posts 1424 also are formed adjacent to the first inner, electrically conductive pattern 1411*a*. The first outer, electrically conductive posts 1423 and the second outer, electrically conductive posts 1424 can be formed by an additive process, a semi-additive process, or a subtractive process.

Next, referring to FIG. 14K, a first outer, dielectric layer 1433 is laminated to the third inner, electrically conductive pattern 1413*a* and the first outer, electrically conductive posts 1423, so that the third inner, electrically conductive pattern 1413*a* and the first outer, electrically conductive posts 1423 are embedded in the first outer, dielectric layer 1433.

Still referring to FIG. 14K, a second outer, dielectric layer 1434 also is laminated to the first inner, electrically conductive pattern 1411*a* and the second outer, electrically conductive posts 1424, so that the second outer, electrically conductive posts 1424 are embedded in the second outer, dielectric layer 1434. Each of the first outer, dielectric layer 1433 and the second outer, dielectric layer 1434 can be a fiber-reinforced resin material, such as a prepreg material.

While not shown in FIG. 14K, each of the first outer, dielectric layer 1433 and the second outer, dielectric layer 1434 can include fibers, and these fibers can be re-oriented subsequent to lamination, with portions adjacent to the first outer, electrically conductive posts 1423 and the second outer, electrically conductive posts 1424 being pushed along vertically extending directions of the first outer, electrically conductive posts 1423 and the second outer, electrically conductive posts 1424 and away from the third inner, electrically conductive pattern 1413*a* and the first inner, electrically conductive pattern 1411*a*.

Referring to FIG. 14L, an upper, exposed portion of the first outer, dielectric layer 1433 is removed to expose the first outer, electrically conductive posts 1423. In the present embodiment, a lower, exposed portion of the second outer, dielectric layer 1434 also is removed to expose the second outer, electrically conductive posts 1424. The exposed portions of the first outer, dielectric layer 1433 and the second outer, dielectric layer 1434 can be removed by routing, grinding, or another material removal technique. As shown in FIG. 14L, exposed surfaces of the first outer, electrically conductive posts 1423 and the second outer, electrically conductive posts 1424 are aligned (e.g., substantially aligned or co-planar) with exposed surfaces of the first outer, dielectric layer 1433 and the second outer, dielectric layer 1434, respectively.

Next, referring to FIG. 14M, a first outer, electrically conductive pattern 1414 is formed adjacent to the first outer, dielectric layer 1433 and the first outer, electrically conductive posts 1423, and is connected to the first outer, electrically conductive posts 1423. In the present embodiment, a second outer, electrically conductive pattern 1415 also is formed substantially simultaneously adjacent to the second outer, dielectric layer 1434 and the second outer, electrically conductive posts 1424, and is connected to the second outer, electrically conductive posts 1424. The first outer, electrically conductive pattern 1414 and the second outer, electrically conductive pattern 1415 can be formed by an additive process, a semi-additive process, or a subtractive process. Each of the first outer, electrically conductive pattern 1414 and the second outer, electrically conductive pattern 1415 includes a set of pads and a set of traces, which can be formed substantially simultaneously in a common process operation.

Referring to FIG. 14N, a first solder mask layer 1441 is formed adjacent to the first outer, dielectric layer 1433 and at least a portion of the first outer, electrically conductive pattern 1414, while a remaining portion of the first outer, electrically conductive pattern 1414 is exposed to define a set of first pads. In the present embodiment, a second solder mask layer 1442 also is formed adjacent to the second outer, dielectric layer 1434 and at least a portion of the second outer, electrically conductive pattern 1415, while a remaining portion of the second outer, electrically conductive pattern 1415 is exposed to define a set of second pads. In such manner, a package carrier 1400 is fabricated.

In another embodiment, referring to FIG. 14O, a set of first outer, electrically conductive posts 1423' are formed adjacent to the third inner, electrically conductive pattern 1413*a*. In the present embodiment, a set of second outer, electrically conductive posts 1424' also are formed adjacent to the first inner, electrically conductive pattern 1411*a*. The first outer, electrically conductive posts 1423' and the second outer, electrically conductive posts 1424' are similar to the conductive posts 1423 and 1424 described with reference to FIG. 14J, except that the heights of the conductive posts 1423' and 1424' are smaller than the heights of the conductive posts 1423 and 1424, respectively.

Next, as previously described with reference to FIG. 14K, the first outer, dielectric layer 1433 is laminated to the third inner, electrically conductive pattern 1413*a* and the first outer, electrically conductive posts 1423', so that the third inner, electrically conductive pattern 1413*a* and the first outer, electrically conductive posts 1423' are embedded in the first outer, dielectric layer 1433. Similarly, the second outer, dielectric layer 1434 also is laminated to the first inner, electrically conductive pattern 1411*a* and the second outer, electrically conductive posts 1424', so that the second outer, electrically conductive posts 1424' are embedded in the second outer, dielectric layer 1434. Each of the first outer, dielectric layer 1433 and the second outer, dielectric layer 1434 can be a fiber-reinforced resin material, such as a prepreg material.

Next, a conductive layer 1450, such as a copper foil, is disposed adjacent to the first outer, dielectric layer 1433. Similarly, a conductive layer 1451, such as a copper foil, is disposed adjacent to the second outer, dielectric layer 1434.

Referring to FIG. 14P, openings 1453 are formed that extend through the conductive layer 1450 and the first outer, dielectric layer 1433. The openings 1453 expose at least a portion of a surface 1454 of the first outer, electrically conductive posts 1423'. In one embodiment, the openings 1453 may be formed by laser drilling. A metallic material is then disposed adjacent to the conductive layer 1450 and the first outer, electrically conductive posts 1423' to form a conductive layer 1452, such as a seed layer. Similar processing takes place on the bottom side of the substrate, adjacent to the second outer, electrically conductive posts 1424' and the second outer, dielectric layer 1434.

Referring to FIG. 14Q, the first outer, electrically conductive pattern 1414 is formed adjacent to the conductive layer 1452, and is connected to the first outer, electrically conductive posts 1423'. The first outer, electrically conductive pattern 1414 can be formed by an additive process, a semi-additive process, or a subtractive process. The first outer, electrically conductive pattern 1414 includes a set of pads and a set of traces, which can be formed substantially simultaneously in a common process operation. Similar processing takes place on the bottom side of the substrate to form the second outer, electrically conductive pattern 1415.

Referring to FIG. 14R, portions of the conductive layers 1450 and 1452 are removed to correspond to the first outer, electrically conductive pattern 1414. This can be done through a subtractive process. Then, the first solder mask layer 1441 is formed adjacent to the first outer, dielectric layer 1433 and at least a portion of the first outer, electrically conductive pattern 1414, while a remaining portion of the first outer, electrically conductive pattern 1414 is exposed to define a set of first pads. Similar processing takes place on the bottom side of the substrate to form a set of second pads from the second outer, electrically conductive pattern 1415 and exposed by a second solder mask layer 1442. In such manner, a package carrier 1400' is fabricated.

In a further embodiment, referring to FIG. 14S, the first outer, dielectric layer 1433 is laminated to the third inner, electrically conductive pattern 1413*a*, so that the third inner, electrically conductive pattern 1413*a* is embedded in the first outer, dielectric layer 1433. In this embodiment, unlike in FIGS. 14J and 14K, the conductive posts 1423 are not formed. Similarly, the second outer, dielectric layer 1434 also is laminated to the first inner, electrically conductive pattern 1411*a*. Each of the first outer, dielectric layer 1433 and the second outer, dielectric layer 1434 can be a fiber-reinforced resin material, such as a prepreg material.

Next, the conductive layer 1450, such as a copper foil, is disposed adjacent to the first outer, dielectric layer 1433. Similarly, the conductive layer 1451, such as a copper foil, is disposed adjacent to the second outer, dielectric layer 1434.

Referring to FIG. 14T, openings 1463 are formed that extend through the conductive layer 1450 and the first outer, dielectric layer 1433. The openings 1453 expose at least a portion of the third inner, electrically conductive pattern 1413*a*. In one embodiment, the openings 1463 may be formed by laser drilling. A metallic material is then disposed adjacent to the conductive layer 1450 and the third inner, electrically conductive pattern 1413*a* to form the conductive layer 1452, such as a seed layer. Similar processing takes place on the bottom side of the substrate, adjacent to the second outer, electrically conductive posts 1424' and the second outer, dielectric layer 1434.

Then, the first outer, electrically conductive pattern 1414 is formed adjacent to the conductive layer 1452, and is connected to the third inner, electrically conductive pattern 1413*a*. The first outer, electrically conductive pattern 1414 can be formed by an additive process, a semi-additive process, or a subtractive process. The first outer, electrically conductive pattern 1414 includes a set of pads and a set of traces, which can be formed substantially simultaneously in a common process operation. Similar processing takes place on the bottom side of the substrate to form the second outer, electrically conductive pattern 1415.

Referring to FIG. 14U, portions of the conductive layers 1450 and 1452 are removed to correspond to the first outer, electrically conductive pattern 1414. This can be done through a subtractive process. Then, the first solder mask layer 1441 is formed adjacent to the first outer, dielectric layer 1433 and at least a portion of the first outer, electrically conductive pattern 1414, while a remaining portion of the first outer, electrically conductive pattern 1414 is exposed to define a set of first pads. Similar processing takes place on the bottom side of the substrate to form a set of second pads from the second outer, electrically conductive pattern 1415 and exposed by a second solder mask layer 1442. In such manner, a package carrier 1400" is fabricated.

While not shown in FIG. 14A through FIG. 14U, it is contemplated that at least a subset of the electrically conductive posts (e.g., the first outer, electrically conductive posts 1423) can be formed so as to include multiple post segments (or, more generally, via segments) having different diameters.

Figure 15A:
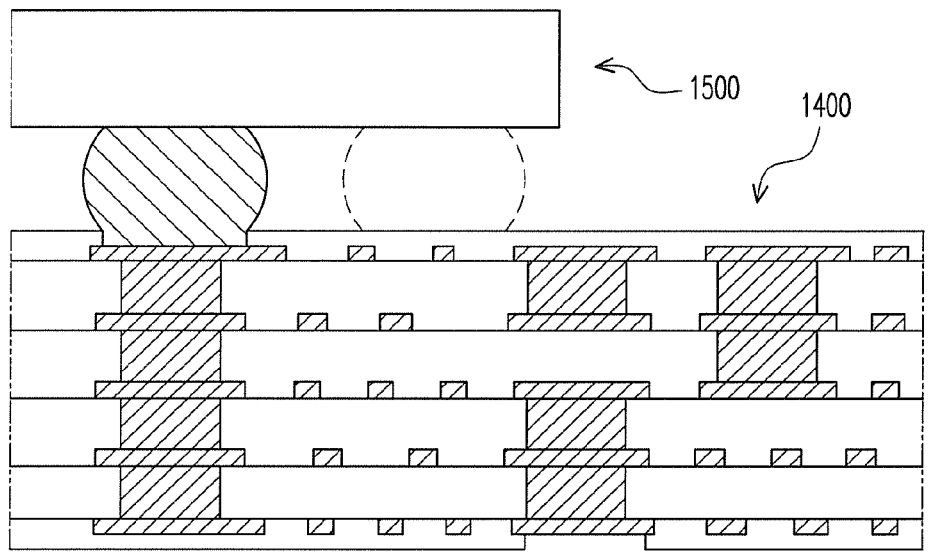
FIG. 15A through FIG. 15C illustrate a method of manufacturing a semiconductor package, according to embodiments of the invention.

Once the package carrier 1400 is fabricated in accordance with the embodiment illustrated by FIG. 14A through FIG. 14N, a package according to an embodiment of the invention can be fabricated as shown in FIG. 15A, namely by disposing a chip 1500 adjacent to the first pads of the package carrier 1400, electrically connecting the chip 1500 to the package carrier 1400 by a flip-chip bonding technique (or a wire-bonding technique in another embodiment), and disposing solder balls (not shown) adjacent to the second pads of the package carrier 1400.

Figure 15B:
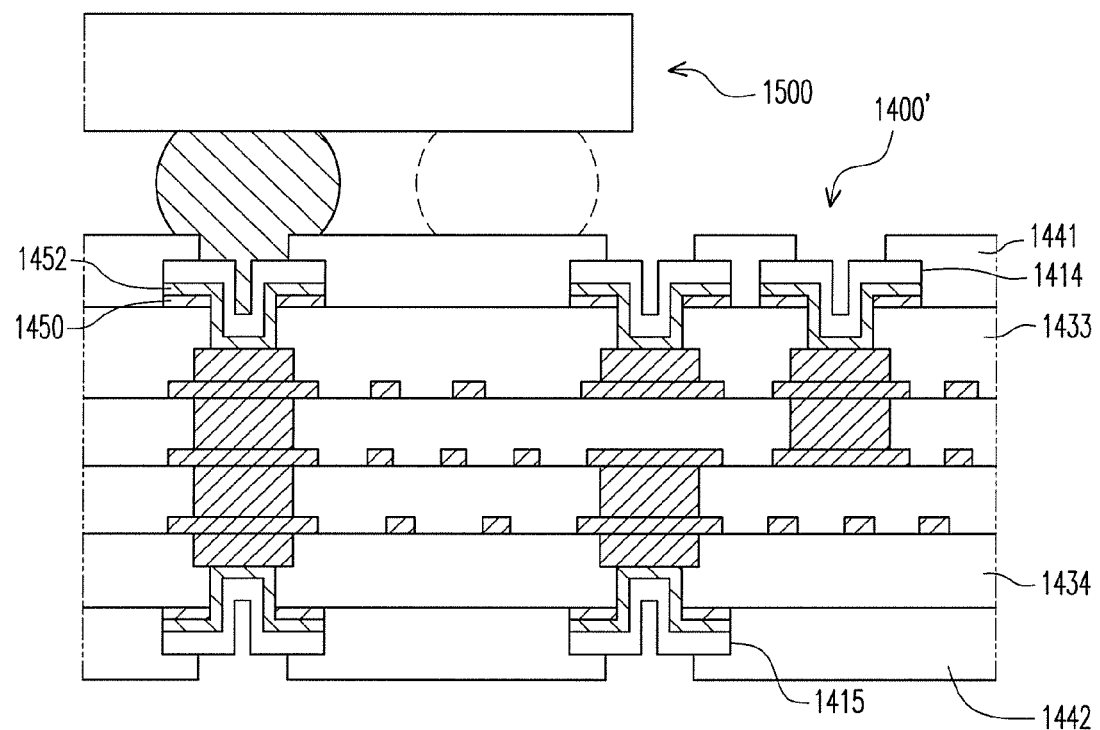

Alternatively, once the package carrier 1400' is fabricated in accordance with the embodiment illustrated by FIG. 14A through FIG. 14I and FIG. 14O through FIG. 14R, a package according to an embodiment of the invention can be fabricated as shown in FIG. 15B, namely by disposing a chip 1500 adjacent to the first pads of the package carrier 1400', electrically connecting the chip 1500 to the package carrier 1400' by a flip-chip bonding technique (or a wire-bonding technique in another embodiment), and disposing solder balls (not shown) adjacent to the second pads of the package carrier 1400'.

Figure 15C:
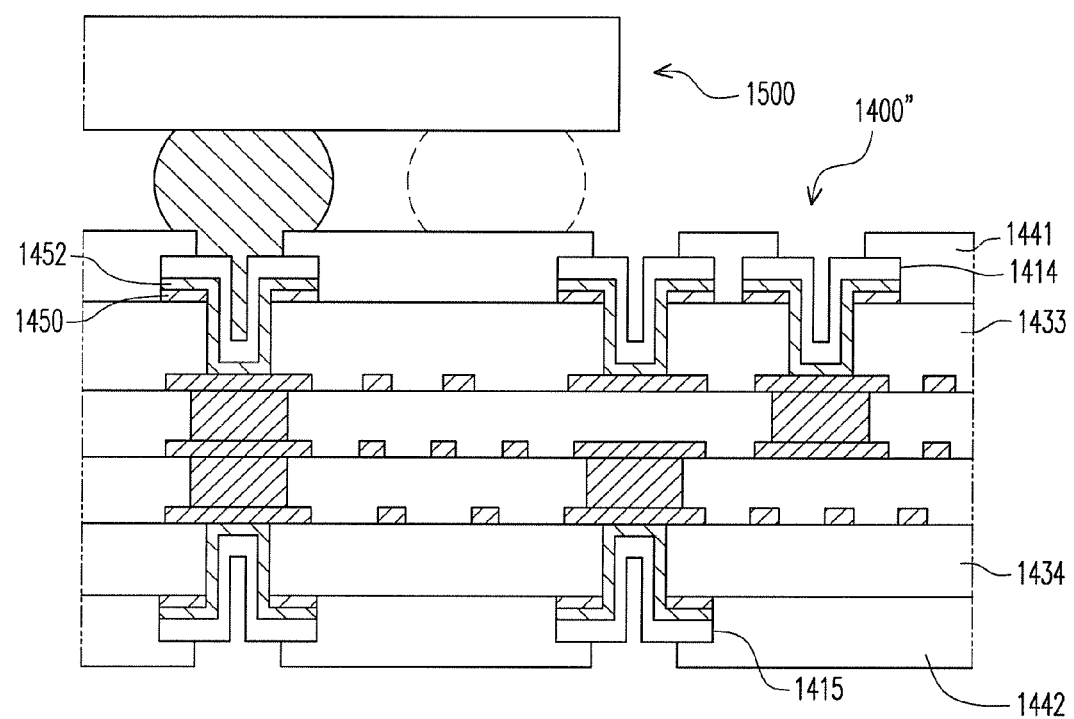

Alternatively, once the package carrier 1400" is fabricated in accordance with the embodiment illustrated by FIG. 14A through FIG. 14I and FIG. 14S through FIG. 14U, a package according to an embodiment of the invention can be fabricated as shown in FIG. 15C, namely by disposing a chip 1500 adjacent to the first pads of the package carrier 1400", electrically connecting the chip 1500 to the package carrier 1400" by a flip-chip bonding technique (or a wire-bonding technique in another embodiment), and disposing solder balls (not shown) adjacent to the second pads of the package carrier 1400".

In summary, in a substrate of some embodiments of the invention, electrically conductive posts can be used so as to effectively reduce a package size and a package area, while controlling the cost and complexity of packaging processes. In some embodiments, multiple dielectric layers embedding respective electrically conductive posts can be included to cope with a variety of contact distributions and to enhance structural rigidity and reliability of the package carrier.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale, and manufacturing tolerances may result in departure from the artistic renditions herein. There may be other embodiments of the present invention which are not specifically illustrated. Thus, the specification and the drawings are to be regarded as illustrative rather than restrictive. Additionally, the drawings illustrating the embodiments of the present invention may focus on certain major characteristic features for clarity. Furthermore, modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
a substrate including:
   a first patterned conductive layer having an upper surface;
   a first dielectric layer disposed adjacent to the upper surface of the first patterned conductive layer, the first dielectric layer exposing a portion of the first patterned conductive layer to form a plurality of first contact pads;
   a second patterned conductive layer below the first patterned conductive layer and having a lower surface;
   a second dielectric layer between the first patterned conductive layer and the second patterned conductive layer, wherein:
      the second dielectric layer defines a plurality of openings extending from the first patterned conductive layer to the second patterned conductive layer; and
      the second patterned conductive layer includes a plurality of second contact pads exposed by the second dielectric layer; and
   a plurality of conductive posts, each of the plurality of conductive posts extending from the first patterned conductive layer to the second patterned conductive layer, the each of the plurality of conductive posts filling the corresponding one of the plurality of openings in the second dielectric layer;
a die electrically connected to the plurality of first contact pads; and
a package body covering the first dielectric layer and the die;
wherein at least one of the plurality of conductive posts has an upper surface having a first area and a lower surface having a second area, and the first area is larger than the second area.

2. A semiconductor package, comprising:
a substrate including:
   a first patterned conductive layer having an upper surface;
   a first dielectric layer disposed adjacent to the upper surface of the first patterned conductive layer, the first dielectric layer exposing a portion of the first patterned conductive layer to form a plurality of first contact pads;
   a second patterned conductive layer below the first patterned conductive layer and having a lower surface;
   a second dielectric layer between the first patterned conductive layer and the second patterned conductive layer, wherein:
      the second dielectric layer defines a plurality of openings extending from the first patterned conductive layer to the second patterned conductive layer; and
      the second patterned conductive layer includes a plurality of second contact pads exposed by the second dielectric layer; and
   a plurality of conductive posts, each of the plurality of conductive posts extending from the first patterned conductive layer to the second patterned conductive layer, the each of the plurality of conductive posts filling the corresponding one of the plurality of openings in the second dielectric layer;
a die electrically connected to the plurality of first contact pads; and
a package body covering the first dielectric layer and the die;
wherein the first patterned conductive layer includes a first conductive layer, a second conductive layer, and a seed layer therebetween.

3. A substrate, comprising:
a patterned conductive layer having an upper surface and a lower surface;
a first dielectric layer disposed adjacent to the upper surface of the patterned conductive layer, the first dielectric layer exposing a portion of the patterned conductive layer to form a plurality of contact pads;
a second dielectric layer disposed adjacent to the lower surface of the patterned conductive layer, wherein the second dielectric layer defines a plurality of openings; and
a plurality of conductive posts, each of the plurality of conductive posts extending from the patterned conductive layer and through a corresponding one of the plurality of openings in the second dielectric layer, wherein both of the first dielectric layer and the second dielectric layer are unreinforced material.

4. The substrate of claim 3,
wherein the second dielectric layer includes a lower surface; and
a carrier is disposed adjacent to the lower surface of the second dielectric layer.

5. The substrate of claim 4, wherein the carrier includes a support member and a conductive sheet, and the conductive sheet is between the support member and the lower surface of the second dielectric layer.

6. The substrate of claim 3, wherein the patterned conductive layer includes a first conductive layer, a second conductive layer, and a seed layer therebetween.

7. The substrate of claim 3, wherein the patterned conductive layer and the conductive post are formed integrally.

8. A semiconductor package, comprising:
a substrate including:
a patterned conductive layer having an upper surface and a lower surface;
a first dielectric layer disposed adjacent to the upper surface of the patterned conductive layer, the first dielectric layer exposing a portion of the patterned conductive layer to form a plurality of contact pads;
a second dielectric layer disposed adjacent to the lower surface of the patterned conductive layer, wherein: the second dielectric layer defines a plurality of openings; and
a plurality of conductive posts, each of the plurality of conductive posts protruding from the patterned conductive layer and through a corresponding one of the plurality of openings in the second dielectric layer, wherein both of the first dielectric layer and the second dielectric layer are unreinforced material;
a die electrically connected to the plurality of contact pads; and
a package body covering the first dielectric layer and the die.

9. The semiconductor package of claim 8, wherein the patterned conductive layer includes a first conductive layer, a second conductive layer, and a seed layer therebetween.

10. The semiconductor package of claim 8, wherein the patterned conductive layer and the conductive post are formed integrally.

11. A semiconductor package, comprising:
a substrate including:
a first patterned conductive layer including a plurality of first contact pads and at least a first trace;
a second patterned conductive layer below the first patterned conductive layer and having a lower surface;
a first dielectric layer between the first patterned conductive layer and the second patterned conductive layer, wherein: the first dielectric layer defines a plurality of openings extending from the first patterned conductive layer to the second patterned conductive layer; and the second patterned conductive layer includes a plurality of second contact pads and at least a second trace;
a second dielectric layer disposed on the first dielectric layer, the second dielectric layer exposing the first contact pads and covering the first trace; and
a plurality of conductive posts, each of the plurality of conductive posts extending from the first patterned conductive layer to the second patterned conductive layer, the each of the plurality of conductive posts filling the corresponding one of the plurality of openings in the first dielectric layer;
a die electrically connected to the plurality of first contact pads; and
a package body covering the die.

12. The semiconductor package of claim 11, wherein:
the first dielectric layer has a lower surface; and
the lower surface of the second patterned conductive layer is recessed from the lower surface of the first dielectric layer.

13. The semiconductor package of claim 11, further comprising:
a third dielectric layer disposed on the first dielectric layer, the third dielectric layer exposing the second contact pads.

14. The semiconductor package of claim 11, wherein at least one of the plurality of conductive posts has an upper surface having a first area and a lower surface having a second area, and the first area is different than the second area.

15. A substrate comprising:
a first patterned conductive layer including a plurality of first contact pads and at least a first trace;
a second patterned conductive layer below the first patterned conductive layer and having a lower surface;
a first dielectric layer between the first patterned conductive layer and the second patterned conductive layer, wherein: the first dielectric layer defines a plurality of openings extending from the first patterned conductive layer to the second patterned conductive layer; and the second patterned conductive layer includes a plurality of second contact pads and at least a second trace;
a second dielectric layer disposed on the first dielectric layer, the second dielectric layer exposing the first contact pads and covering the first trace; and
a plurality of conductive posts, each of the plurality of conductive posts extending from the first patterned conductive layer to the second patterned conductive layer, the each of the plurality of conductive posts filling the corresponding one of the plurality of openings in the first dielectric layer.

16. The substrate of claim 15 wherein:
the first dielectric layer has a lower surface; and
the lower surface of the second patterned conductive layer is recessed from the lower surface of the first dielectric layer.

17. The substrate of claim 15, further comprising:
a third dielectric layer disposed on the first dielectric layer, the third dielectric layer exposing the second contact pads.

18. The substrate of claim 15, wherein at least one of the plurality of conductive posts has an upper surface having a first area and a lower surface having a second area, and the first area is different than the second area.

* * * * *